(12) United States Patent
Takeuchi et al.

(10) Patent No.: US 9,184,274 B2
(45) Date of Patent: Nov. 10, 2015

(54) SEMICONDUCTOR APPARATUS AND MANUFACTURING METHOD OF THE SEMICONDUCTOR APPARATUS

(71) Applicant: Sony Corporation, Tokyo (JP)

(72) Inventors: Katsuhiko Takeuchi, Kanagawa (JP); Satoshi Taniguchi, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 14/374,842

(22) PCT Filed: Feb. 7, 2013

(86) PCT No.: PCT/JP2013/053602
§ 371 (c)(1),
(2) Date: Jul. 25, 2014

(87) PCT Pub. No.: WO2013/122176
PCT Pub. Date: Aug. 22, 2013

(65) Prior Publication Data
US 2015/0035010 A1 Feb. 5, 2015

(30) Foreign Application Priority Data

Feb. 16, 2012 (JP) .................................. 2012-031734
Dec. 20, 2012 (JP) .................................. 2012-278717

(51) Int. Cl.
| | |
|---|---|
| H01L 29/778 | (2006.01) |
| H01L 21/336 | (2006.01) |
| H01L 29/66 | (2006.01) |
| H01L 21/02 | (2006.01) |
| H01L 29/201 | (2006.01) |
| H01L 29/423 | (2006.01) |
| H01L 29/51 | (2006.01) |
| H01L 29/10 | (2006.01) |
| H01L 29/205 | (2006.01) |
| H01L 29/207 | (2006.01) |
| H01L 29/43 | (2006.01) |
| H01L 29/08 | (2006.01) |

(52) U.S. Cl.
CPC ........ *H01L 29/7783* (2013.01); *H01L 21/0228* (2013.01); *H01L 21/02543* (2013.01); *H01L 21/02546* (2013.01); *H01L 29/201* (2013.01); *H01L 29/66462* (2013.01); *H01L 29/7785* (2013.01); *H01L 29/0847* (2013.01); *H01L 29/1066* (2013.01); *H01L 29/205* (2013.01); *H01L 29/207* (2013.01); *H01L 29/4236* (2013.01); *H01L 29/42376* (2013.01); *H01L 29/432* (2013.01); *H01L 29/517* (2013.01)

(58) Field of Classification Search
CPC ....... H01L 29/66462; H01L 29/7782–29/7785
USPC .................................. 257/194; 438/172, 285
See application file for complete search history.

(56) References Cited

U.S. PATENT DOCUMENTS

| | | | |
|---|---|---|---|
| 6,365,925 B2 | 4/2002 | Hase et al. | |
| 2001/0013604 A1* | 8/2001 | Hase | ............................... 257/12 |

FOREIGN PATENT DOCUMENTS

| | | |
|---|---|---|
| JP | 59-193063 | 11/1984 |
| JP | 07-050410 | 2/1995 |

(Continued)

*Primary Examiner* — Daniel Shook
(74) *Attorney, Agent, or Firm* — Dentons US LLP

(57) ABSTRACT

Provided is a semiconductor apparatus including a channel layer, an upper barrier layer that is provided on the channel layer, a first barrier layer that constitutes a boundary layer on a side of the channel layer in the upper barrier layer, a second barrier layer that is provided in a surface layer of the upper barrier layer, a low-resistance region that is provided in at least a surface layer in the second barrier layer, a source electrode and a drain electrode that are connected to the second barrier layer, at positions across the low-resistance region, a gate insulating film that is provided on the low-resistance region, and a gate electrode that is provided above the low-resistance region via the gate insulating film.

20 Claims, 42 Drawing Sheets

(56) References Cited

FOREIGN PATENT DOCUMENTS

| JP | 11-150264 | 6/1999 |
| JP | 2000-100828 | 4/2000 |
| JP | 2001-102312 | 4/2001 |
| JP | 2001-217257 | 8/2001 |
| JP | 2004-055788 | 2/2004 |
| JP | 2004-165341 | 6/2004 |
| JP | 2010-098073 | 4/2010 |

* cited by examiner

FIG. 17
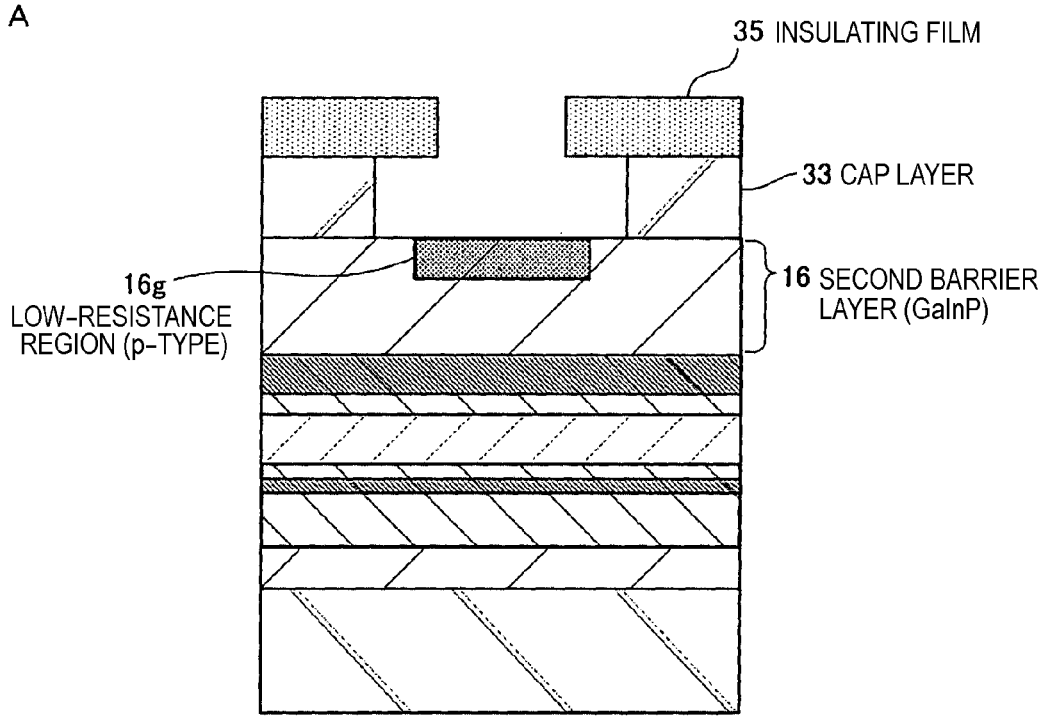
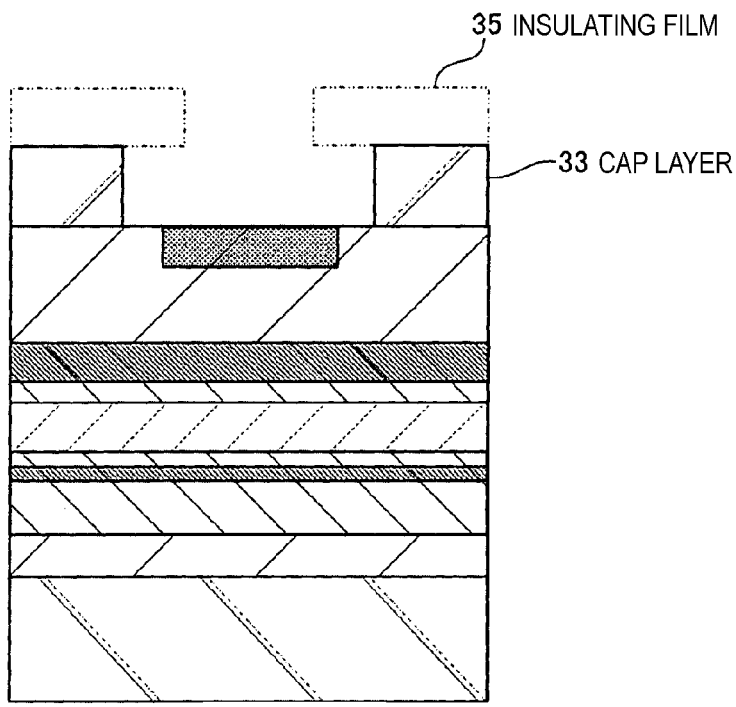

FIG. 24
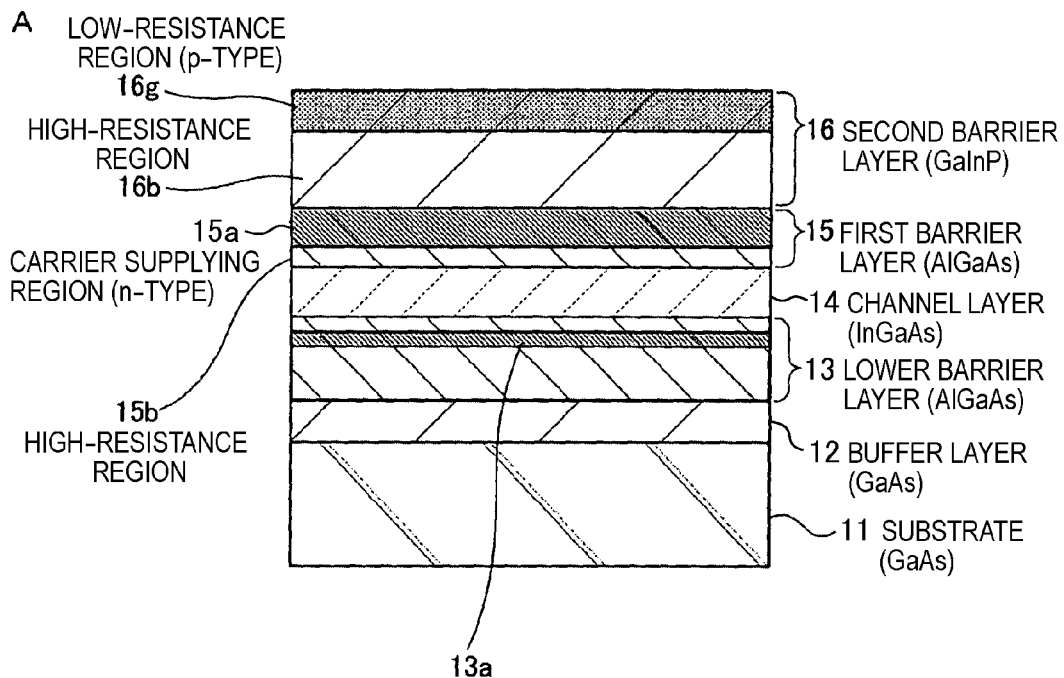
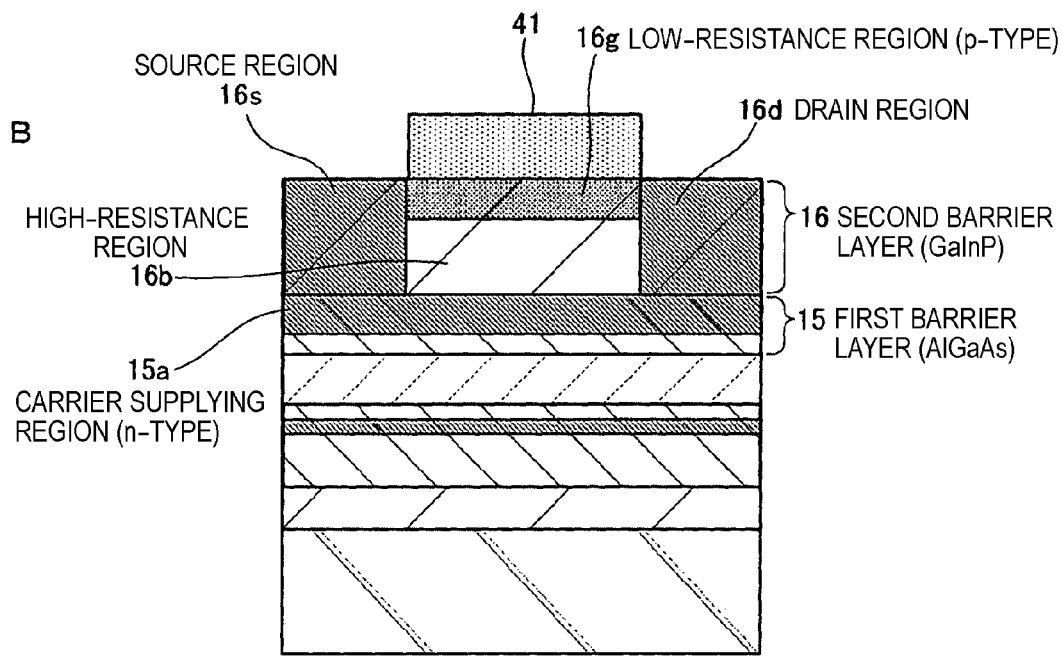

FIG. 31
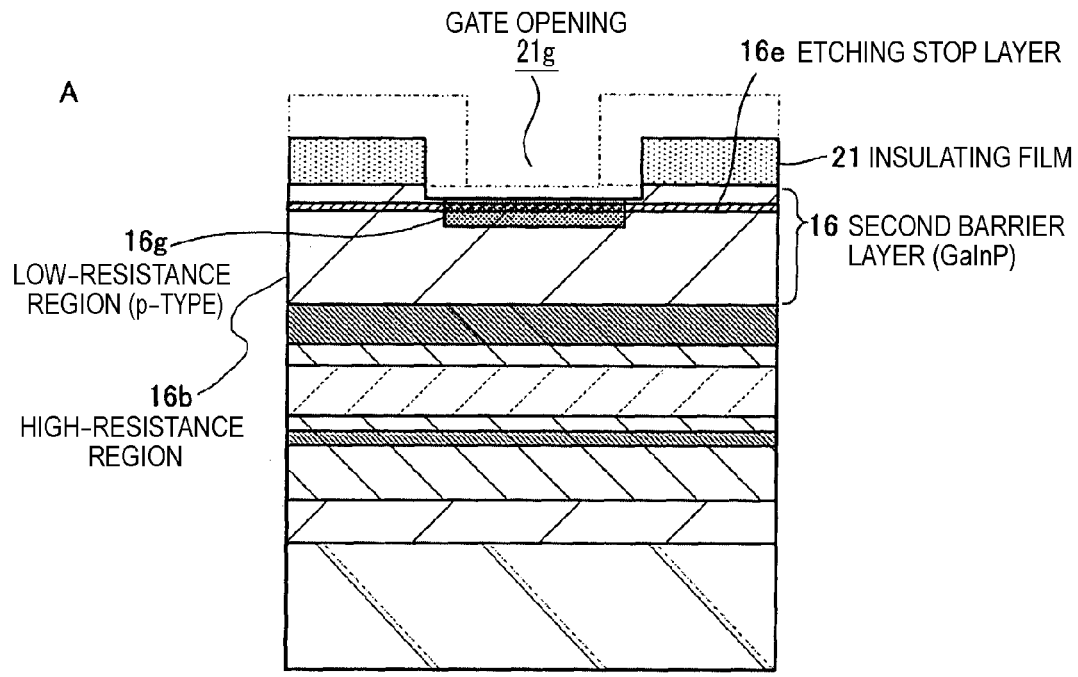
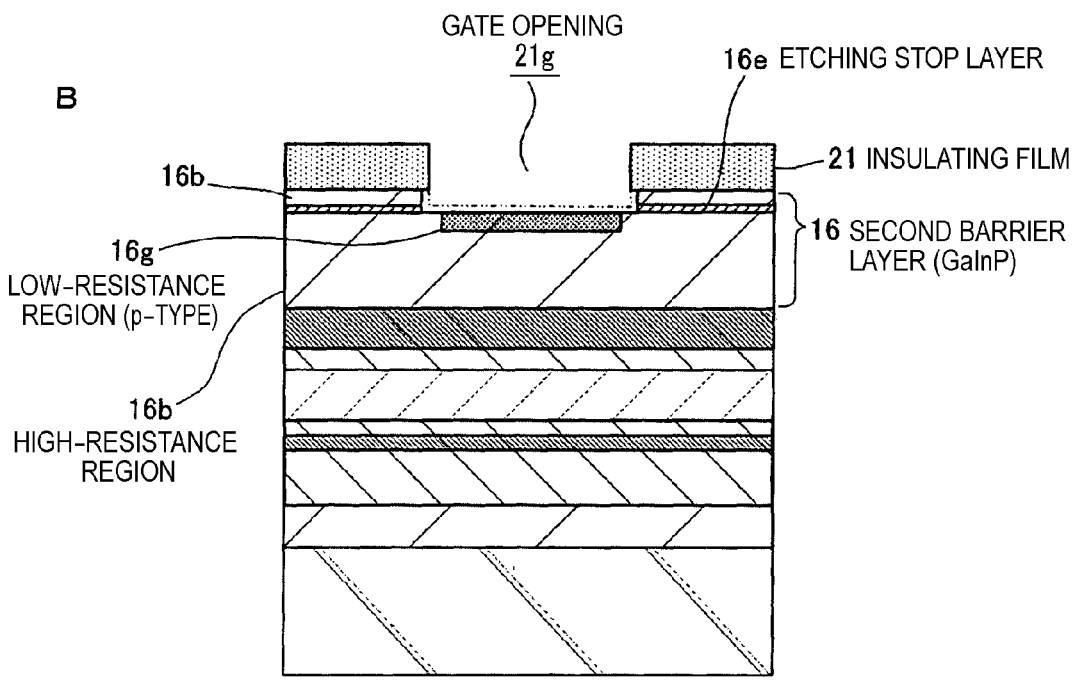

FIG. 32
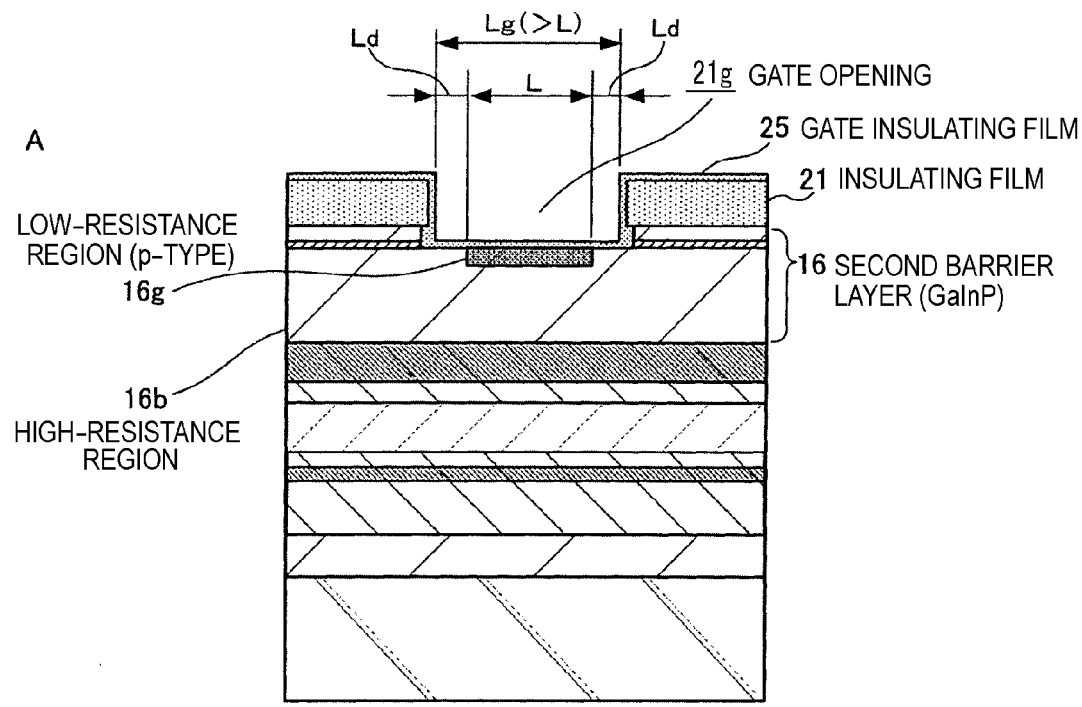
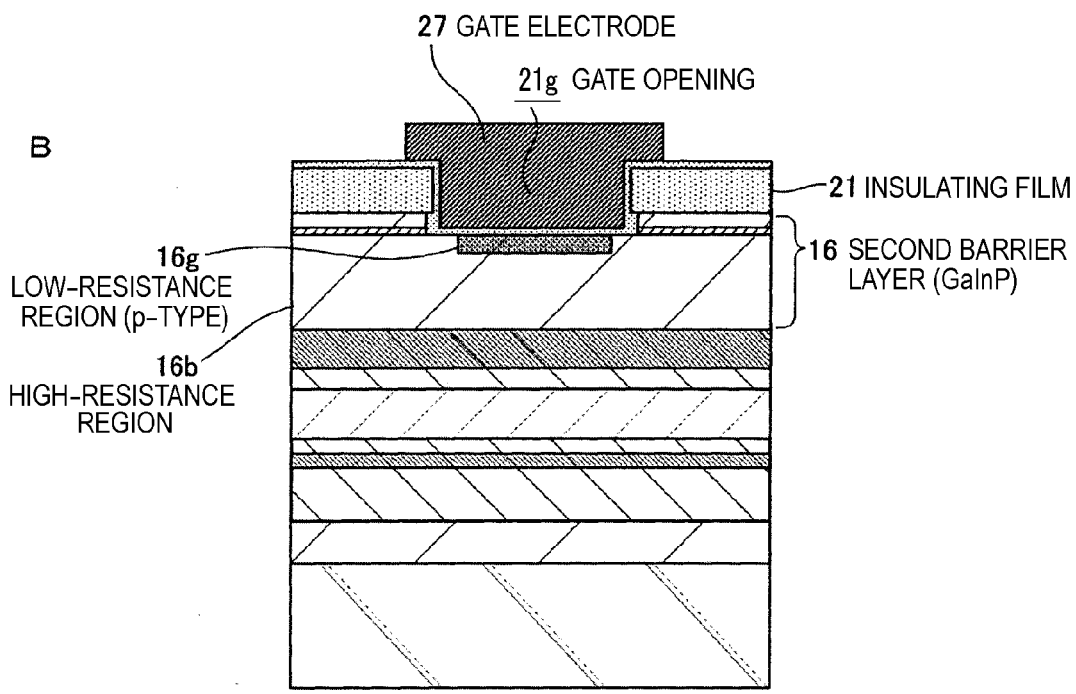

FIG. 35
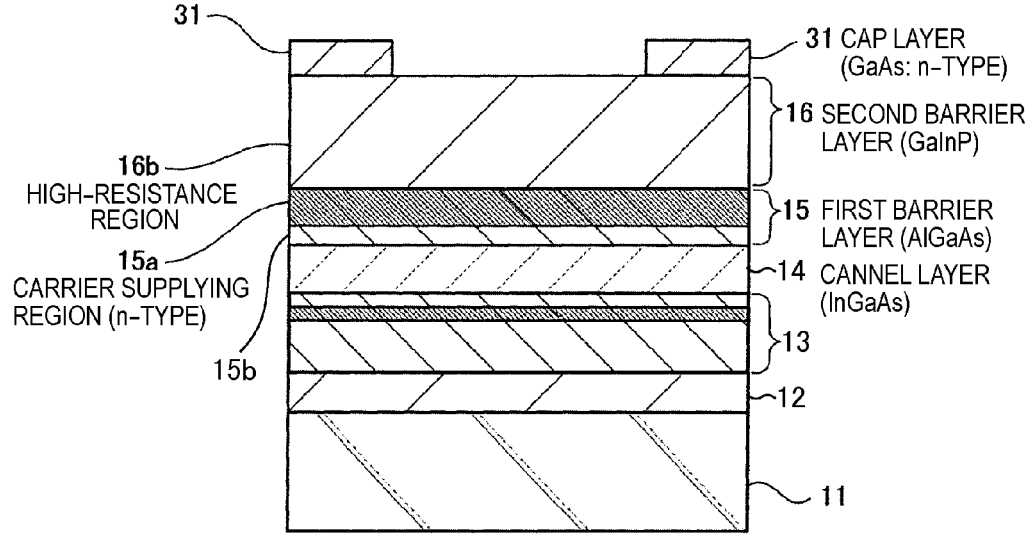
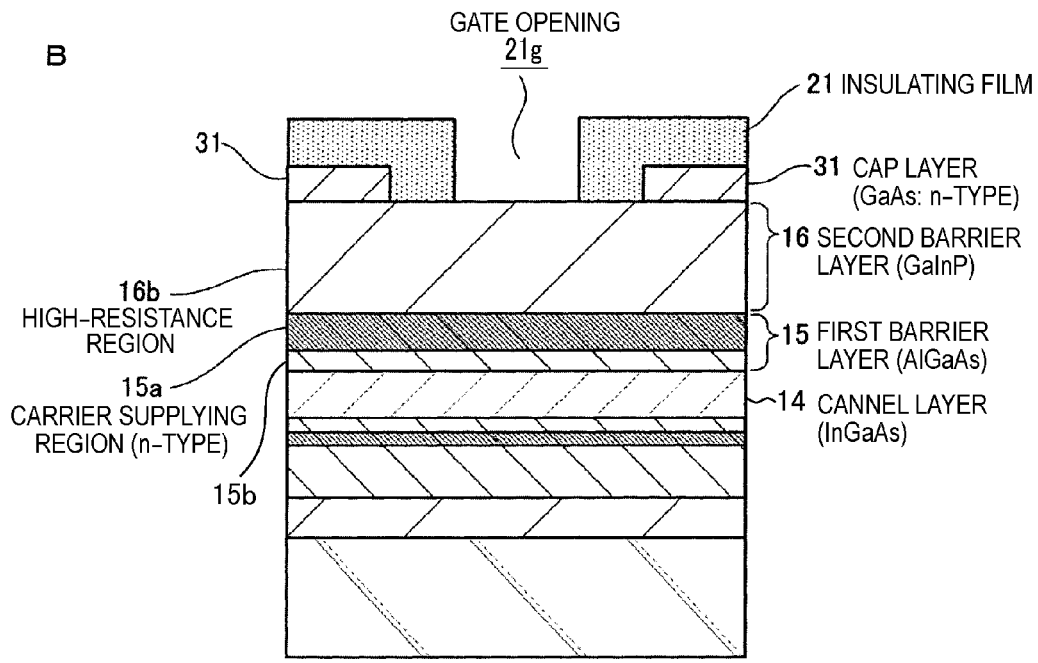

FIG. 37
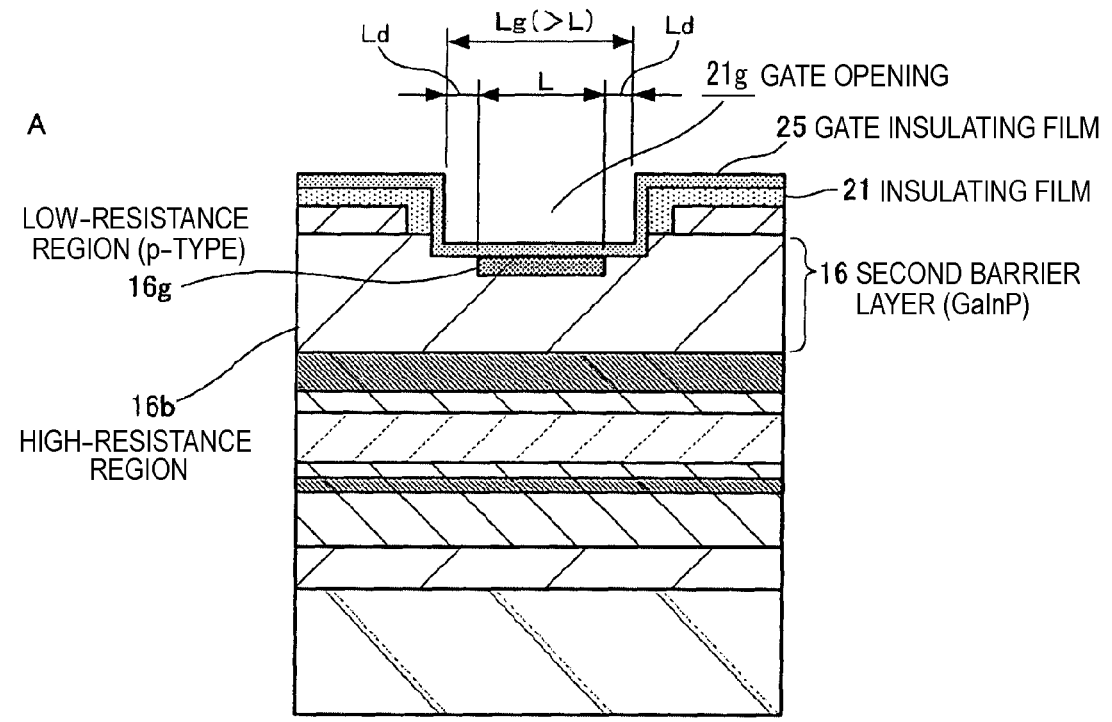
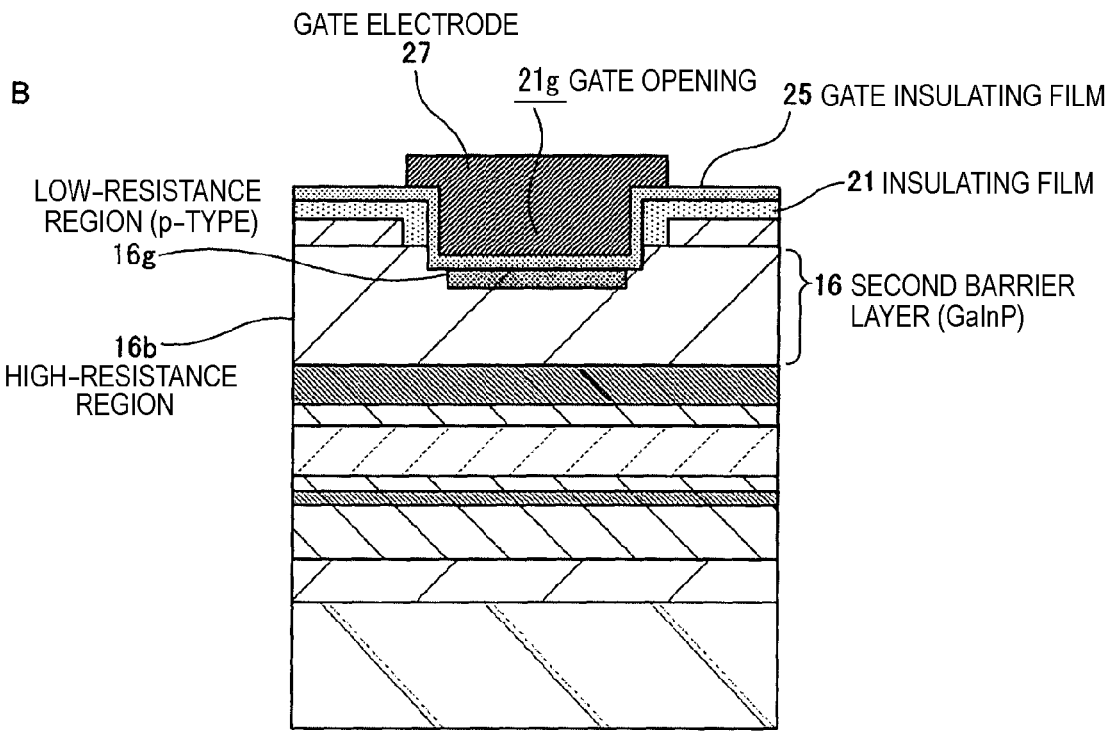

SEMICONDUCTOR APPARATUS AND MANUFACTURING METHOD OF THE SEMICONDUCTOR APPARATUS

TECHNICAL FIELD

The present technique relates to a semiconductor apparatus and a manufacturing method of the semiconductor apparatus, specifically to the semiconductor apparatus that is provided with a low-resistance region in a barrier layer between a gate electrode and a channel layer, and the manufacturing method of the same.

BACKGROUND ART

In recent years, in a mobile communications system such as a mobile phone, downscaling and energy consumption saving of a portable communications terminal have been strongly demanded. In order to realize these, for example, regarding an antenna switch, it is necessary to reduce an ON resistance Ron or the like. At the present day, as a device in practical use for the purpose of such an antenna switch, there are a Junction Pseudo-morphic High Electron Mobility Transistor (JPHEMT) and the like.

The JPHEMT is a semiconductor apparatus that performs current modulation utilizing a pn junction and a hetero junction. The semiconductor apparatus like this is provided with a hetero junction of, for example, a channel layer made of InGaAs and a barrier layer (AlGaAs) made of AlGaAs whose band gap is wider than that of the channel layer (InGaAs). Within the barrier layer (AlGaAs), a low-resistance region containing impurities is provided in a surface layer opposite to the channel layer, and a gate electrode is connected to this low-resistance region. In addition, within the barrier layer (AlGaAs), a carrier supplying region containing impurities, which turn out to be carriers, is provided on the channel layer side with respect to the low-resistance region. Moreover, a source electrode and a drain electrode are in ohmic contact with the barrier layer (AlGaAs) on both sides of the low-resistance region and the gate electrode.

In the semiconductor apparatus of a configuration as above, in a boundary face in the barrier layer side in the channel layer, a two-dimensional electron gas layer is formed in which electrons serving as carriers are confined at a high concentration. In addition, by applying a voltage to the gate electrode 20 thereby to control a concentration of the two-dimensional electron gas layer, a current flowing between the source electrode and the drain electrode via a channel layer part below the low-resistance region is modulated (regarding the above, see Patent Literature 1 below, for example).

CITATION LIST

Patent Literature

Patent Literature 1: JP H11-150264A

SUMMARY OF INVENTION

Technical Problem

By the way, in the semiconductor apparatus of the JPHEMT configuration described above, by reducing an impurity concentration in the channel layer, mobility of carriers (electrons) flowing between the source electrode and the drain electrode can be increased. However, even in the semiconductor apparatus of the JPHEMT configuration, an enhance performance has been expected, such as a reduction of an OFF current value.

Therefore, the present technique is directed to provide a semiconductor apparatus that is capable of contemplating a reduction of an OFF current value in a configuration where a low-resistance region is provided in a barrier layer between a gate electrode and a channel layer, and a manufacturing method of the same.

Solution to Problem

In order to achieve such an objective, a semiconductor apparatus of the present technique is provided with a channel layer composed of a compound semiconductor and an upper barrier layer on the channel layer. The upper barrier layer is provided with a first barrier layer that constitutes a boundary layer on the channel layer side in the upper barrier layer and a second barrier layer that is provided in a surface layer of the upper barrier layer. Of these, the first barrier layer is composed of a compound semiconductor whose carrier running energy band at a junction portion with the channel layer is farther from an intrinsic Fermi level within the channel layer than that of the channel layer is. On the other hand, the second barrier layer is composed of a compound semiconductor whose energy band opposite to a carrier running energy band across a band gap at a junction portion, in a state of forming a junction with the first barrier layer, is farther from an intrinsic Fermi level within the first barrier layer than that of the first barrier layer is. In at least a surface layer in the second barrier layer, a low-resistance region that contains impurities of a conduction type opposite to that of carriers thereby to be kept at a lower resistance than a surrounding area thereof is provided. In addition, a source electrode and a drain electrode that are connected to the second barrier layer are provided in corresponding positions across the low-resistance region. Moreover, a gate electrode is provided above the low-resistance region via a gate insulating film.

In the semiconductor apparatus of the configuration like this, by providing the first barrier layer composed of the compound semiconductor whose carrier running energy band at the junction portion with the channel layer is farther from the intrinsic Fermi level within the channel layer than that of the channel layer is, carriers are confined in the channel layer at a high density. And by a gate voltage applied to the gate electrode, a carrier depleted region in a part of the channel layer corresponding to the low-resistance layer below the gate electrode is enlarged or shrunk, so that an electric current flowing between the source electrode and the drain electrode through the channel layer is modulated. Here, the gate electrode is provided above the low-resistance region formed in the surface layer of the upper barrier layer including the first barrier layer, via the gate insulating film. With this, even when a forward voltage with respect to the low-resistance region and the surrounding area thereof is applied, a gate leakage current can be prevented from flowing between the gate electrode and the source electrode/the drain electrode.

And, specifically, in the surface layer of the upper barrier layer provided with the low-resistance region, there is provided the second barrier layer that is composed of a compound semiconductor whose energy band opposite to the carrier running energy band across the band gap at the junction portion, in a state of forming the junction with the first barrier layer, is farther from the intrinsic Fermi level within the first barrier layer than that of the first barrier layer is. With this, when the gate electrode is at an OFF voltage, the carrier running energy band in the channel layer is distanced from the Fermi level, so that it becomes difficult for the carriers to be supplied to the channel layer, compared with a case where the upper barrier layer is of a single-layer structure with only the first barrier layer.

In addition, the present technique is a manufacturing method of the semiconductor apparatus of the configuration described above, wherein the following procedures are performed. First, on the channel layer composed of a compound semiconductor, the first barrier layer is formed which is composed of a compound semiconductor whose carrier running energy band at the junction portion with the channel layer is farther from an intrinsic Fermi level within the channel layer than that of the channel layer is. Then, above the first barrier layer, the second barrier layer is formed which is composed of a compound semiconductor whose energy band opposite to the carrier running energy band across the band gap at the junction portion, in a state of forming a junction with the first barrier layer, is farther from the intrinsic Fermi level within the first barrier layer than that in first barrier layer is. This second barrier layer is formed so as to be provided in at least the surface layer with the low-resistance region that contains impurities of a conduction type opposite to that of the carrier, thereby to be kept at lower resistance than the surrounding area thereof. In addition, the source electrode and the drain electrode are formed which are connected to the upper barrier layer provided at a surface layer thereof with the second barrier layer in corresponding positions across the low-resistance region, with the boundary layer on the channel layer side being composed by the first barrier layer. Moreover, the gate insulating film is formed on top of the low-resistance region, and the gate electrode is formed above the low-resistance region via the gate insulating film.

Advantageous Effects of Invention

According to the present technique explained above, in a semiconductor apparatus having a configuration where a low-resistance region is provided in a barrier layer between a gate electrode and a channel layer, when the gate electrode is at an OFF voltage, because it becomes difficult to supply carriers to the channel layer, a reduction of an OFF leakage current can be sought.

BRIEF DESCRIPTION OF DRAWINGS

FIG. 17 is a cross-sectional process chart (part 1) illustrating a manufacturing procedure when the sixth embodiment is combined with the fifth embodiment. FIG. 17B is a cross-sectional process chart (part 1) illustrating the manufacturing procedure when the sixth embodiment is combined with the fifth embodiment.

FIG. 24A is a cross-sectional process chart illustrating a manufacturing procedure of the semiconductor apparatus of the tenth embodiment. FIG. 24B is a cross-sectional process chart illustrating the manufacturing procedure of the semiconductor apparatus of the tenth embodiment.

FIG. 31A is a cross-sectional process chart (part 2) illustrating the second example. FIG. 31B is a cross-sectional process chart (part 2) illustrating the second example.

FIG. 32A is a cross-sectional process chart (part 3) illustrating the second example. FIG. 32B is a cross-sectional process chart (part 3) illustrating the second example.

FIG. 35A is a cross-sectional process chart (part 1) illustrating a third example. FIG. 35B is a cross-sectional chart (part 1) illustrating the third example.

FIG. 36B is a cross-sectional chart (part 2) illustrating the third example.

FIG. 37A is a cross-sectional process chart (part 3) illustrating the third example. FIG. 37B is a cross-sectional chart (part 3) illustrating the third example.

DESCRIPTION OF EMBODIMENTS

In the following, embodiments of the present technique will be explained in an order indicating as follows:
1. First Embodiment (an example where a carrier supplying region is provided in a surface layer of a first barrier layer)
2. Second Embodiment (an example where the carrier supplying region is provided in a center of the first barrier layer)
3. Third Embodiment (an example where the carrier supplying region and a low-resistance region are joined)
4. Fourth Embodiment (an example where a second barrier layer surrounding the low-resistance region is made low-resistive)
5. Fifth Embodiment (an example where a cap layer is provided between the second barrier layer and both of a source electrode and a drain electrode)
6. Sixth Embodiment (an example where an entire surface of the second barrier layer is covered by a gate insulating film)
7. Seventh Embodiment (an example where the low-resistance region is covered by a gate electrode)
8. Eighth Embodiment (an example where a surface layer of the second barrier layer is patterned as the low-resistance region)
9. Ninth Embodiment (an example where the second barrier layer on the first barrier layer is patterned as the low-resistance region)
10. Tenth Embodiment (an example where a source region and a drain region of conduction type opposite to that of the low-resistance region)
11. Eleventh Embodiment (a first example where a gate electrode covering the low-resistance region is provided in self-alignment)
12. Twelfth Embodiment (a second example where the gate electrode covering the low-resistance region is provided in self-alignment)
13. Thirteenth Embodiment (a third example where the gate electrode covering the low-resistance region is provided in self-alignment)
14. Fourteenth Embodiment (a fourth example where the gate electrode covering the low-resistance region is provided in self-alignment)
15. Modified Example-1
16. Modified Example-2
17. Application Example (Wireless Communications Apparatus)

Incidentally, the same reference signs are given to common constituent elements in each of the embodiments, and repetitive explanations are omitted.

1. First Embodiment

An Example of Providing a Carrier Supplying Region at a Surface Layer of a First Barrier Layer In this first embodiment, explanations will be made based on each drawing in order of a configuration of a semiconductor apparatus of the first embodiment, an operation of the semiconductor apparatus of the first embodiment, a manufacturing method of the semiconductor apparatus of the first embodiment, and a working effect of the semiconductor apparatus of the first embodiment, which the present technique is applied to.

Configuration of Semiconductor Apparatus of First Embodiment

Figure 1:
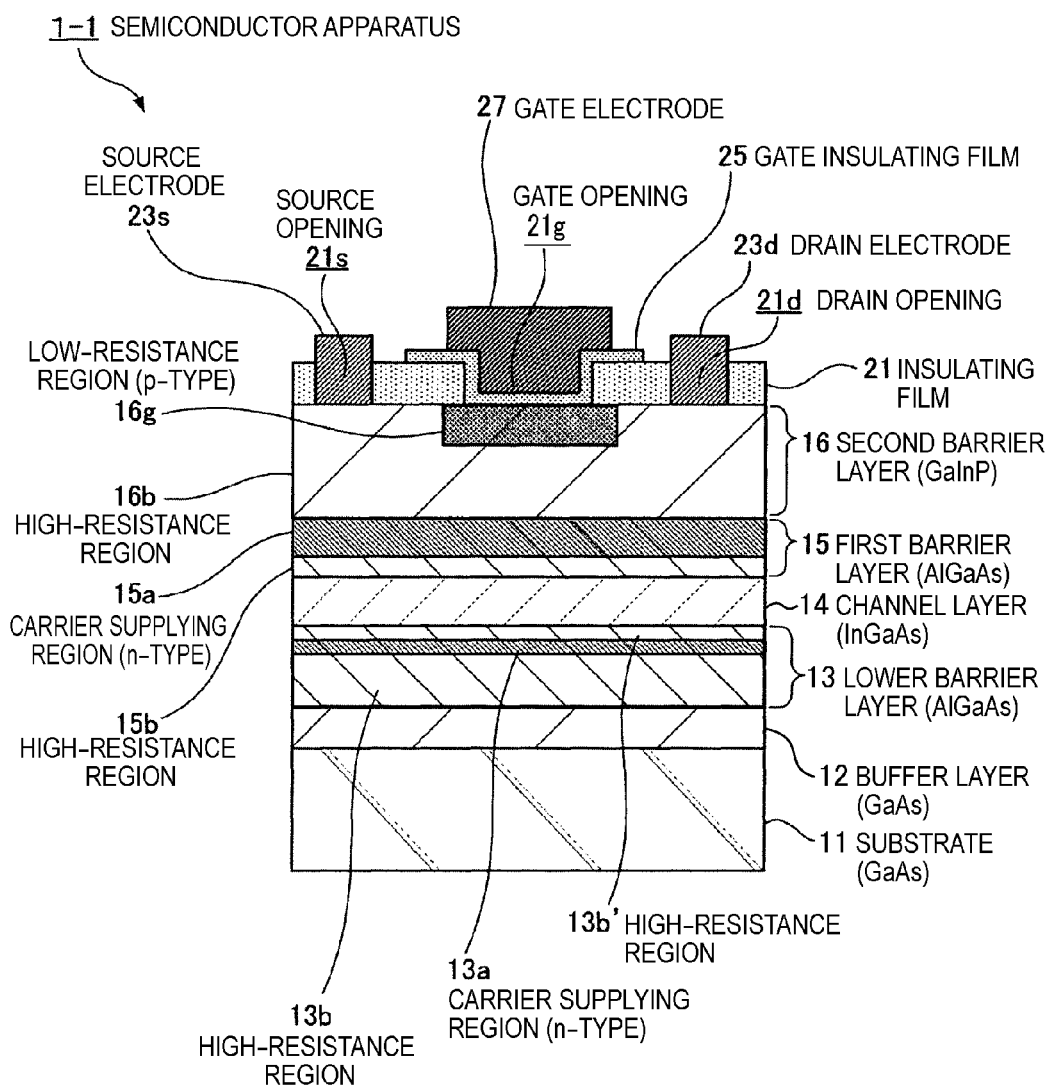
FIG. 1 is a cross-sectional view illustrating a principal configuration of a semiconductor apparatus of a first embodiment.
Figure 2:
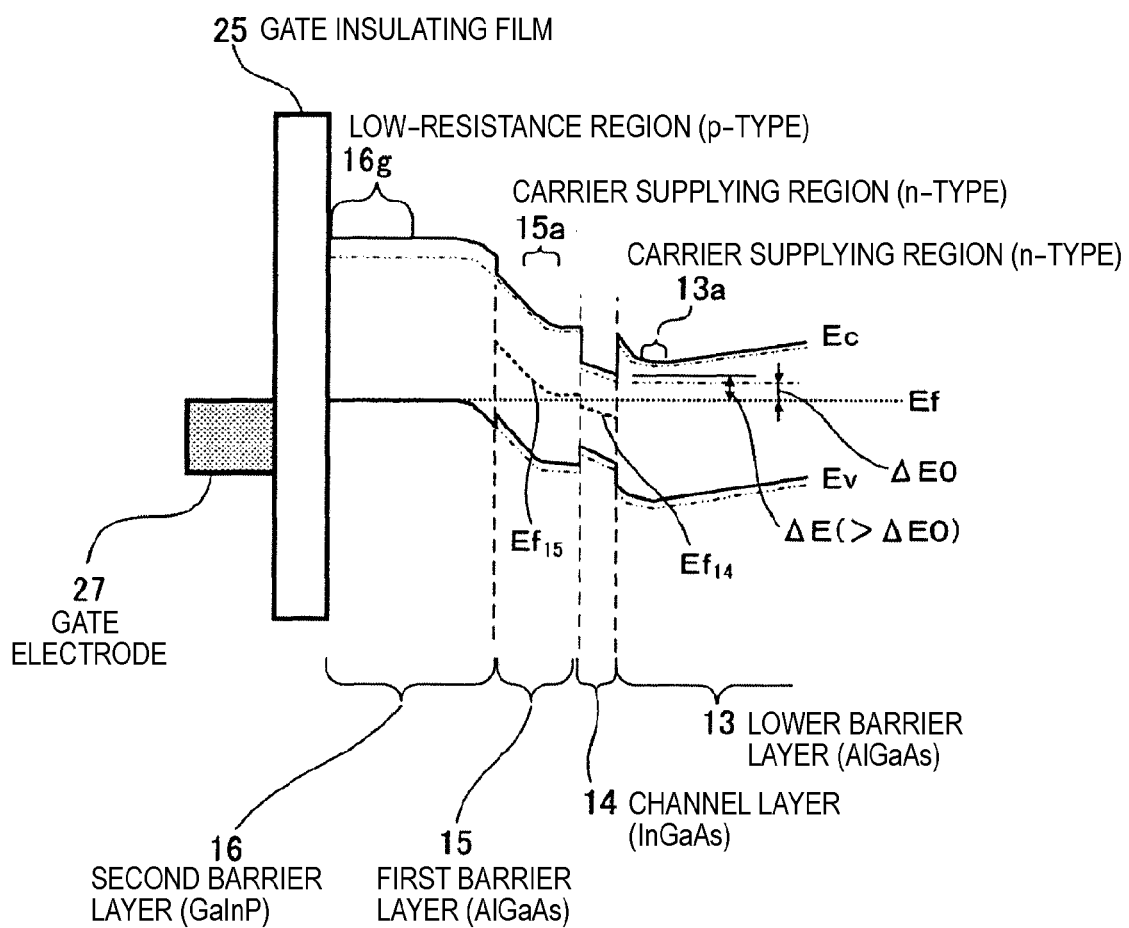
FIG. 2 is an energy band diagram of the semiconductor apparatus of the first embodiment at the time of OFF operation.
Figure 3:
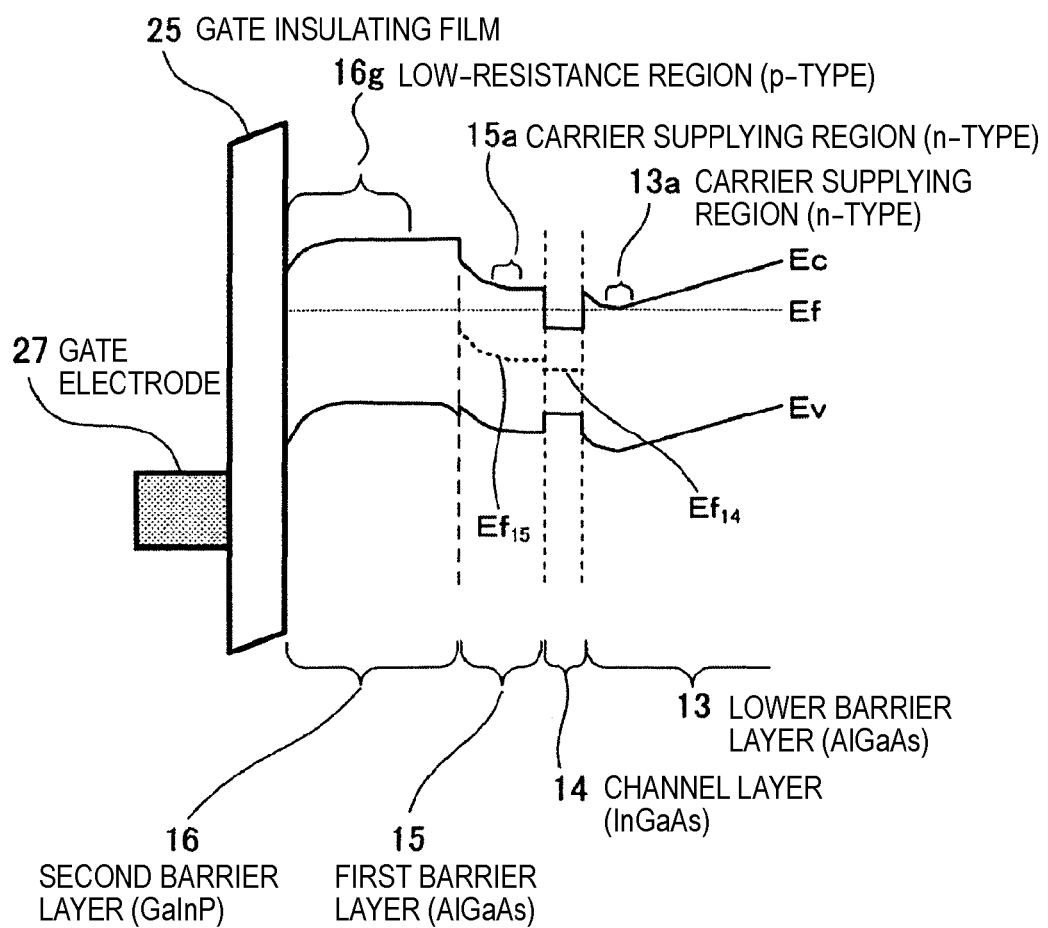
FIG. 3 is an energy band diagram of the semiconductor apparatus of the first embodiment at the time of ON operation.

FIG. 1 is a cross-sectional view illustrating a principal configuration of the semiconductor apparatus of the first embodiment to which the present technique is applied. In addition, FIG. 2 is an energy band diagram of the semiconductor apparatus of the first embodiment at the time of OFF operation; and FIG. 3 is an energy band diagram of the semiconductor apparatus of the first embodiment at the time of ON operation. In the following, a detailed configuration of the semiconductor apparatus of the first embodiment is explained based on those drawings.

A semiconductor apparatus 1-1 of the first embodiment illustrated in FIG. 1 is a so-called JPHEMT that is provided with a barrier layer between a gate electrode and a channel layer and, furthermore, is provided with a low-resistance region of an opposite conduction type within the barrier layer. In this semiconductor apparatus 1-1, a buffer layer 12, a lower barrier layer 13, a channel layer 14, and an upper barrier layer composed of a first barrier layer 15 and a second barrier layer 16, all of which are made of corresponding compound semiconductor materials, are layered in this order on a substrate 11 made of a compound semiconductor. With the lower barrier layer 13, a carrier supplying region 13a is provided; and in the first barrier layer 15 of the upper barrier layer, a carrier supplying region 15a is provided. Moreover, within the second barrier layer 16 of the upper barrier layer, a low-resistance region 16g is provided.

Specifically in this first embodiment, a first characteristic part is that, in a junction portion of the first barrier layer 15 and the second barrier layer 16, an energy band opposite to a carrier running energy band across an energy band gap in the second barrier layer 16 is farther from the intrinsic Fermi level within the first barrier layer than an energy band opposite to a carrier running energy band across an energy band gap in the first barrier layer 15 is, as explained in detail in the following.

Here, the carrier running energy band is an energy band occupied with majority carriers. In addition, the energy band opposite to the carrier running energy band across an energy band gap is an energy band occupied with minority carriers. As one example, in an n-type semiconductor apparatus whose carriers are electrons, the carrier running energy band is a conduction band (conductive band), and the energy band opposite to the carrier running energy band across the energy band gap is a valence band (valency band). On the other hand, in a p-type semiconductor apparatus whose carriers are holes, the carrier running energy band is the valence band (valency band), and the energy band opposite to the carrier running energy band across the energy band gap is the conduction band (conductive band). In the following, the energy band opposite to the carrier running energy band across the energy band gap may be simply referred to as the energy band opposite to the carrier running energy band.

On a layered body of each of the layers made of the compound semiconductor materials such as above, an insulating film 21 is provided. In this insulating film 21, a source opening 21s/a drain opening 21d, and a gate opening 21g between these are provided. On the insulating film 21 like this, a source electrode 23s/a drain electrode 23d are provided which are connected to the second barrier layer 16 through the source opening 21s/the drain opening 21d, respectively.

In addition, specifically in this first embodiment, a second characteristic part is that, above the low-resistance region 16g exposed at the bottom portion of the gate opening 21g, a gate electrode 27 is provided via a gate insulating film 25.

In the following, a detailed configuration of each of the above constituent elements that constitute the semiconductor apparatus 1-1 is explained in series from the substrate 11 side.

[Substrate 11]

The substrate 11 is composed of a semi-insulating compound semiconductor material. The substrate 11 like this is composed of, for example, a III-V semiconductor material. For example, a semi-insulating single crystal GaAs substrate or an InP substrate is used.

[Buffer Layer 12]

The buffer layer 12 is composed of a compound semiconductor layer epitaxially grown on the substrate 11, for example, and composed using a compound semiconductor that is favorably lattice-matched to the substrate 11 and the lower barrier layer 13. For examples, when the substrate 11 is formed of a single crystal GaAs substrate, as one example of the buffer layer 12 like this, an epitaxially grown layer of u-GaAs that is not doped with impurities (u—represents that impurities are not doped; the same is true hereinafter) is used.

[Lower Barrier Layer 13]

The lower barrier layer 13 is favorably lattice-matched to the buffer layer 12 and the channel layer 14 located above. As one example of the lower barrier layer 13 like this, an epitaxially grown layer of an AlGaAs mixed crystal is used. Here, as one example, the lower barrier layer 13 is composed of an $Al_{0.2}Ga_{0.8}As$ mixed crystal whose compositional ratio of aluminum (Al) is 0.2 in the group III elements.

The lower barrier layer 13 like this has a carrier supplying region 13a which includes impurities that supply carriers. Here, electrons are used as the carriers, and the carrier supplying region 13a that includes n-type impurities as electron supplying impurities is disposed in a middle part of the lower barrier layer 13 in a film thickness direction. As the n-type impurity in the lower barrier layer 13 composed of the $Al_{0.2}Ga_{0.8}As$ mixed crystal, silicon (Si) is used.

In addition, the thick film part except the carrier supplying region 13a in the lower barrier layer 13 may be composed as high-resistance regions 13b, 13b' that are not doped with impurities or that contain n-type or p-type impurities at a low concentration. It is preferable that these high-resistance regions 13b, 13b' have an impurity concentration of $1 \times 10^{17}$ $cm^{-3}$ or lower and a specific resistance of $1 \times 10^{-2} \Omega$ or greater.

One example of a specific configuration of the lower barrier layer 13 such as above is the following. The high-resistance region 13b that does not contain impurities and has a film thickness of about 200 nm is provided on the buffer layer 12 side. On top of this, the carrier supplying region 13a that contains silicon (Si) at $1.6 \times 10^{12}$ $cm^{-2}$ and has a film thickness of about 4 nm is layered. Moreover on top of this, the high-resistance region 13b' that does not contain impurities and has a film thickness of about 2 nm is layered.

Incidentally, as for the lower barrier layer 13, all regions may be composed of the carrier supplying region 13a, without including the high-resistance regions 13b, 13b'.

[Channel Layer 14]

The channel layer 14 is a current passage between the source electrode 23s and the drain electrode 23d, and a layer where the carriers supplied from the carrier supplying region 13a of the lower barrier layer 13 and the carrier supplying region 15a of the first barrier layer 15 described later are accumulated. The channel layer 14 like this is composed of a compound semiconductor that forms a hetero junction with the lower barrier layer 13, and favorably lattice-matched to the lower barrier layer 13. In addition, the channel layer 14 ought to be composed by using a compound semiconductor whose carrier running energy band at the hetero junction portion with the lower barrier layer 13 is closer to the intrinsic Fermi level within the channel layer than a carrier running energy band in a compound semiconductor material that constitutes the boundary region of the lower barrier layer 13 is. In other words, the channel layer 14 ought to be composed by using a compound semiconductor whose majority carrier running energy band at the hetero junction portion with the lower barrier layer 13 is closer to the minority carrier running energy band than a majority carrier running energy band in a compound semiconductor that constitutes the boundary region of the lower barrier layer 13 is. Incidentally, as illustrated in FIG. 2, the intrinsic Fermi level Ef14 within the channel layer is positioned in the middle of the lowest energy Ec of the conduction band (referred to as a conduction band energy Ec, hereinafter) and the highest energy Ev of the valence band (referred to as a valence band energy Ev, hereinafter) of the channel layer 14.

When the carriers are electrons, the carrier running energy band is the conduction band (conductive band). Therefore, the channel layer 14 is composed by using a III-V compound semiconductor material whose conduction band energy Ec at the junction portion with the lower barrier layer 13 is lower than that of a compound semiconductor material that constitutes the lower barrier layer 13. The greater the difference between the conduction band energies Ec of the channel layer 14 and the lower barrier layer 13 becomes at the junction portion, the better the channel layer 14 like this is. When the carriers are holes, the carrier running energy band is the valence band (valency). Therefore, the channel 14 is composed by using a compound semiconductor whose valence band energy Ev at the junction portion with the lower barrier layer 13 is higher than that of a compound semiconductor material that constitutes the lower barrier layer 13. The greater a difference between the valence band energies Ev of the channel layer 14 and the lower barrier layer 13 becomes at the junction portion, the better the channel layer 14 like this is. Incidentally, although the following explanation is made exemplifying a case where the carriers are electrons, when the carriers are holes, it suffices that the conduction types are reversed in the explanations about the impurities and the energy band.

When the lower barrier layer 13 is composed of, for example, the AlGaAs mixed crystal, the channel layer 14 such as above is composed of an InGaAs mixed crystal whose energy band gap is smaller than that of the AlGaAs mixed crystal. In this case, the higher a compositional ratio of indium (In) is, the smaller the energy band gap of the InGaAs mixed crystal can be, thereby to further enlarge the difference between the conduction band energies Ec of the channel layer 14 and the lower barrier layer 13 made of the AlGaAs mixed crystal. Therefore, the InGaAs mixed crystal that constitutes the channel layer 14 may have a compositional ratio of indium (In) of 0.1 or greater.

As one example of the channel layer 14 such as above, the $In_{0.2}Ga_{0.8}As$ mixed crystal whose compositional ratio of indium (In) is 0.2 in the group III elements is used. With this, as for the channel layer 14, a sufficient difference between the conduction band energies Ec is obtained, while ensuring a lattice-matching to respect to the lower barrier layer 13.

In addition, the channel layer 14 like this may be u-InGaAs that is not doped with impurities. With this, carrier impurity scattering is suppressed in the channel layer 14, thereby to realize carrier transfer at high mobility.

Incidentally, the channel layer 14 may be an epitaxially grown layer formed to have a film thickness of 15 nm or lower, which allows for ensured crystallinity thereby to realize an excellent layer in carrier running performance.

[First Barrier Layer 15 (Upper Barrier Layer)]

The first barrier layer 15 is a layer that constitutes a part of the upper barrier layer provided on top of the channel layer 14, constitutes a boundary layer in contact with the channel layer 14, and is favorably lattice-matched to the channel layer 14. The first barrier layer 15 like this is composed by using a compound semiconductor material whose carrier running energy band at the junction portion with the channel layer 14 is farther from the intrinsic Fermi level Ef14 within the channel layer than that of the compound semiconductor material that constitutes the channel layer 14 is. Namely, the first barrier layer 15 is composed by using a compound semiconductor material whose major carrier running energy band is farther from the minority carrier running energy band at the junction portion with the channel layer 14 than that of the compound semiconductor material that constitutes the channel layer 14 is. When the carriers are electrons, the first barrier layer 15 is composed by using a III-V compound semiconductor material whose conduction band energy Ec is higher than that of the compound semiconductor material that constitutes the channel layer 14. The greater the difference between the conduction band energies Ec of the channel layer 14 and the first barrier layer 15 becomes at the junction portion becomes, the better the first barrier layer 15 like this is.

When the channel layer 14 is composed of the InGaAs mixed crystal, the first barrier layer 15 such as above may be composed of, for example, an AlGaAs mixed crystal whose energy band gap is greater than that of the InGaAs mixed crystal. In this case, by maintaining a compositional ratio of aluminum (Al) low, a so-called source resistance can be prevented from being enlarged. Therefore, the AlGaAs mixed crystal that constitutes the first barrier layer 15 may have a compositional ratio of aluminum (Al) of 0.25 or smaller in the group III elements.

As one example of the first barrier layer 15 such as above, the $Al_{0.2}Ga_{0.8}As$ mixed crystal having a compositional ratio of aluminum (Al) of 0.2 is used. With this, lattice matching is ensured with respect to the channel layer 14. Incidentally, the first barrier layer 15 like this does not necessarily have the same composition as the lower barrier layer 13, and these layers may be composed of the AlGaAs mixed crystals suitable to each other.

The first barrier layer 15 like this has the carrier supplying region 15a that contains impurities that supply carriers. Here, the carrier supplying region 15a of n-type, which contains silicon (Si) as the impurity that supply an electron, is disposed at a surface layer of the first barrier layer 15.

In addition, the film thickness portion except for the carrier supplying region 15a in the first barrier layer 15 may be formed as the high-resistance region 15b that is not doped with impurities or that contains impurities at a low concentration. When containing impurities, this high-resistance region 15b contains n-type impurities or p-type impurities. In this case, it is preferable that an impurity concentration is $1 \times 10^{17}$ cm$^{-3}$ or lower, and a specific resistance is $1 \times 10^{-2}$ Ωcm or greater.

One example of the first barrier layer 15 such as above is the following. The first barrier layer 15 has a film thickness of about 6 nm, and is made by layering the high-resistance region 15b has a film thickness of about 2 nm and is not doped with impurities, and the carrier supplying region 15a that has a film thickness of about 4 nm and contains silicon (Si) at about $1.6 \times 10^{12}$ cm$^{-2}$ in this order from the channel layer 14 side.

Incidentally, when the channel layer 14 is composed of the InGaAs mixed crystal, the first barrier layer 15 is not limited to the AlGaAs mixed crystal, but may be composed of an In(AlGa)AsP mixed crystal, which is a III-V compound semiconductor. With this, the compositional ratio of In in the channel layer 14 composed of the InGaAs mixed crystal can be increased, thereby to enhance the carrier mobility in the channel layer 14.

In addition, as for this first barrier layer 15, all regions may be composed of the carrier supplying region, as with the lower barrier layer 13.

[Second Barrier Layer 16 (Upper Barrier Layer)]

The second barrier layer 16 is a layer that constitutes a part of the upper barrier layer provided on top of the channel layer 14, and constitutes a surface layer of the upper barrier layer. The second barrier layer 16 like this is favorably lattice-matched to the first barrier layer 15, and forms a hetero junction with the first barrier layer 15. In addition, specifically, this second barrier layer 16 is composed by using a compound semiconductor whose energy band opposite to the carrier running energy band at the junction portion with the first barrier layer 15 is farther from the intrinsic Fermi level within the first barrier layer than that of the first barrier layer 15 is. Namely, the second barrier layer 16 ought to be composed by using a compound semiconductor whose minority carrier running energy band at the junction portion with the first barrier layer 15 is farther from the majority carrier running energy band than that of the first barrier layer 15 is. Incidentally, as illustrated in FIG. 2, the intrinsic Fermi level Ef15 within the first barrier layer is positioned in the middle of the conduction band energy Ec and the valence band energy Ev of the first barrier layer 15. When the carriers are electrons, the second barrier layer 16 is composed by using such a compound semiconductor that a valence band energy Ev of the second barrier layer 16 at the junction portion with the first barrier layer 15 is lower than a valence band energy Ev of the first barrier layer 15 at the junction portion with the channel layer 14. The greater the difference between the valence band energies Ev of the first barrier layer 15 and the second barrier layer 16 becomes at the junction portion, the better the second barrier layer 16 like this is.

When the first barrier layer 15 is composed of the AlGaAs mixed crystal, the second barrier layer 16 such as above is composed of, for example, a GaInP mixed crystal whose energy band gap is wider than that of the AlGaAs mixed crystal. In this case, the second barrier layer 16 is composed of a $Ga_{0.5}In_{0.5}P$ mixed crystal having a compositional ratio of gallium (Ga) of 0.5 in the group III elements. With this, lattice-matching to the first barrier layer 15 is ensured.

Incidentally, this second barrier layer 16 is not limited to the GaInP mixed crystal, but may be composed of, for example, an. In(AlGa)AsP mixed crystal, an AlAs mixed crystal, InAlP, or an AlGaAs mixed crystal, which are III-V compound semiconductors. However, a compositional ratio of Al in the AlGaAs mixed crystal ought to be 0.2 or greater. In addition, it suffices that the compound semiconductor that constitutes the second barrier layer 16 has the valence band energy Ev lower than that of the compound semiconductor that constitutes the first barrier layer 15, and the conduction band energy Ec may be higher or lower.

The second barrier layer 16 like this is a highly resistive region (the high-resistance region 16b) by being not doped with impurities thereto, or containing n-type impurities at a low concentration. When this second barrier layer 16 contains n-type impurities, it is preferable that an impurity concentration is $1\times10^{17}$ cm$^{-3}$ or lower, and a specific resistance is $1\times10^{-2}$ Ωcm or greater.

One example of the second barrier layer 16 such as above ought to be provided on the first barrier layer 15 at a film thickness of 30 nm.

[Low-Resistance Region 16g]

The low-resistance region 16g is provided within the second barrier layer 16 and at least on a surface layer opposite to the channel layer 14, leaving a distance with respect to the carrier supplying region 15a. This low-resistance region 16g contains impurities of an opposite conduction type to the carriers, and is kept at a lower resistance than a surrounding area. Therefore, when the carriers are electrons, p-type impurities are diffused in the low-resistance region 16g.

Values of a thickness and a p-type impurity concentration of the low-resistance region 16g like this are set in such a manner that the semiconductor apparatus 1-1 is in the following state, in association with the film thickness of the second barrier layer 16 and the n-type impurity concentration of the second barrier layer 16. Namely, as for these values, the thickness and the p-type impurity concentration are set in such a manner that the electrons within the channel layer 14 is depleted when a negative voltage is applied to the gate electrode 27, and on the other hand the low-resistance region 16g is depleted when a positive voltage is applied to the gate electrode 27. Incidentally, in the second barrier layer 17 provided with the low-resistance region 16g, the other regions except the low-resistance region 16g are the high-resistance region 16b whose resistance value is greater, compared with low-resistance region 16g.

Here, the depletion of the electrons within the channel layer 14 when a negative voltage is applied to the gate electrode 27 is due to a depletion layer of a pn junction between the low-resistance region 16g and the high-resistance region 16b of the second barrier layer 16, in contact with the low-resistance region 16g. On the other hand, the depletion of the low-resistance region 16g when a positive voltage is applied to the gate electrode 27 is due to a depletion layer caused by an MIS structure of the p-type low-resistance region 16g, the gate insulating film 25, and the gate electrode 27. And the depletion of the p-type low-resistance region 16g causes the depletion layer between the low-resistance region 16g and the high-resistance region 16b to disappear, which resolves the depletion of the electrons within the channel layer 14, and thus electrons are accumulated within the channel layer 14.

In the low-resistance region 16g like this, as one example, the p-type impurities of $1\times10^{18}$ cm$^{-3}$ or greater may be contained, or as one example, about $1\times10^{19}$ cm$^{-3}$ may be contained. Incidentally, as a p-type impurity, zinc (Zn) is used in order to form the low-resistance region 16g in the second barrier layer 16 composed of the $Ga_{0.5}In_{0.5}P$ mixed crystal or the In(AlGa)AsP mixed crystal.

[Insulating Film 21]

The insulating film 21 is provided in a state of covering the entire surface of the second barrier layer 16. For this insulating film 21, there is used a material that has insulation properties against the compound semiconductor that constitutes the second barrier layer 16, and has capability to protect the upper surface of the underlying layer (the second barrier layer 16 in this case) from impurities such as ions. As one example, the insulating film 21 is composed of silicon nitride ($Si_3N_4$) whose thickness is, for example, 20 nm.

In the insulating film 21 like this, the source opening 21s/the drain opening 21d are provided in positions that are across the low-resistance region 16g provided in the second barrier layer 16 and not overlapped with the low-resistance region 16g, namely so as to reach the high-resistance region 16b in the second barrier layer 16. In addition, the gate opening 21g of a shape that allows the low-resistance region 16g to be exposed is provided between the source opening 21s and the drain opening 23s in the insulating film 21. This gate opening 21g ought to have an opening width that allows only the low-resistance region 16g to be exposed at the bottom portion, as one example here.

The source opening 21s, the drain opening 21d and the gate opening 21g above are provided in the insulating film 21 as respective independent opening portions.

[Source Electrode 23s/Drain Electrode 23d]

The source electrode 23s and the drain electrode 23d are in ohmic contact with the high-resistance region 16b of the second barrier layer 16 through the source opening 21s and the drain opening 21d, respectively, in the positions across the low-resistance region 16g. The source electrode 23s and the drain electrode 23d like these are composed of gold-germanium (AuGe), nickel (Ni), and gold (Au) that are layered in series from the second barrier layer 16 side and formed into an alloy. Each of film thicknesses of the source electrode 23s and the drain electrode 23d is, for example, 100 nm.

[Gate Insulating Film 25]

The gate insulating film 25 is provided at the bottom portion of the gate opening 21g formed in the insulating film 21, and may be provided in a state of fully covering the gate opening 21g, with edges thereof layered on the insulating film 21. The gate insulating film 25 like this is composed by using an oxide or a nitride, and is composed of aluminum oxide ($Al_2O_3$) having a thickness of, for example, 10 nm.

[Gate Electrode 27]

The gate electrode 27 is provided above the low-resistance region 16g via the gate insulating film 25. Here, the gate electrode 27 ought to be provided in a state of being embedded in the gate opening 21g, and provided above the low-resistance region 16g in the entire region in the bottom portion of the gate opening 21g. The gate electrode 27 like this is formed of nickel (Ni) and gold (Au) that are layered in this order from the substrate 11 side.

[Energy Band Structure]

FIG. 2 is a band diagram below the gate electrode 27 of the semiconductor apparatus 1-1 configured above, at the time of OFF operation where a gate voltage Vg=0 V or around is applied. Incidentally, this band diagram illustrates a case where the lower barrier layer 13 is composed of the $Al_{0.2}Ga_{0.8}As$ mixed crystal; the channel layer 14 is composed of the $In_{0.2}Ga_{0.8}As$ mixed crystal; the first barrier layer 15 is composed of the $Al_{0.2}Ga_{0.8}As$ mixed crystal; and the second barrier layer 16 is composed of the $Ga_{0.5}In_{0.5}P$ mixed crystal.

As illustrated in FIG. 2, the semiconductor apparatus 1-1 of the first embodiment is of a configuration in which the narrow band gap channel layer 14 is interposed between the lower barrier layer 13 and the first barrier layer 15 that have wider band gaps and lower valence band energies Ev than the channel layer 14. Therefore, when electrons are supplied as the carriers from the carrier supplying regions 13a, 15a of the lower barrier layer 13 and the first barrier layer 15, respectively, the channel layer 14 becomes a two-dimensional electron gas layer where the electrons are accumulated.

In addition, a degree of conduction band discontinuity ΔEc at the hetero junction portion of the channel layer 14 and the first barrier layer 15 is sufficiently large (0.31 eV in this case). Moreover, the semiconductor apparatus 1-1 is configured so that a difference between a minimal point of the conduction band energy Ec in the first barrier layer 15 and the conduction band energy Ec within the channel layer 14 is also sufficiently large (0.20 eV or greater in this case). Therefore, the number of electrons distributed within the first barrier layer 15 is reduced to a negligible degree compared with the number of electrons distributed within the channel layer 14.

Operation of Semiconductor Apparatus of First Embodiment

Figure 4:
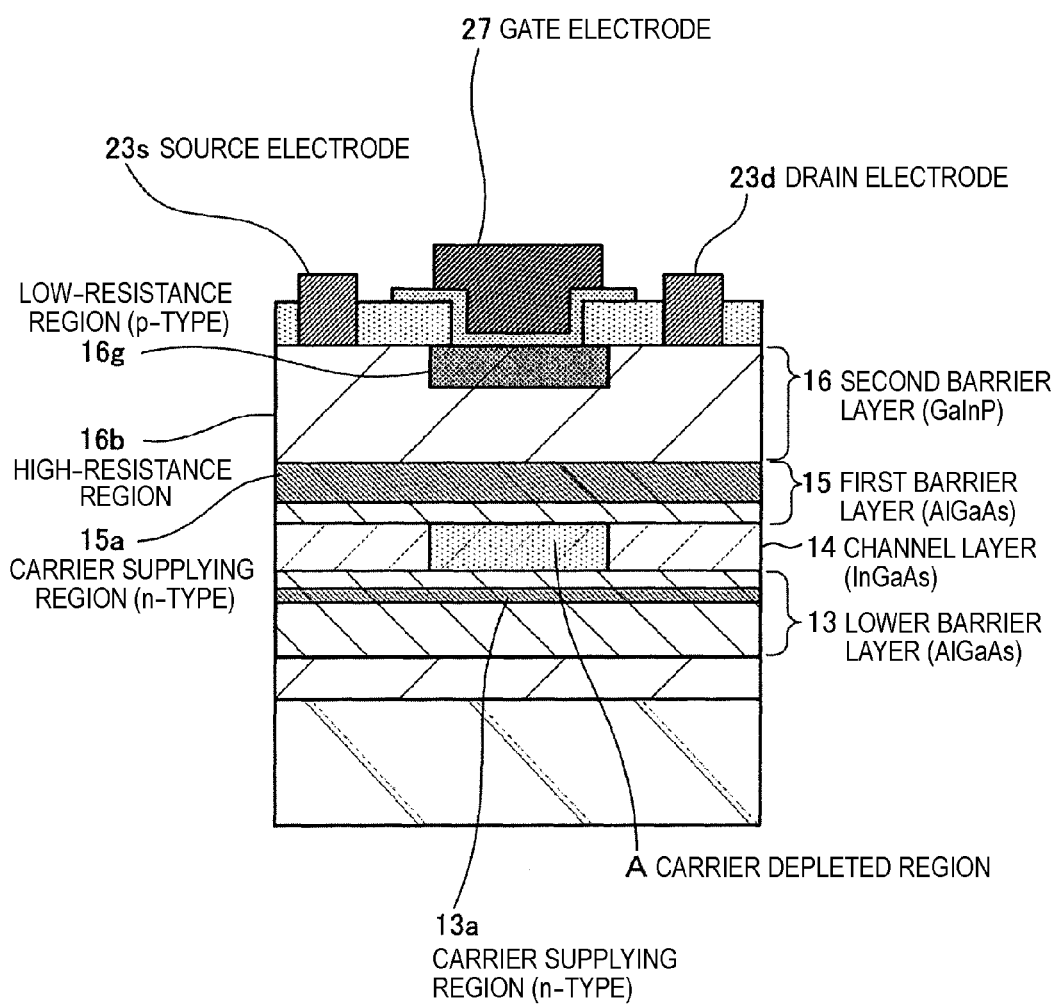
FIG. 4 is a cross-sectional view illustrating a carrier depleted region of the semiconductor apparatus of the first embodiment at the time of OFF operation.

Next, operations of the semiconductor apparatus 1-1 explained using FIG. 1 are explained using a band diagram of FIG. 3 and a cross-sectional view of the semiconductor apparatus 1-1 of FIG. 4, along with FIG. 2.

Incidentally, FIG. 3 is about at the time of ON operation where a gate voltage Vg=3 V or around is applied, in a case where each layer is configured in substantially the same manner as that in FIG. 2.

First, referring to FIG. 1 and FIG. 2, in a state where a gate voltage Vg=0 V or around is applied to the gate electrode 27 in the semiconductor apparatus 1-1, the valence band energy Ev within the p-type low-resistance region 16g below the gate electrode 27 is constant and substantially in agreement with the Fermi level Ef. Incidentally, when the gate voltage Vg is a negative bias, because accumulation of holes occurs at the upper surface of the p-type low-resistance region 16g, the conduction band energy Ec and the valence band energy Ev near the upper surface are lowered. However, a band shape near the channel layer 14 is substantially the same as that in FIG. 2.

In addition in this state, as illustrated in FIG. 4, a carrier depletion region A with the electrons depleted is formed in a region within the channel layer 14 the region being positioned right below the low-resistance region 16g in the semiconductor apparatus 1-1, so that the channel layer 14 becomes highly resistive. With this, substantially no drain current Id flows between the source electrode 23s and the drain electrode 23d through the channel layer 14, which results in an OFF state. Incidentally, the greater a difference between the valence band energy Ev of the carrier supplying region 15a and the valence band energy Ev of the high-resistance region 16b is, the higher the conduction band Ec of the channel layer 14 in the OFF state becomes, so that the drain current can be lowered in the OFF state.

On the other hand, referring to FIG. 1 and FIG. 3, in a state where a positive gate voltage Vg of a gate voltage Vg=3.0 V or around to the gate electrode 27 in the semiconductor apparatus 1-1, the conduction band Ec of the p-type low-resistance region 16g is lowered through the gate insulating film 25. With this, the holes within the low-resistance region 16g are depleted. Then, the carrier depleted region A within the channel layer 14, illustrated in FIG. 4 disappears, and the number of electrons within the channel layer 14 is increased, so that the drain current Id flows between the source electrode 23s and the drain electrode 23d through the channel layer 14. This drain current Id is modulated by the gate voltage Vg.

Manufacturing Method of Semiconductor Apparatus of First Embodiment

Figure 5:
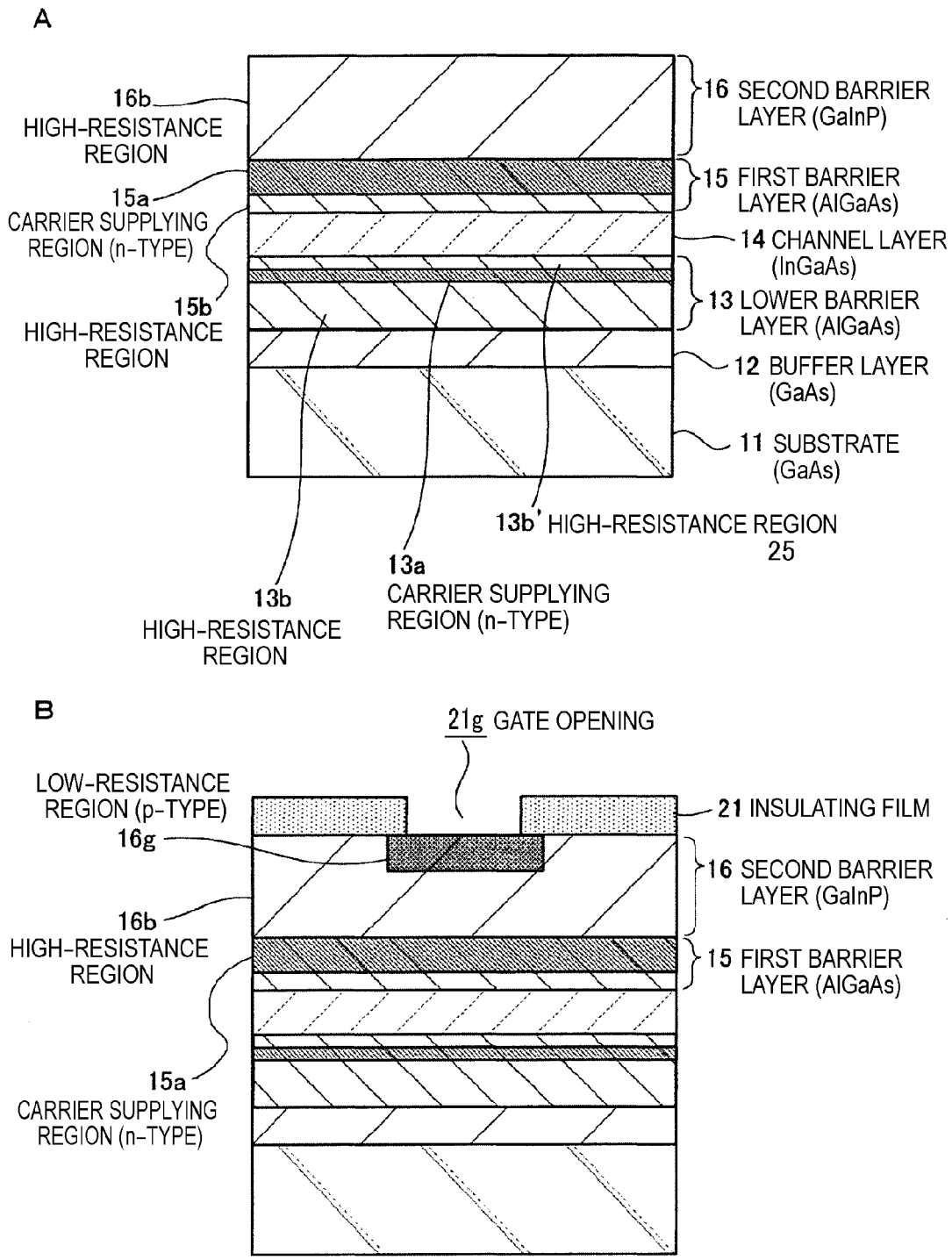
FIG. 5A is a cross-sectional process chart (part 1) illustrating a manufacturing procedure of the semiconductor apparatus of the first embodiment.
FIG. 5B is a cross-sectional process chart (part 1) illustrating the manufacturing procedure of the semiconductor apparatus of the first embodiment.
Figure 6:
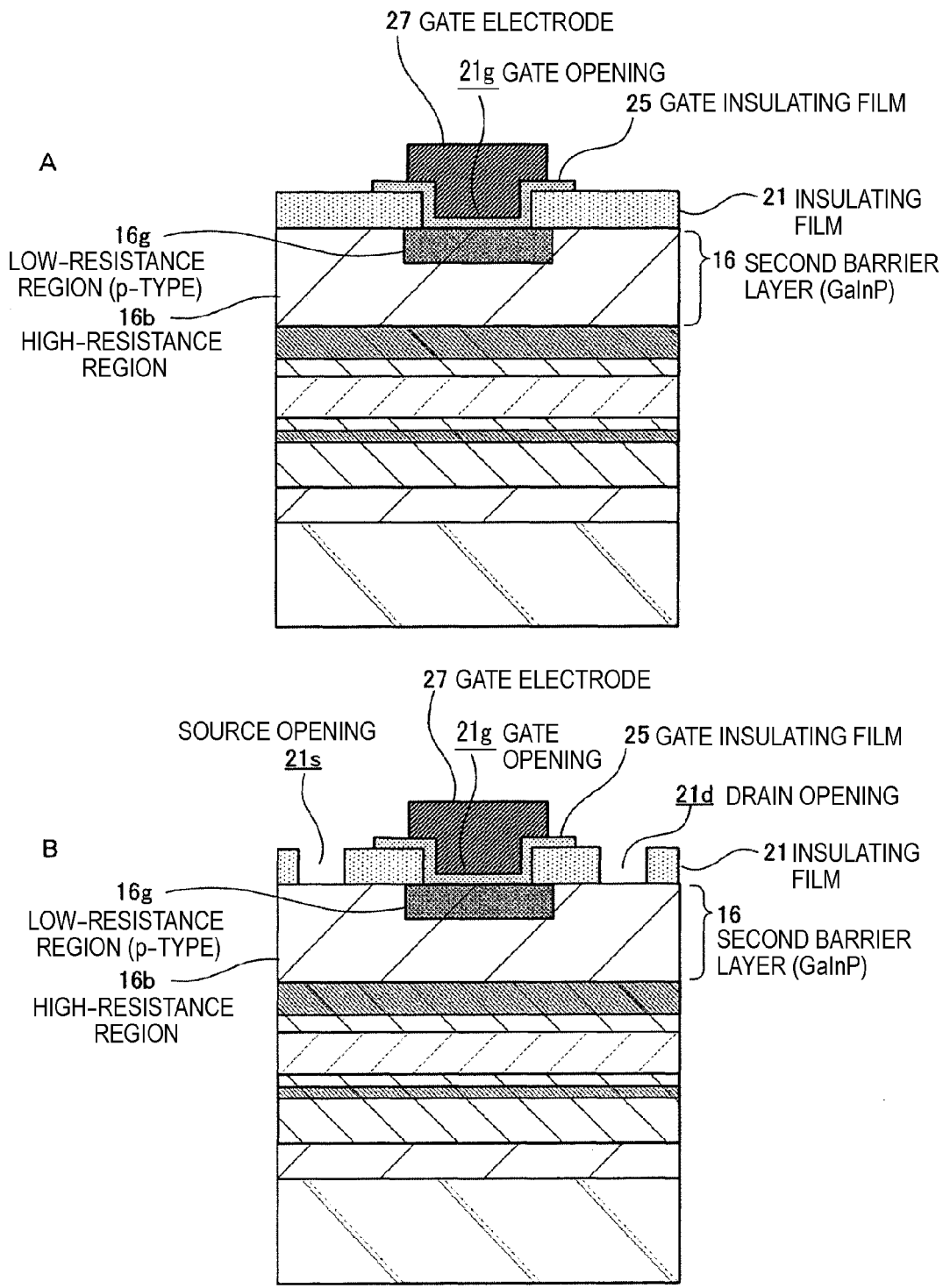
FIG. 6A is a cross-sectional process chart (part 2) illustrating a manufacturing procedure of the semiconductor apparatus of the first embodiment.
FIG. 6B is a cross-sectional process chart (part 2) illustrating the manufacturing procedure of the semiconductor apparatus of the first embodiment.

Next, one example of a manufacturing method of the semiconductor apparatus 1-1 of a configuration described above is explained based on cross-sectional process charts of FIG. 5 and FIG. 6.

[FIG. 5A]

First, as illustrated in FIG. 5A, for example, a u-GaAs layer is epitaxially grown on the substrate 11 composed of, for example, GaAs that is not doped with impurities, thereby to form the buffer layer 12. Then, the AlGaAs ($Al_{0.2}Ga_{0.8}As$ mixed crystal) layer, for example, is epitaxially grown on the buffer layer 12, thereby to form the lower barrier layer 13. At this time, the high-resistance region 13b made of the u-AlGaAs layer that is not doped with impurities, the carrier supplying region 13a made of the n-type AlGaAs layer that is doped with silicon (Si), and the high-resistance region 13b' made of the u-AlGaAs layer that is not doped with impurities are epitaxially grown in series, for example. With this, the lower barrier layer 13 provided with the n-type carrier supplying region 13a in the middle along a film thickness direction is obtained.

Next, for example, the u-InGaAs layer that is not doped with impurities is epitaxially grown on the lower barrier layer 13, thereby to form the channel layer 14.

Then, for example, the AlGaAs ($Al_{0.2}Ga_{0.8}As$ mixed crystal) is epitaxially grown on the channel layer 14, thereby to form the first barrier layer 15. At this time, for example, the high-resistance region 15b made of the u-AlGaAs that is not doped with impurities and the carrier supplying region 15a made of the n-type AlGaAs layer that is doped with silicon (Si) are epitaxially grown in series. With this, the first barrier layer 15 provided with the high-resistance region 15b and the carrier supplying region 15a on the top thereof is obtained.

Subsequently, for example, the GaInP ($Ga_{0.5}In_{0.5}P$ mixed crystal) layer is epitaxially grown on the carrier supplying region 15a, thereby to form the second barrier layer 16 made of the u-GaInP layer that is not doped with impurities. This second barrier layer 16 is formed as the high-resistance region 16b. In addition, with this, the upper barrier layer made of the first barrier layer 15 and the second barrier layer 16 is obtained.

After the above, device isolation of which illustration is omitted here is formed. In this case, deactivated regions that are made highly resistive by ion implantation of, for example, boron is formed, which serves as the device isolation.

[FIG. 5B]

Next, as illustrated in FIG. 5B, the insulating film 21 made of silicon nitride ($Si_3N_4$) is deposited on the second barrier layer 16 by, for example, a chemical vapor deposition (CVD) method. Then, by pattern-etching the insulating film 21, the gate opening 21g that allows the second barrier layer 16 to be exposed is formed in the insulating film 21. In this state, by introducing p-type impurities from the surface layer of the second barrier layer 16 exposed at the bottom portion of the gate opening 21g, the p-type low-resistance region 16g is formed within the second barrier layer 16. Here, zinc (Zn) serving as the p-type impurity is diffused until a position that does not reach the carrier supplying region 15a, or only in the surface layer within the second barrier layer 16, thereby to form the low-resistance region 16g. Diffusion of zinc (Zn) is performed by vapor-phase diffusion using a zinc compound gas at a temperature of, for example, about 600° C. With this, the low-resistance region 16g is formed at the bottom portion of the gate opening 21g in self-alignment.

[FIG. 6A]

Next, as illustrated in FIG. 6A, the gate insulating film 25 is deposited on the insulating film 21 in a state of covering the low-resistance region 16g and an inner wall of the gate opening 21g. Here, the gate insulating film 25 made of aluminum oxide ($Al_2O_3$) having a film thickness of about 10 nm is deposited with a high degree of accuracy by an Atomic Layer Deposition (ALD) method.

Then, the gate electrode 27 of a shape embedded in the gate opening 21g is formed above the low-resistance region 16g via the gate insulating film 25. At this time, nickel (Ni) and gold (Au) are vapor-deposited on the gate insulating film 25 in series by using a mask, thereby to pattern-form the gate electrode 27.

[FIG. 6B]

Next, as illustrate in FIG. 6B, by pattern-etching the gate insulating film 25 and the insulating film 21, the source opening 21s and the drain opening 21d that allow the high-resistance region 16b of the second barrier layer 16 to be exposed are formed in corresponding positions across the low-resistance region 16g.

[FIG. 1]

After that, as illustrated in FIG. 1, the source electrode 23s and the drain electrode 23d are formed which are in ohmic contact with the high-resistance region 16b of the second barrier layer 16 through the source opening 21s and the drain opening 21d, respectively. At this time, gold-germanium (AuGe), nickel (Ni), and gold (Au) are vapor-deposited in series, patterned, and formed into a gold group alloy by a heat treatment at, for example, about 400° C., thereby to form the source electrode 23s and the drain electrode 23d, so that the semiconductor apparatus 1-1 is completed.

By the manufacturing method explained above, the semiconductor apparatus 1-1 of the first embodiment can be formed. According to this method, after the low-resistance region 16g is formed by diffusing the p-type impurities through the gate opening 21g formed in the insulating film 21, the gate electrode 27 is formed in a state of being embedded in the gate opening 21g via the gate insulating film 25. Therefore, the gate electrode 27 is formed above the low-resistance region 16g in self-alignment with respect to the low-resistance region 16g. Accordingly, the semiconductor apparatus 1-1 of the first embodiment can be obtained with ease.

Incidentally, the gate opening 21g, the gate insulating film 25, and the gate electrode 27 may be formed after the source opening 21s/the drain opening 21d and the source electrode 23s/the drain electrode 23d are formed. Even in this case, because the gate electrode 27 is formed in self-alignment with respect to the low-resistance region 16g via the gate insulating film 25, the semiconductor apparatus 1-1 of the first embodiment can be obtained with ease.

Effects of Semiconductor Apparatus of First Embodiment

As for the semiconductor apparatus 1-1 explained above, in a configuration where the p-type low-resistance region 16g is provided within the n-type high-resistance region 16b that is not doped with impurities or that has a low concentration, the gate electrode 27 is provided on top of this via the gate insulating film 25. Therefore, even when a forward voltage (positive voltage in this case) is applied to the gate electrode 27, a gate leakage current is prevented from flowing between the gate electrode 27 and the source electrode 23s/the drain electrode 23d. With this, a higher positive gate voltage Vg can be applied to the gate electrode 27, compared with a semiconductor apparatus (JPHEMT) in the past where the gate insulating film 25 is not provided. As a result, an ON resistance Ron of the channel layer 14 can be further lowered, thereby to seek an improvement of a maximum drain current Idmax. In addition, with this, a finer element size becomes possible, and a reduction of parasitic capacity with respect to the device can be sought.

In addition, this semiconductor apparatus 1-1 is of a configuration in which the n-type carrier supplying region 13a is provided within the lower barrier layer 13, and, furthermore, the n-type carrier supplying region 15a is provided within the first barrier layer 15. Therefore, because the electrons are supplied from these carrier supplying regions 13a, 15a to the channel layer 14, a sheet carrier density within the channel layer 14 becomes increased, and the channel resistance can be reduced. Also with this, a reduction of the ON resistance Ron and an improvement of the maximum drain current Idmax can be sought.

And specifically, the upper barrier layer provided with the low-resistance region 16g is a multi-layer structure of the first barrier layer 15 on the channel layer 14 side and the second barrier layer 16 on the top thereof. In this multi-layer structure, the valence band energy Ev of the second barrier layer 16 is designed to be lower than the valence band energy Ev of the first barrier layer 15 at the junction portion of the second barrier layer 16 and the first barrier layer 15. With this, the conduction band energy Ec of the channel layer 14 is brought upward in a direction drawing away from the Fermi level Ef by an extent of a band gap of the channel layer 14, as explained using the band diagram of FIG. 2. Incidentally, in the band diagram of FIG. 2, a case where the upper barrier layer provided in contact with the channel layer 14 is a single layer made of AlGaAs is indicated as a comparative example by a two-dot chain line.

Namely, as illustrated in the band diagram of FIG. 2, when the gate electrode 27 is in an OFF voltage state, the valence band energy Ev of the low-resistance region 16g in contact with the gate insulating film 25 is substantially in agreement with the Fermi level Ef. Here, the valence band energy Ev of the second barrier layer 16 that constitutes the low-resistance region 16g is lower than the valence band energy Ev of the first barrier layer 15 at the junction portion with respect to the first barrier layer 15. Therefore, at the hetero junction portion of the second barrier layer 16 and the first barrier layer 15, the valence band energy Ev of the first barrier layer 15 is in a state of being brought upward to the Fermi level Ef side than the valence band energy Ev of the second barrier layer 16. In addition, also in the channel layer 14 that forms a hetero junction with the first barrier layer 15, the valence band energy Ev is in a state of being brought upward to the Fermi level Ef side. Due to this influence, the conduction band energy Ec of the channel layer 14 is brought upward in the direction drawing away from the Fermi level Ef, while maintaining the band gap of the channel layer 14.

With this, an energy difference ΔE between the Fermi level Ef and the conduction band energy Ec in the channel layer 14 becomes larger than an energy difference ΔE0 in the comparative example indicated by the two-dot chain line in the drawing.

As above, in the semiconductor apparatus having the configuration of this first embodiment, it becomes difficult for the electrons to exist in the conduction band of the channel layer 14 in the OFF state, compared with the comparative example, so that an off-leakage current can be reduced.

Figure 7:
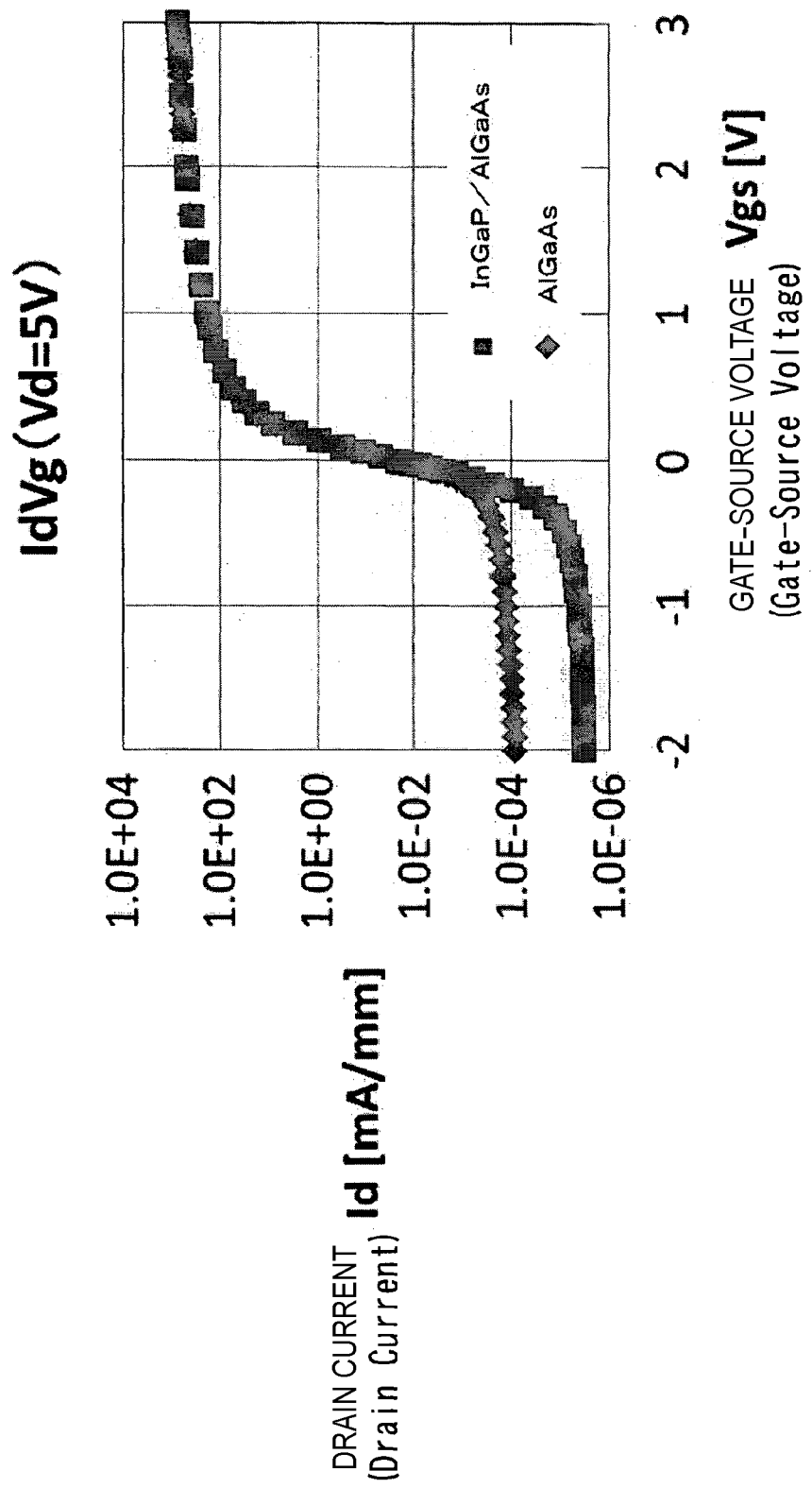
FIG. 7 is a graph of a gate voltage—a drain current, illustrating effects of the first embodiment.

FIG. 7 illustrates a gate voltage-drain current graph regarding the semiconductor apparatus having the configuration of this first embodiment (InGaP/AlGaAs) and the comparative example explained above where the upper barrier layer is configured of a single layer (AlGaAs). As illustrated in this graph, it is understood that at the time of OFF where the gate voltage is negative the drain current of the semiconductor apparatus of this first embodiment (InGaP/AlGaAs) is reduced by nearly two orders of magnitude than that of the comparative example (AlGaAs).

In addition, in the semiconductor apparatus of a configuration of this first embodiment, because a reduction of such an off-leakage current is sought, the n-type impurity concentration can be increased in a region (the high-resistance region 16b) that is in contact with the p-type low-resistance region 16g.

Figure 8:
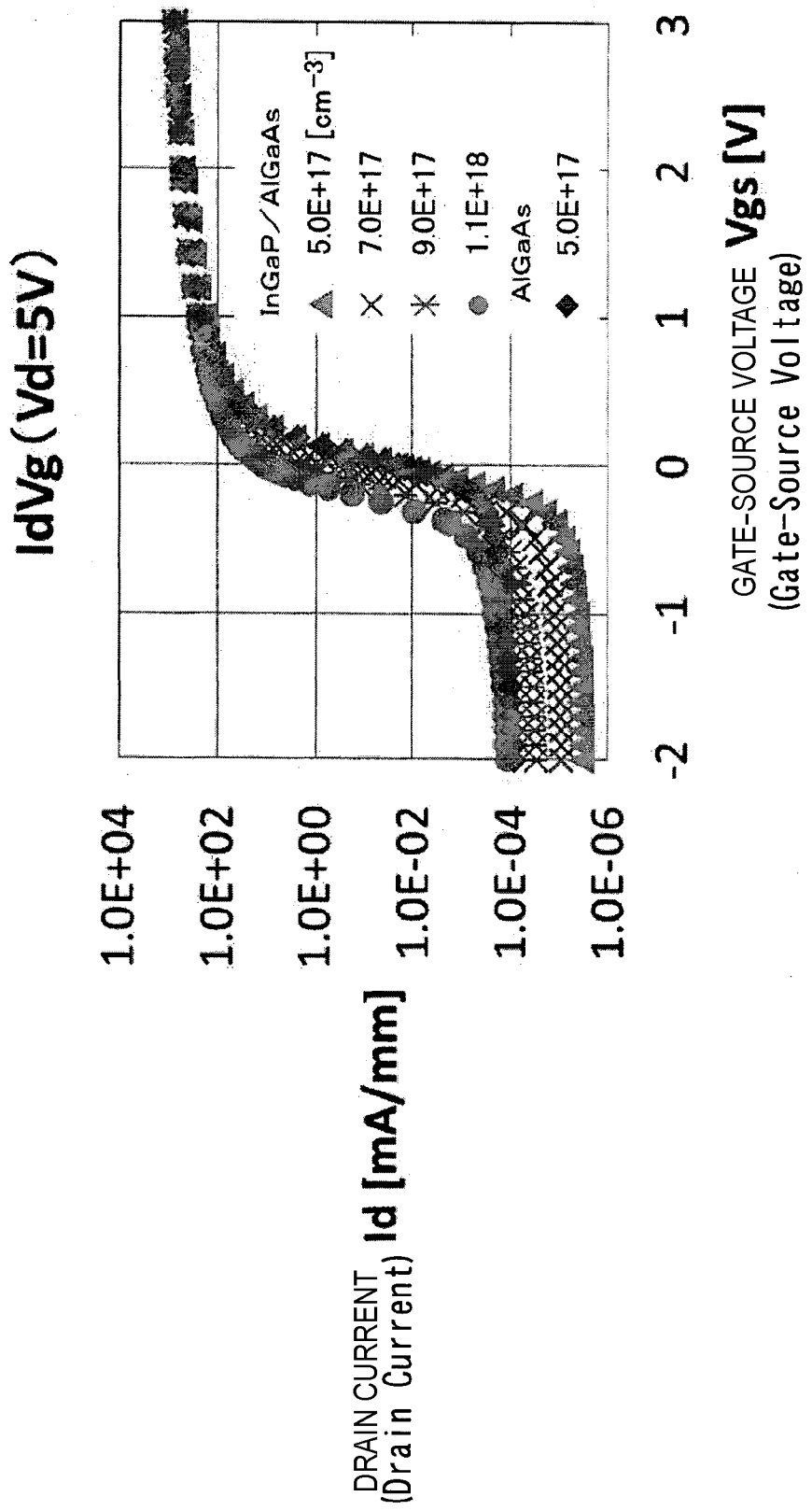
FIG. 8 is a graph of the gate voltage—the drain current in each case of various impurity concentrations of a high-resistance region in a structure of the first embodiment.

FIG. 8 illustrates a gate voltage-drain current graph regarding the semiconductor apparatuses of this first embodiment (InGaP/AlGaAs) in case of various n-type impurity concentrations in the high-resistance region 16b and the comparative example explained above where the upper barrier layer is configured of the single layer (AlGaAs). As illustrated in this graph, it is understood that even when the n-type impurity concentration of the high-resistance region 16b is increased to about $1.1E18$ $(cm^{-3})$, the OFF current can be suppressed at substantially the same level as a case where the n-type impurity concentration of the high-resistance region 16b is $5E17$ $(cm^{-3})$ in the comparative example (AlGaAs).

As above, in the semiconductor apparatus of this first embodiment, because the impurity concentration of the opposite conduction type in the region in contact with the low-resistance region 16g can be increased, the sheet carrier density of the channel layer 14 can be increased, thereby to lower the channel resistance and the access resistance. As a result, the resistance in the ON state (the ON resistance Ron) can be reduced. Also with this, effects can be expected which seek an improvement of the maximum drain current Idmax, a finer element size, and a reduction of the parasitic capacitance with respect to this element.

In addition, the effects as above are realized by using as a constituent material of the second barrier layer 16 the compound semiconductor (for example, InGaP) that has a wider band gap than the InGaAs used as the compound semiconductor layer that constitutes the channel layer 14, while a switchover from As to P at the time of epitaxial growth is necessary because the V group element is different.

Moreover, in the OFF operation where a negative voltage is applied to the gate electrode 27, the electric field caused from the applied negative voltage is applied entirely to the gate insulating film 25. Therefore, there are no changes in the depletion layer within the layers composed of the compound semiconductors on the substrate 11 side from the second barrier layer 16 including the low-resistance region 16g. Namely, there is scarcely a gate bias dependency of the capacitance at the time of OFF, thereby to seek an improvement of higher harmonic distortion characteristics.

Incidentally, while in the first embodiment above, the semiconductor apparatus 1-1 is explained as a depletion type, substantially the same can be conceived even in the case of the enhancement type, and the above explanations hold very true.

2. Second Embodiment

Figure 9:
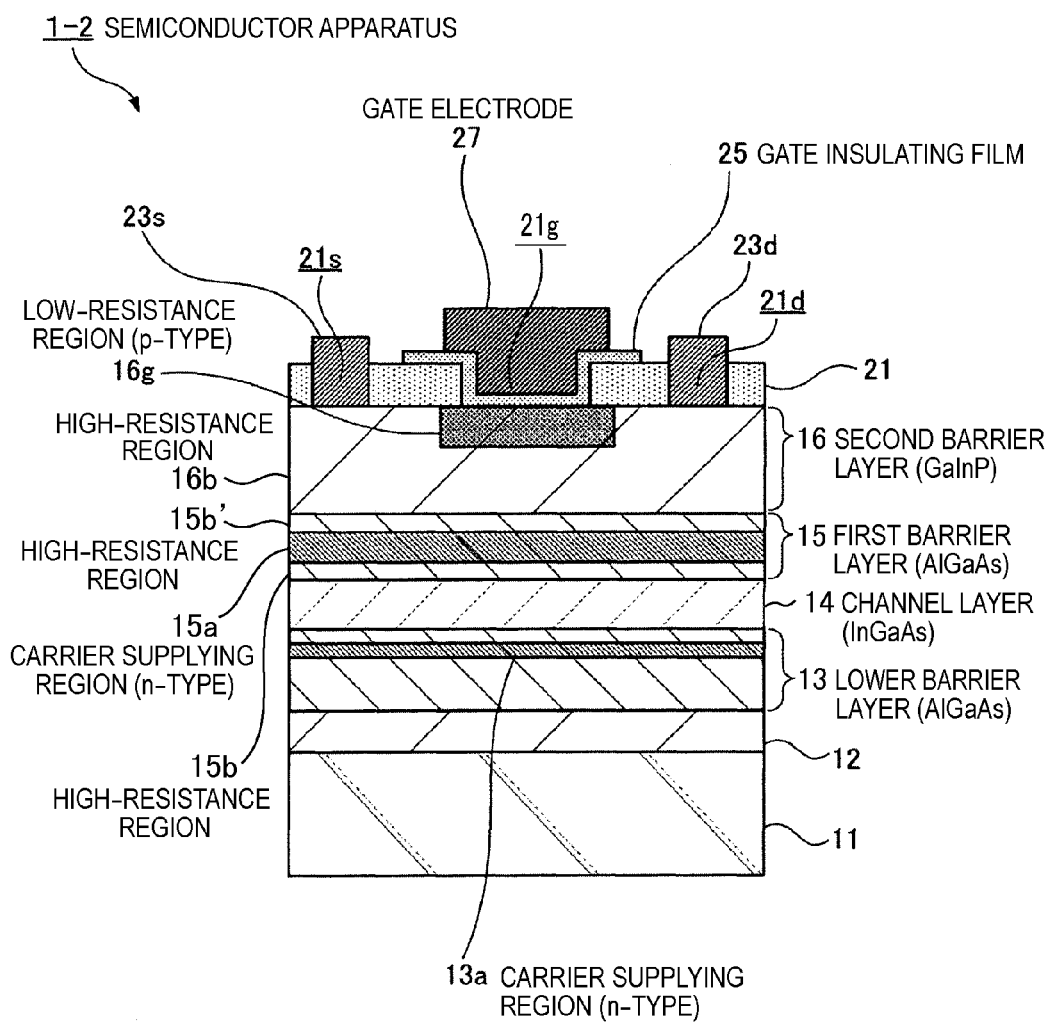
FIG. 9 is a cross-sectional view of a semiconductor apparatus of a second embodiment.
Figure 10:
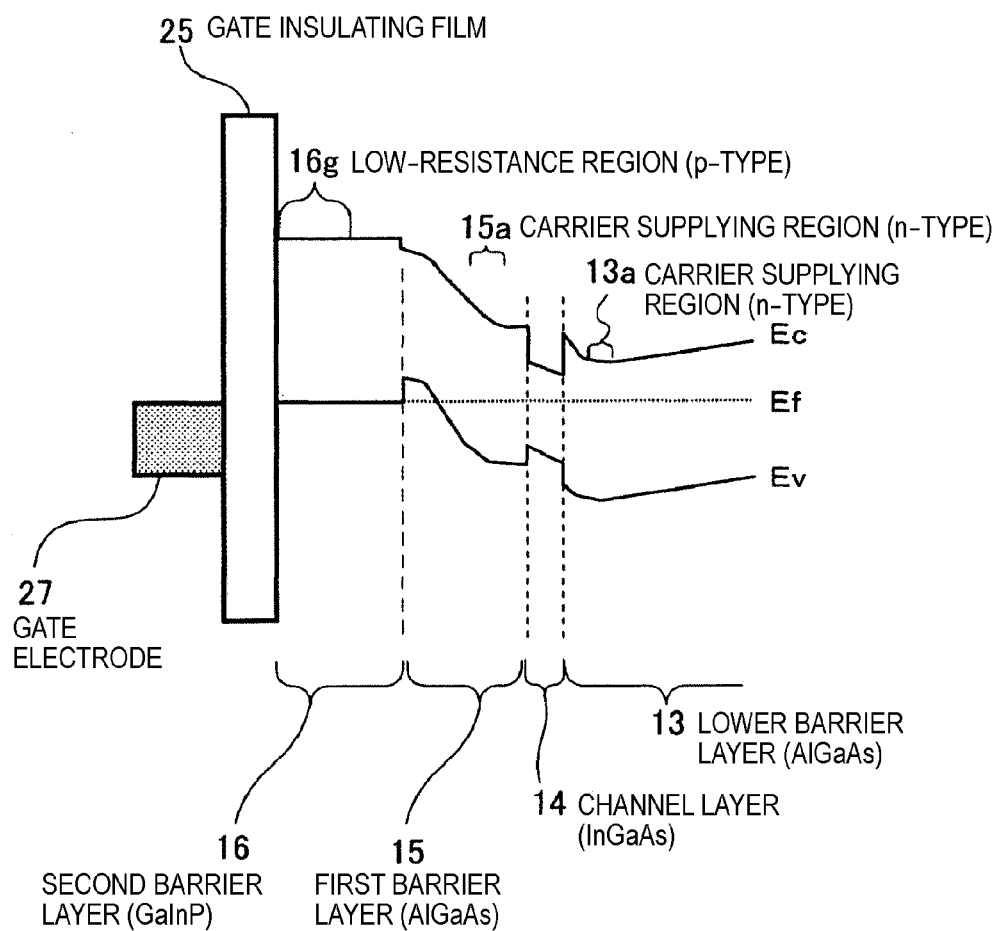
FIG. 10 is an energy band diagram of the semiconductor apparatus of the second embodiment at the time of OFF operation.

An Example where the Carrier Supplying Region is Provided in the Middle of the First Barrier Layer FIG. 9 is a cross-sectional view illustrating a principal configuration of a semiconductor apparatus of a second embodiment; and FIG. 10 is an energy band diagram explaining operations of the semiconductor apparatus of the second embodiment. In the following, explanations are made based on these drawings in order of a configuration of the semiconductor apparatus of the second embodiment, operations of the semiconductor apparatus of the second embodiment, working effects of the semiconductor apparatus of the second embodiment, to which the present technique is applied.

Configuration of Semiconductor Apparatus of Second Embodiment

As illustrated in FIG. 9, a difference between a semiconductor apparatus 1-2 of this second embodiment and the semiconductor apparatus of the first embodiment explained using FIG. 1 exists where the carrier supplying region 15a provided in the first barrier layer 15 is in the middle portion along a film thickness direction, and the other configurations are substantially the same. Therefore, the same reference signs are given to the same constituting elements as those in the first embodiment, and detailed explanations are omitted in this embodiment.

[First Barrier Layer 15]

Namely, the first barrier layer 15 is substantially the same as the first barrier layer in the first embodiment, composed of a III-V compound semiconductor material that is favorably lattice-matched to the channel layer 14 and has a higher conduction band energy Ec than the compound semiconductor material that constitutes the channel layer 14, and forms a hetero junction with the channel layer 14.

In the first barrier layer 15 like this, high-resistance regions 15b, 15b' that are disposed across the carrier supplying region 15a may be formed independently as the high-resistance region 15b that is not doped with impurities or contains impurities at a low concentration. When containing impurities, these high-resistance regions 15b, 15b' contain n-type impurities or p-type impurities. In this case, it is preferable that an impurity concentration is $1\times10^{17}$ cm$^{-3}$ or lower and a specific resistance is $1\times10^{-2}$ Ωcm or greater.

One example of a specific configuration of the first barrier layer 15 as above is the following. The first barrier layer 15 has a film thickness of about 8 nm, and is composed of the high-resistance region 15b that has a film thickness of about 2 nm and does not contain impurities, the carrier supplying region 15a that has a film thickness of about 4 nm and contains silicon (Si) at $1.6\times10^{12}$ cm$^{-2}$, and the high-resistance region 15b' that has a film thickness of about 2 nm and does not contain impurities, which are layered in series from the channel layer 14 side.

Incidentally, this first barrier layer 15 may be composed so that only a layer in the side in contact with the second barrier layer 16 is the high-resistance region 15b' and a layer in the side in contact with the channel layer 14 is the carrier supplying region.

[Second Barrier Layer 16]

Even in the configuration where the carrier supplying region 15a is provided in the middle of the first barrier layer 15 as above, substantially the same configuration as the first embodiment is applied to the second barrier layer 16 on top of this first barrier layer 15. Namely, the second barrier layer 16 is favorably lattice-matched to the first barrier layer 15 and forms the hetero junction with the first barrier layer 15. In addition, specifically, it is characteristic in that this second barrier layer 16 is composed of a III-V compound semiconductor material whose valence band energy Ev is lower than that of the compound semiconductor material that constitutes the first barrier layer 15. The greater a difference between the valence band energies Ev of the second barrier layer 16 and the first barrier layer 15 becomes, the better the second barrier layer 16 like this is.

[Low-Resistance Region 16g]

In addition, the low-resistance region 16g, to which substantially the same configuration as that in the first embodiment is applied, is provided so as to have a clearance with respect to the carrier supplying region 15a. Therefore, in this second embodiment, the low-resistance region 16g may be disposed at depth extending from the second barrier layer 16 through the high-resistance region 15b' of the first barrier layer 15, or may reach the carrier supplying region 15a of the first barrier layer 15.

[Band Structure]

FIG. 10 is an energy band diagram of the semiconductor apparatus 1-2 of the above configuration, at the time of OFF operation where a gate voltage Vg=0 V or around is applied. Incidentally, this energy band diagram illustrates a case where the lower barrier layer 13 and the first barrier layer 15 are each composed of the $Al_{0.2}Ga_{0.8}As$ mixed crystal; the second upper barrier layer is composed of the $Ga_{0.5}In_{0.5}P$ mixed crystal; and the channel layer 14 is composed of the $In_{0.2}Ga_{0.8}As$ mixed crystal.

As illustrated in FIG. 10, the semiconductor apparatus 1-2 of the above configuration is of a configuration in which the narrow band gap channel layer 14 is interposed between the lower barrier layer 13 and the first barrier layer 15 that have wider band gaps and lower valence band energies Ev than the channel layer 14, as is the case with the semiconductor apparatus of the first embodiment. Therefore, when carriers are supplied from the carrier supplying regions 13a, 15a of the lower barrier layer 13 and the first barrier layer 15, respectively, the channel layer 14 becomes a two-dimensional electron gas layer where the carriers are accumulated.

In addition, a degree of conduction band discontinuity ΔEc at the hetero junction portion of the channel layer 14 and the first barrier layer 15 is sufficiently large (0.31 eV in this case). Moreover, the semiconductor apparatus 1-2 is configured so that a difference between a minimal point of the conduction band energy Ec in the first barrier layer 15 and the conduction band energy Ec within the channel layer 14 is also sufficiently large (0.20 eV or greater in this case). Therefore, the number of electrons distributed within the first barrier layer 15 is reduced to a negligible degree, compared with the number of electrons distributed within the channel layer 14.

Operation of Semiconductor Apparatus of Second Embodiment

The semiconductor apparatus 1-2 having the configuration like this operates in substantially the same manner as the semiconductor apparatus of the first embodiment.

Manufacturing Method of Semiconductor Apparatus of Second Embodiment

In manufacture of the semiconductor apparatus 1-2 having the configuration like this, only a process of epitaxially growing the high-resistance region 15b, the carrier supplying region 15a, and the high-resistance region 15b' in series is different when forming the first barrier layer 15 in the manufacturing procedures of the semiconductor apparatus of the first embodiment. In addition, while the low-resistance region 16g is formed by diffusing zinc (Zn) as the p-type impurity to the second barrier layer made of, for example, the GaInP mixed crystal, the p-type impurities may be diffused so as to reach the carrier supplying region 15a of the first barrier layer 15 made of the AlGaAs mixed crystal.

Effects of Semiconductor Apparatus of Second Embodiment

The semiconductor apparatus 1-2 explained above is of a configuration in which the second barrier layer 16 whose valence band energy Ev is lower than that of the first barrier layer 15 is provided above the channel layer 14 via the first barrier layer 15, and the gate electrode 27 is provided above the p-type low-resistance region 16g that is provided in the surface layer of the second barrier layer 16 via the gate insulating film 25, as is the case with the first embodiment. Therefore, substantially the same effects as those of the first embodiment can be obtained.

3. Third Embodiment

Figure 11:
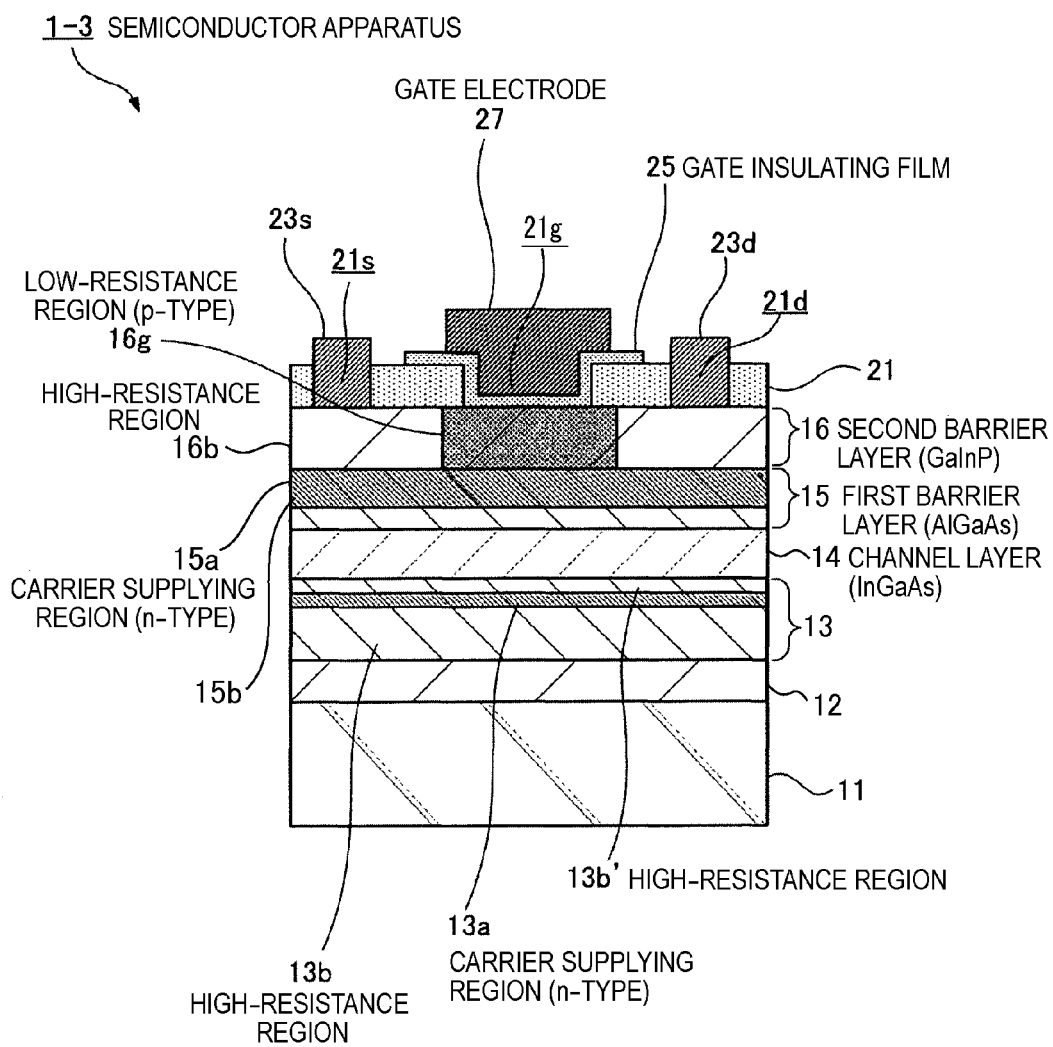
FIG. 11 is a cross-sectional view illustrating a principal configuration of a semiconductor apparatus of a third embodiment.

An Example where the Carrier Supplying Region and the Low-Resistance Region are Bonded FIG. 11 is a cross-sectional view illustrating a principal configuration of a semiconductor apparatus of a third embodiment. In the following, a configuration of the semiconductor apparatus of the third embodiment to which the present technique is applied is explained based on the drawing.

Configuration of Semiconductor Apparatus of Third Embodiment

A difference between a semiconductor apparatus 1-3 of this third embodiment illustrated in FIG. 11 and the semiconductor apparatus of the first embodiment explained using FIG. 1 exists where the p-type low-resistance region 16g provided in the second barrier layer 16 is disposed in contact with the carrier supplying region 15a of the first barrier layer 15. The other configurations are substantially the same as those of the first embodiment. Therefore, the same reference signs are given to the same constituting elements as those in the first embodiment, and detailed explanations are omitted in this embodiment.

Namely, a depth of the p-type low-resistance region 16g provided in the second barrier layer 16 is in agreement with a film thickness of the second barrier layer 16. And the p-type low-resistance region 16g is provided in contact with the n-type carrier supplying region 15a that is provided in the first barrier layer 15 and contains the n-type impurities.

Operations and Manufacturing Method of Semiconductor Apparatus of Third Embodiment The semiconductor apparatus 1-3 having the configuration like this operates in substantially the same manner as the semiconductor apparatus of the first embodiment. In addition, in manufacture of this semiconductor apparatus 1-3, it suffices that when depositing the second barrier layer 16 in the manufacturing procedures of the semiconductor apparatus of the first embodiment, the second barrier layer 16 is formed at a film thickness that matches the depth of the p-type low-resistance region 16g that is formed later. In addition, when the p-type low-resistance region 16g is formed, the p-type impurities are introduced into the second barrier layer 16 so as to reach the carrier supplying region 15a of the first barrier layer 15.

Effects of Semiconductor Apparatus of Third Embodiment

The semiconductor apparatus 1-3 explained above is of a configuration in which the second barrier layer 16 whose valence band energy Ev is lower than that of the first barrier layer 15 is provided above the channel layer 14 via the first barrier layer 15, and the gate electrode 27 is provided above the p-type low-resistance region 16g provided in the surface layer of the second barrier layer 16 via the gate insulating film 25, as is the case with the first embodiment. Therefore, substantially the same effects as those of the first embodiment can be obtained.

In addition to this, as for the semiconductor apparatus 1-3 of the third embodiment, effects can be obtained which are caused by providing the p-type low-resistance region 16g in contact with the carrier supplying region 15a. Namely, because the semiconductor apparatus 1-3 is of a configuration in which the p-type low-resistance region 16g is provided in contact with the carrier supplying region 15a, a distance between the p-type low-resistance region 16g and the channel layer 14 can be shortened. With this, it is possible to enhance controllability of potential within the channel layer 14 by a gate voltage. Also with this, it is expected to seek an improvement of the maximum drain current Idmax, a finer element size, and a reduction of a parasitic capacitance with respect to this element. Moreover, because a clearance from the low-resistance region 16g to the channel layer 14 can be narrowed, a threshold voltage can be set at a relatively high value.

Moreover, under conditions where the impurity concentration in the carrier supplying region 15a is relatively high compared with that in the p-type low-resistance region 16g, zinc diffused into the carrier supplying region 15a can be negated by the impurities within the carrier supplying region 15a. Therefore, the depth of the p-type low-resistance region 16g formed by diffusing the p-type impurities such as zinc (Zn) and the film thickness of the second barrier layer 16 can be identical. With this, the depth of the p-type low-resistance region 16g is controlled with a high degree of accuracy by the film thickness of the second barrier layer 16, so that the low-resistance region 16g can be highly accurately formed to be thin. In addition, this also makes it possible to shorten a distance between the p-type low-resistance region 16g and the channel layer 14, thereby to enhance controllability of potential within the channel layer 14 by a gate voltage.

Incidentally, in this third embodiment, the configuration has been explained in which the p-type low-resistance region 16g is disposed in contact with the carrier supplying region 15a in the configuration explained using FIG. 1 in the first embodiment. However, this third embodiment is not limited to application to the first embodiment, but is combined with the second embodiment. In this case, in the configuration in the second embodiment explained using FIG. 9, the p-type low-resistance region 16g provided in the second barrier layer 16 is provided in contact with the carrier supplying region 15a within the first barrier layer 15. Even in such a configuration, the depth of the p-type low-resistance region 16g is controlled with a high degree of accuracy by the film thicknesses of the second barrier layer 16 and the high-resistance region 15b' in the first barrier layer 15, and thus the low-resistance region 16g can be highly accurately formed to be thin.

4. Fourth Embodiment

Figure 12:
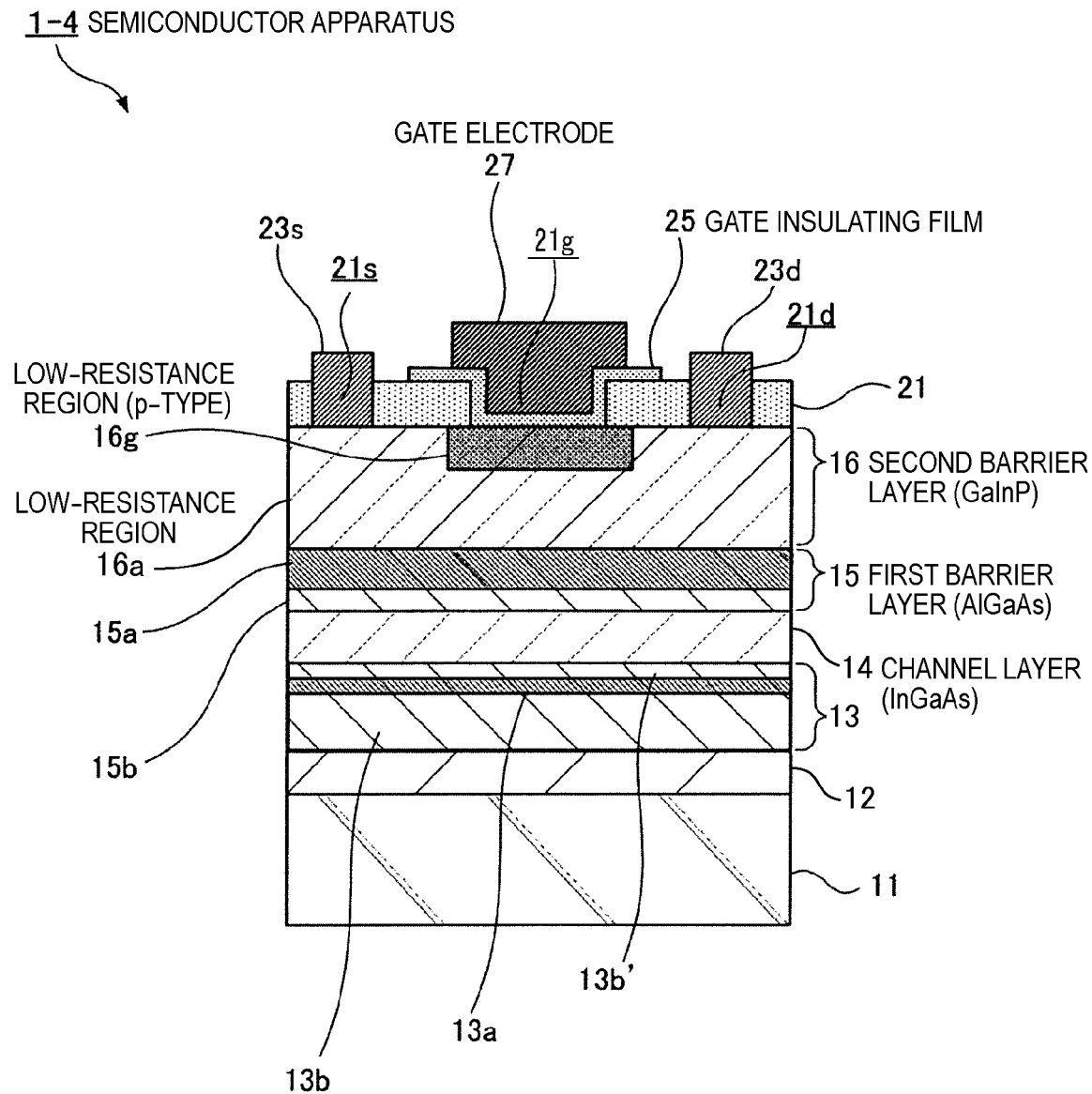
FIG. 12 is a cross-sectional view illustrating a principal configuration of a semiconductor apparatus of a fourth embodiment.

An Example where the Second Barrier Layer Surrounding the Low-Resistance Region is Low-Resistive FIG. 12 is a cross-sectional view illustrating a principal configuration of a semiconductor apparatus of a fourth embodiment. In the following, a configuration of the semiconductor apparatus of the fourth embodiment to which the present technique is applied is explained based on this drawing.

Configuration of Semiconductor Apparatus of Fourth Embodiment

A difference between a semiconductor apparatus 1-4 of this fourth embodiment illustrated in FIG. 12 and the semiconductor apparatus of the first embodiment explained using FIG. 1 exists where a surrounding part of the p-type low-resistance region 16g in the second barrier layer 16 is composed of a low-resistance region 16a in the place of the high-resistance region, and the other configurations are substantially the same as those of the first embodiment. Therefore, the same reference signs are given to the same constituting elements as those in the first embodiment, and detailed explanations are omitted in this embodiment.

Namely, the p-type low-resistance region 16g provided at the surface layer in the second barrier layer 16 is surrounded by the n-type low-resistance region 16a that contains n-type impurities. In other words, the p-type low-resistance region 16g is provided in a surface layer of the second barrier layer 16 composed entirely as the n-type low-resistance region 16a. The n-type low-resistance region 16a like this may be continuous with the n-type carrier supplying region 15a in the first barrier layer 15.

Operations and Manufacturing Method of Semiconductor Apparatus of Fourth Embodiment The semiconductor apparatus 1-4 having the configuration like this operates in substantially the same manner as the semiconductor apparatus of the first embodiment. In addition, it suffices that in manufacture of this semiconductor apparatus 1-4, the low-resistance region 16a that contains the n-type impurities as the second barrier layer 16 is epitaxially grown in the manufacturing procedures of the semiconductor apparatus of the first embodiment, and the p-type impurities are introduced into the surface layer, thereby to form the low-resistance region 16g.

Effects of Semiconductor Apparatus of Fourth Embodiment

The semiconductor apparatus 1-4 explained above is of a configuration in which the second barrier layer 16 whose valence band energy Ev is lower than that of the first barrier layer 15 is provided above the channel layer 14 via the first barrier layer 15, and the gate electrode 27 is provided above the p-type low-resistance region 16g provided in the surface layer of the second barrier layer 16 via the gate insulating film 25, as is the case with the first embodiment. Therefore, substantially the same effects as those of the first embodiment can be obtained.

In addition to the above, specifically, because the semiconductor apparatus 1-4 of this fourth embodiment is of a configuration in which the p-type low-resistance region 16g is provided within the n-type low-resistance region 16a, a sheet carrier density in the channel layer 14 can be increased, thereby to lower the channel resistance and the access resistance. As a result, as explained in the first embodiment also using FIG. 8, effects can be expected which reduce the ON resistance Ron and, furthermore, increase the maximum drain current Idmax.

Incidentally, in this fourth embodiment, the highly resistive region of the second barrier layer 16 that surrounds the p-type low-resistance region 16g in the configuration explained using FIG. 1 in the first embodiment is modified into the n-type low-resistance region 16a. However, this fourth embodiment is not limited to application to the first embodiment, but may be combined with the second to the third embodiments. In these cases, it suffices that in the second to the third embodiments, the region surrounding the p-type low-resistance region 16g is made to be the low-resistance region of the opposite conduction type (n-type). With this, substantially the same effects as those of the fourth embodiment, combined with the effects of the second to the third embodiments, are further obtained.

5. Fifth Embodiment

Figure 13:
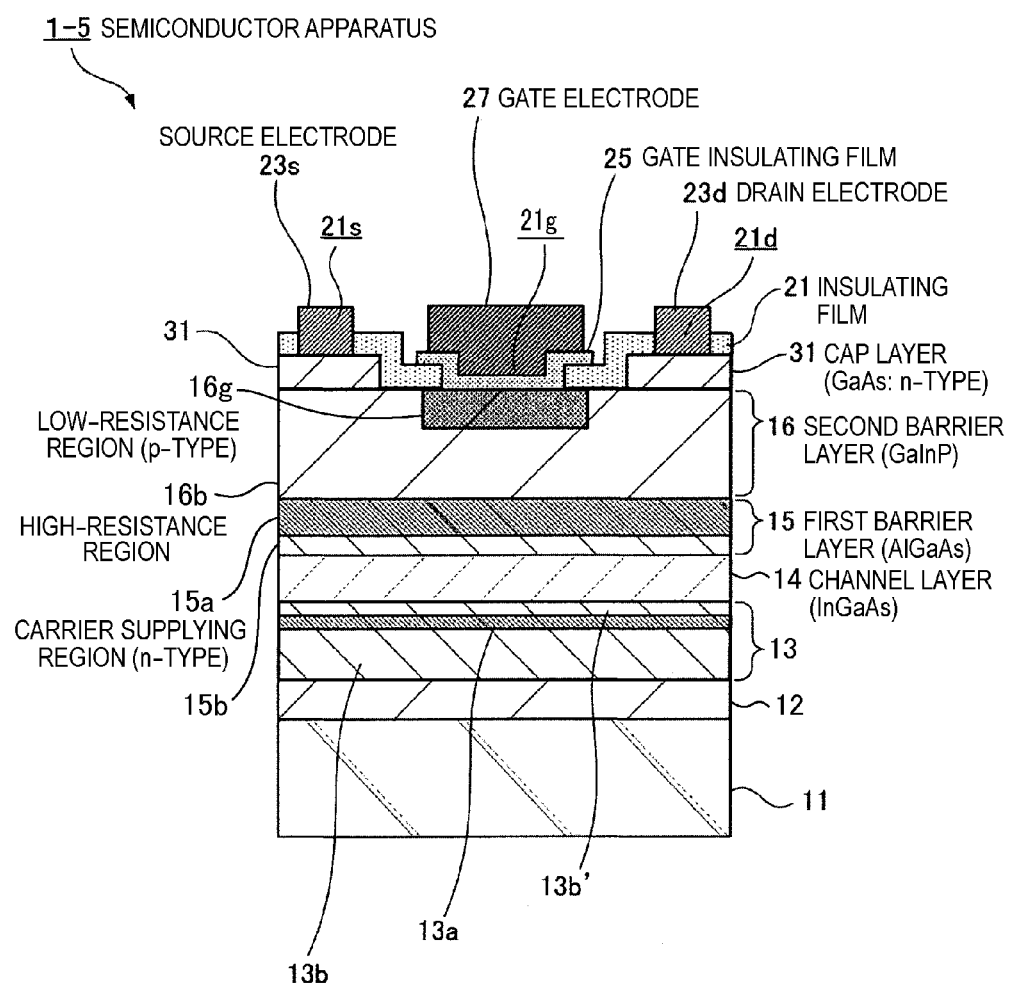
FIG. 13 is a cross-sectional view illustrating a principal configuration of a semiconductor apparatus of a fifth embodiment.

An Example where a Cap Layer is Provided Between the Second Barrier Layer and the Source Electrode and the Drain Electrode FIG. 13 is a cross-sectional view illustrating a principal configuration of a semiconductor apparatus of a fifth embodiment. In the following, a configuration of the semiconductor apparatus of the fifth embodiment to which the present technique is applied is explained based on this drawing.

Configuration of Semiconductor Apparatus of Fifth Embodiment

A difference between a semiconductor apparatus 1-5 of this fifth embodiment illustrated in FIG. 13 and the semiconductor apparatus of the first embodiment explained using FIG. 1 exists where a cap layer 31 is provided between the second barrier layer 16 and the source electrode 23s/the drain electrode 23d. The cap layer 31 is provided as a layer that contains an opposite conduction type impurity to that in the low-resistance region 16g. The other configurations are substantially the same as those of the first embodiment. Therefore, the same reference signs are given to the same constituting elements as those in the first embodiment, and detailed explanations are omitted in this embodiment.

The cap layer 31 is provided as a layer that contains the opposite conduction type impurity (n-type impurity in this case) to that in the low-resistance region 16g between the source electrode 23s/the drain electrode 23d and the second barrier layer 16 that constitutes the upper barrier layer. It suffices that the cap layer 31 like this is composed of a compound semiconductor material that is lattice-matched to the second barrier layer 16, and the band gap is not necessarily in agreement with that of the second barrier layer 16. However, when the band gaps are extremely different, because a potential barrier is caused at the junction portion, a resistance in ohmic contact may be increased. Therefore, the band gap of the cap layer 31 ought to be in agreement with the band gap of the second barrier layer 16 serving as the underlying layer within a range that does not influence the characteristics of the semiconductor apparatus 1-5.

The cap layer 31 as above ought to be composed of GaAs containing, for example, n-type impurities, when the second barrier layer 16 is made of the GaInP mixed crystal.

Operations and Manufacturing Method of Semiconductor Apparatus of Fifth Embodiment The semiconductor apparatus 1-5 having the configuration like this operates in substantially the same manner as the semiconductor apparatus of the first embodiment. In addition, in manufacture of this semiconductor apparatus 1-5, a process of epitaxially growing the n-type GaAs layer that turns out to be the cap layer 31 is performed subsequently to a film deposition of the second barrier layer 16 in the manufacturing procedures of the semiconductor apparatus of the first embodiment. In addition, it suffices that after deactivated regions that are made highly resistive by ion implantation of boron is formed for device isolation, the n-type GaAs layer is pattern-etched, thereby to form the cap layer 31, and next a film deposition of the insulating film 21 and the subsequent processes are performed.

Effects of Semiconductor Apparatus of Fifth Embodiment

The semiconductor apparatus 1-5 explained above is of a configuration in which the second barrier layer 16 whose valence band energy Ev is lower than that of the first barrier layer 15 is provided above the channel layer 14 via the first barrier layer 15, and the gate electrode 27 is provided above the p-type low-resistance region 16g provided in the surface layer of the second barrier layer 16 via the gate insulating film 25, as is the case with the first embodiment. Therefore, substantially the same effects as those of the first embodiment can be obtained.

In addition to the above, specifically, the semiconductor apparatus 1-5 of the fifth embodiment is of a configuration in which the cap layer 31 made of the compound semiconductor is provided between the source electrode 23s/the drain electrode 23d and the second barrier layer 16. Therefore, a sheet carrier density in the channel layer 14 immediately below the cap layer 31 can be increased, thereby to lower the channel resistance and the access resistance. As a result, effects can be expected which lower the ON resistance Ron and, furthermore, increase the maximum drain current Idmax.

Incidentally, in this fifth embodiment, the configuration has been explained in which the cap layer 31 is provided between the source electrode 23s/the drain electrode 23d and the second barrier layer 16 as a layer that contains the opposite conduction type impurity to that in the low-resistance region 16g, in the configuration explained using FIG. 1 in the first embodiment. However, this fifth embodiment is not limited to application to the first embodiment, but may be combined with the second to the fourth embodiments. In these cases, it suffices that the cap layer 31 is provided between the second barrier layer and the source electrode 23s/the drain electrode 23d in the second to the fourth embodiments as a layer that contains the n-type impurity, which is the opposite conduction type to that in the p-type low-resistance region 16g. With this, substantially the same effects as those of the fifth embodiment, combined with the effects of the second to the fourth embodiments, are further obtained.

6. Sixth Embodiment

Figure 14:
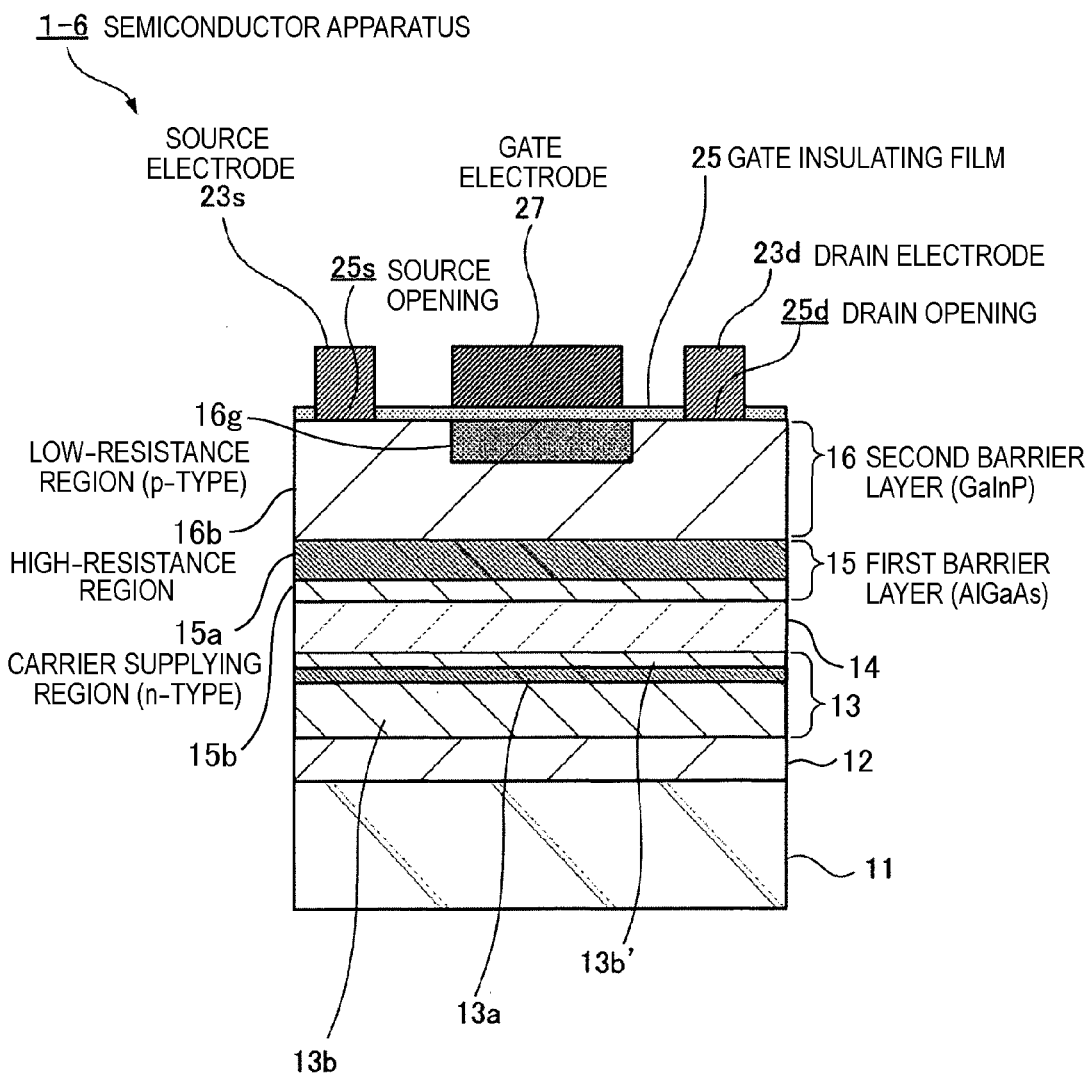
FIG. 14 is a cross-sectional view illustrating a principal configuration of a semiconductor apparatus of a sixth embodiment.

An Example where the Entire Surface of the Second Barrier Layer is Covered by the Gate Insulating Film FIG. 14 is a cross-sectional view illustrating a principal configuration of a semiconductor apparatus of a sixth embodiment. In the following, a configuration of the semiconductor apparatus of the sixth embodiment to which the present technique is applied is explained based on this drawing.

Configuration of Semiconductor Apparatus of Sixth Embodiment

Differences between a semiconductor apparatus 1-6 of this sixth embodiment illustrated in FIG. 14 and the semiconductor apparatus of the first embodiment explained using FIG. 1 exist where the entire upper surface of the second barrier layer 16 is covered by the gate insulating film 25, and the underlying insulating film (21) is removed; and the other configurations are substantially the same as those of the first embodiment. Therefore, the same reference signs are given to the same constituting elements as those in the first embodiment, and detailed explanations are omitted in this embodiment.

Namely, the entire upper surface of the second barrier layer 16 is covered by the gate insulating film 25. With respect to this gate insulating film 25, a source opening 25s/a drain opening 25d that reach the high-resistance region 16b of the second barrier layer 16 are provided in corresponding positions across the low-resistance region 16g provided in the second barrier layer 16 and in positions not overlapped with the low-resistance region 16g. On top of the second barrier layer 16, the source electrode 23s and the drain electrode 23d are provided which are connected to the high-resistance region 16b of the second barrier layer 16 through the source opening 25s and the drain opening 25d, respectively.

Operations of Semiconductor Apparatus of Sixth Embodiment

The semiconductor apparatus 1-6 having the configuration like this operates in substantially the same manner as the semiconductor apparatus of the first embodiment.

Manufacturing Method of Semiconductor Apparatus of Sixth Embodiment

Figure 15:
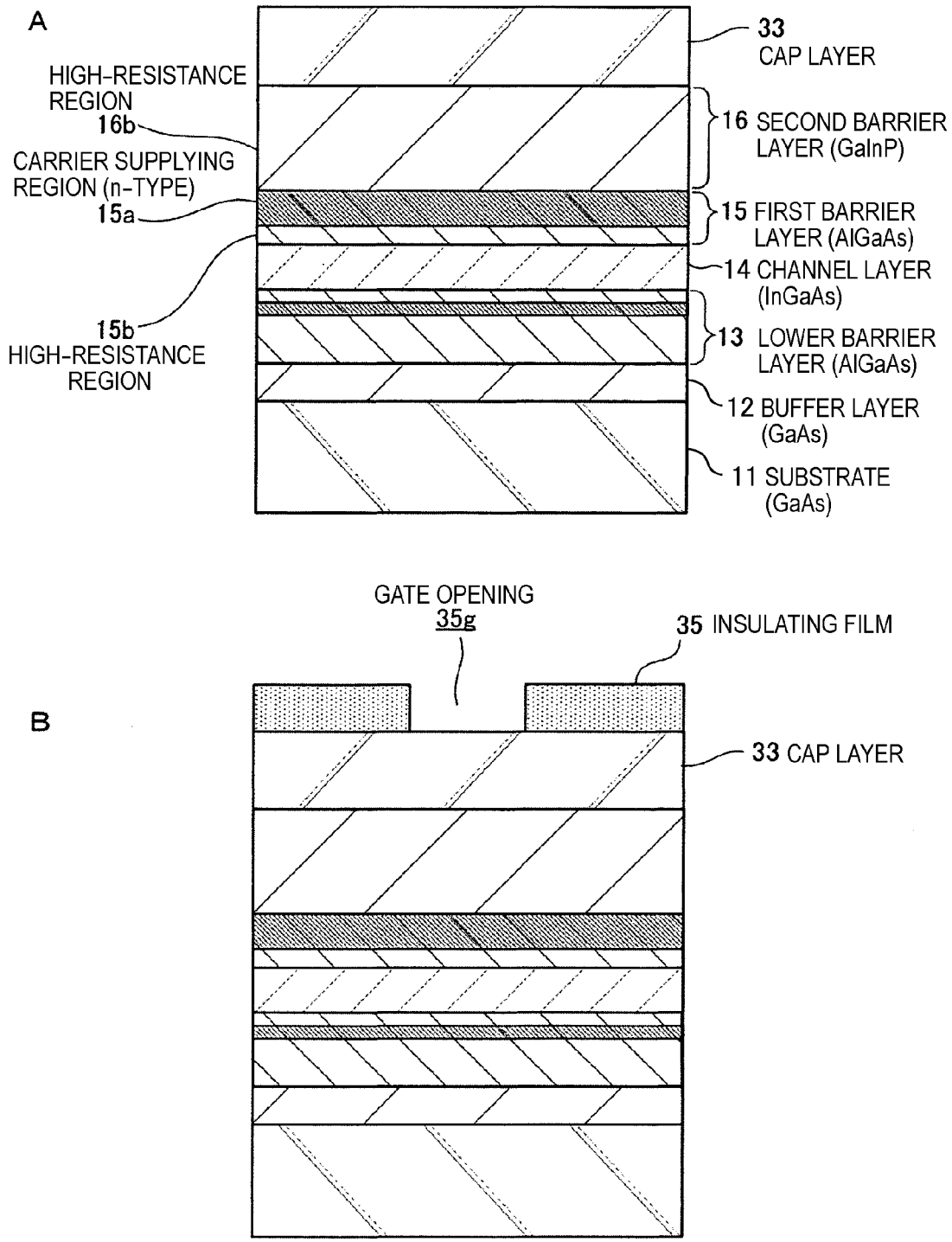
FIG. 15A is a cross-sectional process chart (part 1) illustrating a manufacturing procedure of the semiconductor apparatus of the sixth embodiment.
FIG. 15B is a cross-sectional process chart (part 1) illustrating the manufacturing procedure of the semiconductor apparatus of the sixth embodiment.
Figure 16:
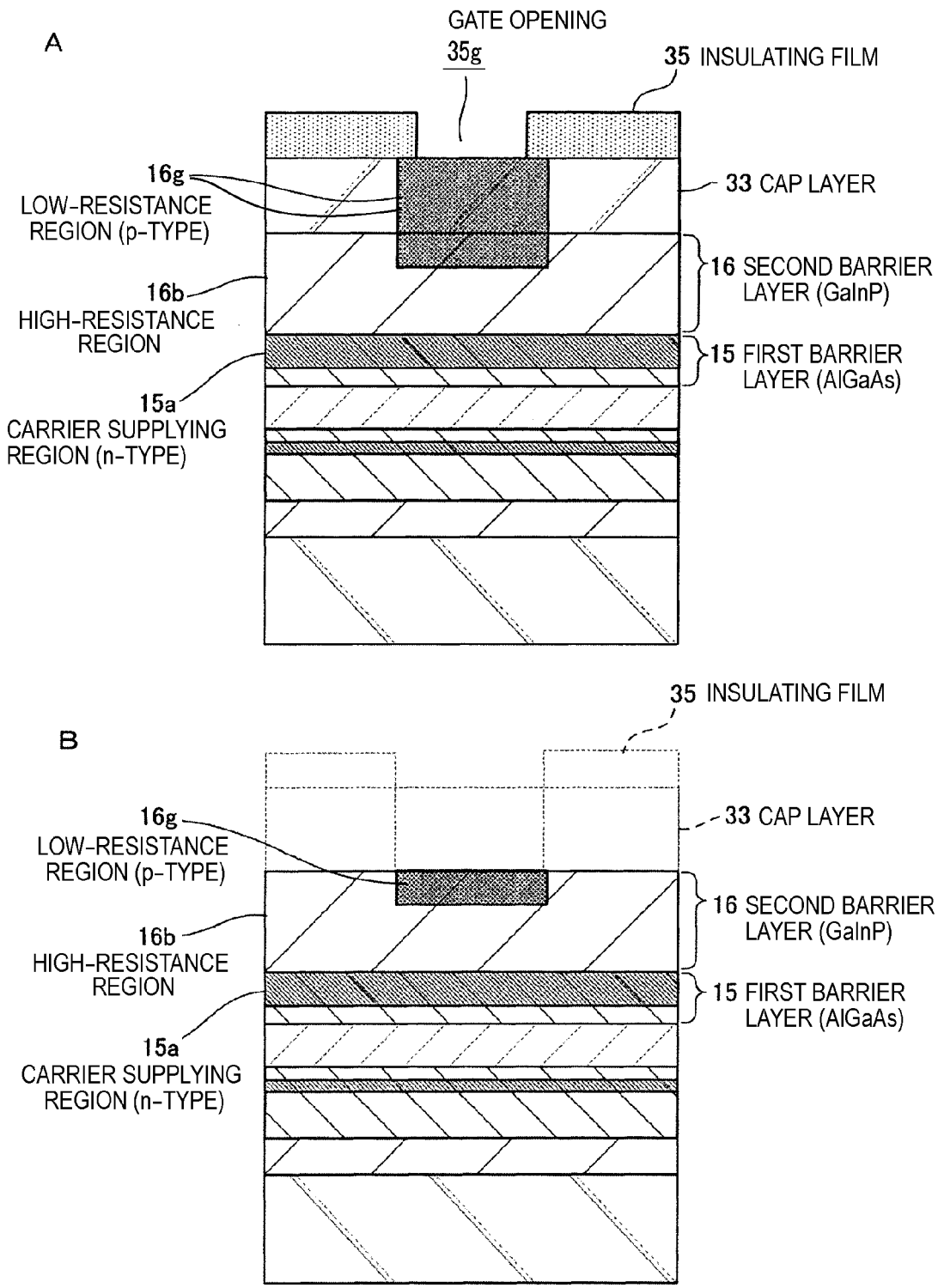
FIG. 16A is a cross-sectional process chart (part 2) illustrating a manufacturing procedure of the semiconductor apparatus of the sixth embodiment.
FIG. 16B is a cross-sectional process chart (part 2) illustrating the manufacturing procedure of the semiconductor apparatus of the sixth embodiment

Next, one example of a manufacturing method of the semiconductor apparatus 1-7 of the configuration described above is explained based on cross-sectional process charts of FIG. 15 and FIG. 16.

[FIG. 15A]

First, as illustrated in FIG. 15A, the buffer layer 12, the lower barrier layer 13, the channel layer 14, and the upper barrier layer composed of the first barrier layer 15 and the second barrier layer 16 are epitaxially grown in this order on the substrate 11, by substantially the same procedures explained using FIG. 5A in the first embodiment. Next, device isolation, of which illustration is omitted here, is performed.

Then, a cap layer 33 made of GaAs is epitaxially grown on the second barrier 16.

[FIG. 15B]

Next, as illustrated in FIG. 15B, an insulating film 35 is deposited on the cap layer 33, and the insulating film 35 is pattern-etched, thereby to form a gate opening 35g that allows the upper surface of the cap layer 33 to be exposed, in the insulating film 35.

[FIG. 16A]

Next, as illustrated in FIG. 16A, by introducing the p-type impurities from the upper surface of the cap layer 33 exposed at the bottom portion of the gate opening 35g, the low-resistance region 16b that reaches from the cap layer 33 to the surface layer of the high-resistance region 16b of the second barrier 16 is formed. Here, zinc (Zn) serving as the p-type impurity is diffused until a position that does not reach the carrier supplying region 15a within the first barrier layer 15, or only in the surface layer within the second barrier layer 16, thereby to form the low-resistance region 16g. Diffusion of zinc (Zn) is performed by vapor-phase diffusion using a zinc compound gas at a temperature of, for example, about 600° C.

[FIG. 16B]

Then, as illustrated in FIG. 16B, the insulating film 35 and the cap layer 33 are etched off, leaving the second barrier layer 16 where the low-resistance region 16g with the p-type impurities introduced is formed.

After the above, as illustrated in FIG. 14, the gate insulating film 25 is deposited on top of the second barrier layer 16 where the low-resistance region 16g is formed. Next, the source opening 25s/the drain opening 25d are formed in corresponding positions across the low-resistance region 16g in the gate insulating film 25, and, furthermore, the source electrode 23s/the drain electrode 23d are formed which are connected to the high-resistance region 16b of the second barrier layer 16 through the source opening 25s/the drain opening 25d, respectively. In addition, on top of the gate insulating film 25, the gate electrode 27 is formed in a position overlapped above the low-resistance region 16g.

Effects of Semiconductor Apparatus of Sixth Embodiment

The semiconductor apparatus 1-6 explained above is of a configuration in which the second barrier layer 16 whose valence band energy Ev is lower than that of the first barrier layer 15 is provided above the channel layer 14 via the first barrier layer 15, and the gate electrode 27 is provided above the p-type low-resistance region 16g provided in the surface layer of the second barrier layer 16 via the gate insulating film 25, as is the case with the first embodiment. Therefore, substantially the same effects as those of the first embodiment can be obtained.

In addition, specifically in the manufacturing method of this sixth embodiment, as explained using FIG. 16A, when the low-resistance region 16g is formed in the second barrier layer 16, zinc (Zn) serving as the p-type impurity is diffused into the second barrier layer 16 through the cap layer 33. Therefore, a diffusion depth of the p-type impurities in the second barrier layer 16 can be reduced, and thus it becomes easy for the low-resistance region 16g formed by diffusing the p-type impurities to be formed shallow. Namely, it becomes possible to form the extremely shallow low-resistance region 16g by the above method, while it is difficult to form an extremely shallow impurity region of about 20 nm or less by a forming method of the low-resistance region 16g where a direct diffusion is performed upon the second barrier layer 16 without through the cap layer 33.

Incidentally, in this sixth embodiment, the configuration has been explained in which the underlying insulating film (21) is removed and the entire upper surface of the second barrier layer 16 is covered by the gate insulating film 25 in the configuration explained using FIG. 1 in the first embodiment. However, this sixth embodiment has the configuration where the underlying insulating film (21) is removed and the entire upper surface of the second barrier layer 16 is covered by the gate insulating film 25 in the configurations explained in the second to the fifth embodiments.

In addition, the manufacturing method explained in this sixth embodiment can be applied to the manufacture of the semiconductor apparatus of a configuration in which the insulating film 21 is provided separately from the gate insulating film 25 as explained in the first to the fifth embodiments.

In a manufacturing method when applied to the first to the fourth embodiments, the low-resistance region 16g is formed and the cap layer 33 is removed as illustrated in FIG. 16B. Then, it suffices to perform procedures of forming the insulating film 21 provided with the gate opening 21g in substantially the same manner as explained using FIG. 5B and, furthermore, forming the gate insulating film 25 in a state of covering the insulating film 21, according to which substantially the same effects can be obtained.

Figure 18:
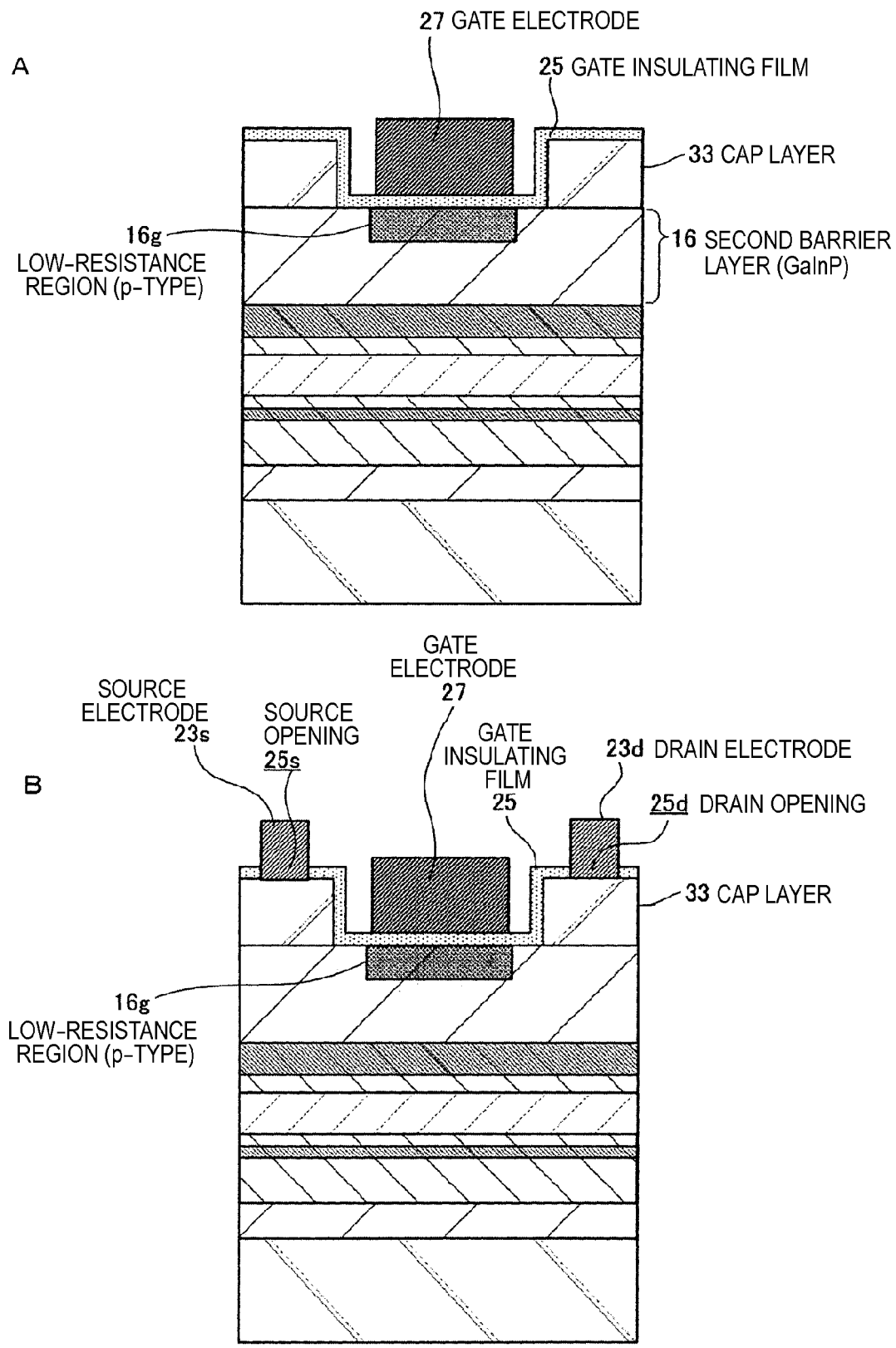
FIG. 18A is a cross-sectional process chart (part 2) illustrating the manufacturing procedure when the sixth embodiment is combined with the fifth embodiment.
FIG. 18B is a cross-sectional process chart (part 2) illustrating the manufacturing procedure when the sixth embodiment is combined with the fifth embodiment.

In addition, when applied to the fifth embodiment, after the low-resistance region 16g is formed as illustrated in FIG. 16A, the cap layer 33 is isotropically etched using the insulating film 35 as a mask as illustrated in FIG. 17A. With this, the low-resistance region 16g formed in the cap layer 33 is fully removed, and, furthermore, the low-resistance region 16g formed in the second barrier layer 16 is made exposed. Next, as illustrated in FIG. 17B, the insulating film 35 on the cap layer 33 is removed. Then, as illustrated in FIG. 18A, the gate insulating film 25 is formed in a state of covering the cap layer 33 and the second barrier layer 16, and, furthermore, the gate electrode 27 is formed above the low-resistance region 16g via the gate insulating film 25. Then, as illustrated in FIG. 18B, the source opening 25s/the drain opening 25d are formed in the gate insulating film 25, and the source electrode 23s/the drain electrode 23d that are connected to the cap layer 33 through the source opening 25s/the drain opening 25d, respectively, are formed aside of the gate electrode 27. With this, substantially the same effects as those of the manufacturing method of the sixth embodiment can be obtained. Incidentally, the cap layer 33 has substantially the same configuration as the cap layer 31 (see FIG. 13) explained in the fifth embodiment.

7. Seventh Embodiment

An Example where the Low-Resistance Region is Covered by the Gate Electrode

Figure 19:
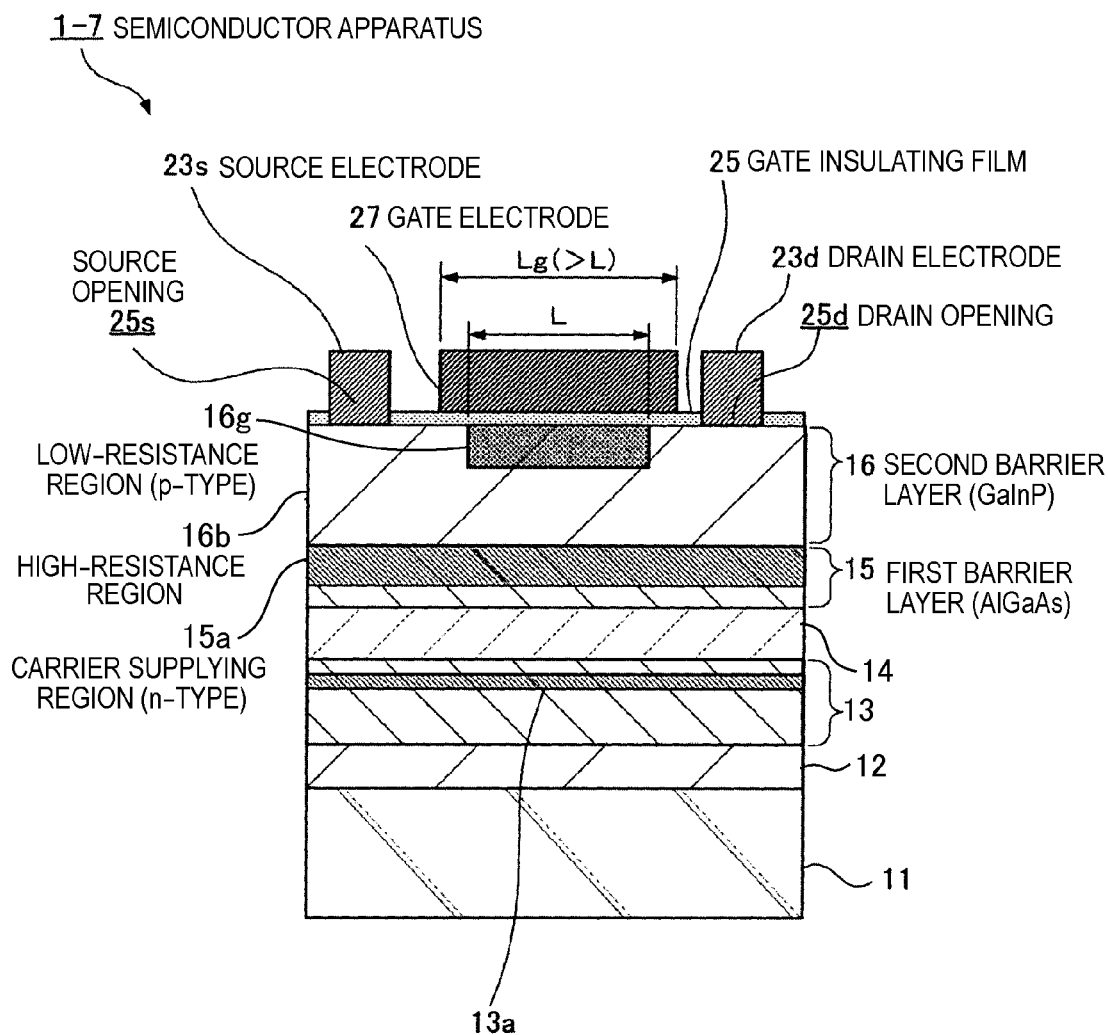
FIG. 19 is a cross-sectional view illustrating a principal configuration of a semiconductor apparatus of a seventh embodiment.

FIG. 19 is a cross-sectional view illustrating a principal configuration of a semiconductor apparatus of a seventh embodiment. In the following, a configuration of the semiconductor apparatus of the seventh embodiment to which the present technique is applied is explained based on this drawing.

Configuration of Semiconductor Apparatus of Seventh Embodiment

Differences between a semiconductor apparatus 1-7 of this seventh embodiment illustrated in FIG. 19 and the semiconductor apparatus of the first embodiment explained using FIG. 1 exist where the entire upper surface of the second barrier layer 16 is covered by the gate insulating film 25, and the underlying insulating film (21) is removed, and exist in a gate length Lg of the gate electrode 27. The other configurations are substantially the same as those of the first embodiment. Therefore, the same reference signs are given to the same constituting elements as those in the first embodiment, and detailed explanations are omitted in this embodiment.

Namely, the entire upper surface of the second barrier layer 16 is covered by the gate insulating film 25. With respect to this gate insulating film 25, the source opening 25s/the drain opening 25d that reach the high-resistance region 16b in the second barrier layer 16 are provided in corresponding positions across the low-resistance region 16g provided in the second barrier layer 16, and in positions not overlapped with the low-resistance region 16g. On top of the second barrier layer 16, the source electrode 23s and the drain electrode 23d are provided which are connected to the high-resistance region 16b through the source opening 25s and the drain opening 25d, respectively. The configurations until here are substantially the same as those of the sixth embodiment.

This seventh embodiment is characteristic in that the gate electrode 27 has a shape that fully covers over the low-resistance region 16g. In this gate electrode 27, a length in a direction of the source electrode 23s—the drain electrode 23d, namely the gate length Lg is set to be longer than a length L of the low-resistance region 16g. With this, the gate electrode 27 has the shape that fully covers over the low-resistance region 16g. Here, the gate length Lg of the gate electrode 27 is specifically a length of a part disposed above the second barrier layer 16 via only the gate insulating film 25, and an effective gate length.

Operations of Semiconductor Apparatus of Seventh Embodiment

The semiconductor apparatus 1-7 having the configuration like this operates in substantially the same manner as the semiconductor apparatus of the first embodiment.

Manufacturing Method of Semiconductor Apparatus of Seventh Embodiment

Next, a manufacturing method of the semiconductor apparatus 1-7 of the configuration described above is performed by substantially the same procedures as those explained using the cross-sectional process charts of FIG. 15 and FIG. 16, and only a shape (the gate length Lg) of the gate electrode 27 is different.

Effects of Semiconductor Apparatus of Seventh Embodiment

The semiconductor apparatus 1-7 explained above is of a configuration in which the second barrier layer 16 whose valence band energy Ev is lower than that of the first barrier layer 15 is provided above the channel layer 14 via the first barrier layer 15, and the gate electrode 27 is provided over the p-type low-resistance region 16g provided in the surface layer of the second barrier layer 16 via the gate insulating film 25, as is the case with the first embodiment. Therefore, substantially the same effects as those of the first embodiment can be obtained.

In addition to the above, specifically, the semiconductor apparatus 1-7 of this seventh embodiment has the shape where the gate electrode 27 fully covers over the low-resistance region 16g. Therefore, when a gate voltage (a positive voltage) is applied to the gate electrode 27, it becomes easy to make the p-type low-resistance region 16g fully depleted. Namely, carrier depleted regions are prevented from coming into existence in gate edge portions within the channel layer 14 at the time of the ON operation, and parasitic resistance can be prevented from increasing. As a result, effects can be expected which lower the ON resistance Ron and, furthermore, increase the maximum drain current Idmax.

Incidentally, the configuration of the semiconductor apparatus of this seventh embodiment can be combined with the semiconductor apparatus of a configuration in which the insulating film 21 is provided separately from the gate insulating film 25 as explained in the first to the fifth embodiments. A manufacturing method when the configuration of the semiconductor apparatus of this seventh embodiment is applied to the first to the fifth embodiments is explained in an eleventh embodiment and beyond.

8. Eighth Embodiment

Figure 20:
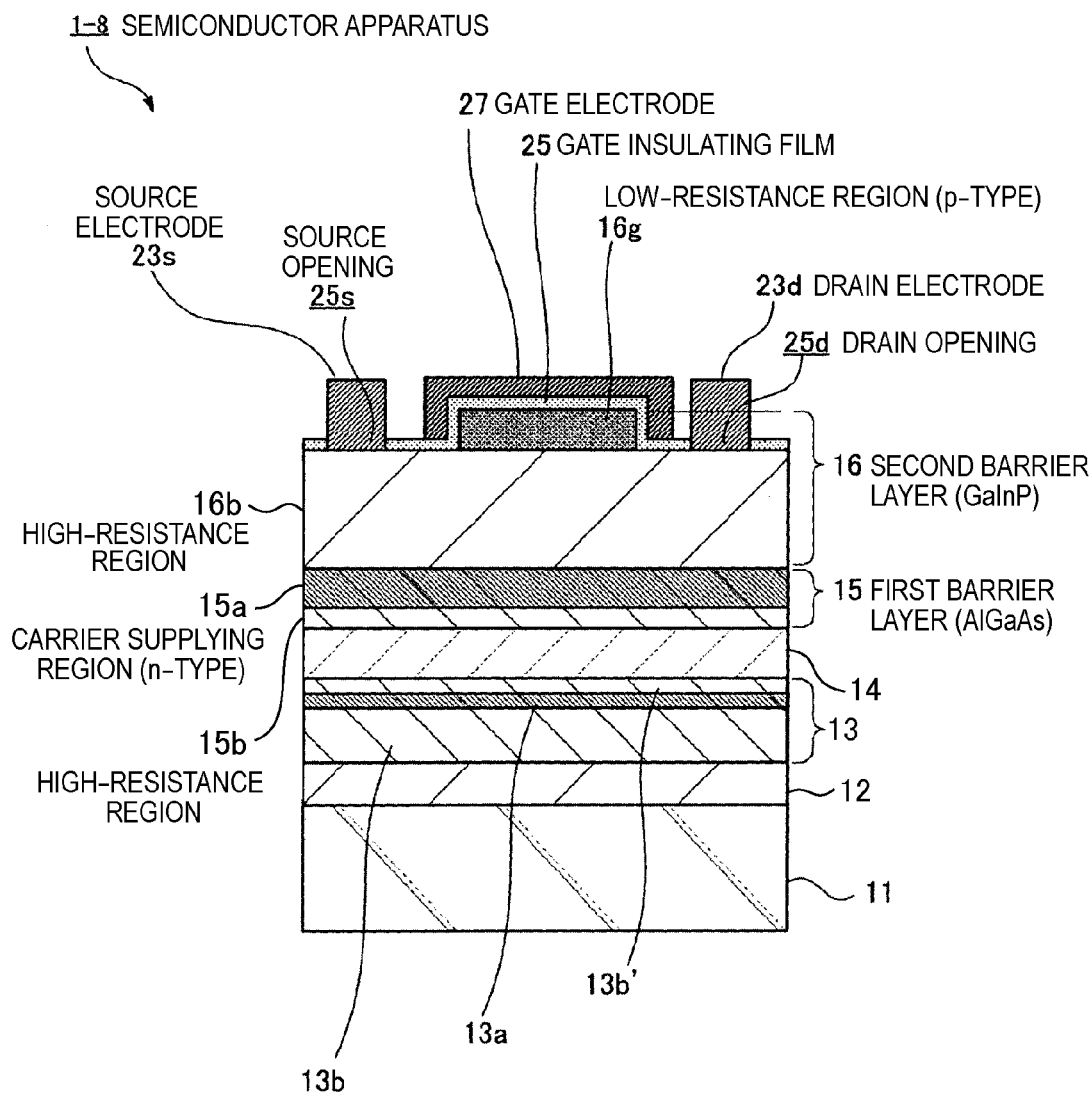
FIG. 20 is a cross-sectional view illustrating a principal configuration of a semiconductor apparatus of an eighth embodiment.

An Example where the Surface Layer of the Second Barrier Layer is Patterned as the Low-Resistance Region FIG. 20 is a cross-sectional view illustrating a principal configuration of a semiconductor apparatus of an eighth embodiment. In the following, a configuration of the semiconductor apparatus of the eighth embodiment to which the present technique is applied is explained based on this drawing.

Configuration of Semiconductor Apparatus of Eighth Embodiment

A difference between a semiconductor apparatus 1-8 of this eighth embodiment illustrated in FIG. 20 and the semiconductor apparatus of the first embodiment explained using FIG. 1 exists where the surface layer of the second barrier layer 16 is patterned into the p-type low-resistance region 16g. Additional difference exits where the entire upper surface of the second barrier layer 16 having the patterned low-resistance region 16g provided on the surface layer is covered by the gate insulating film 25 and the underlying insulating film (21) is removed, and the other configurations are substantially the same. Therefore, the same reference signs are given to the same constituting elements as those in the first embodiment, and detailed explanations are omitted in this embodiment.

First Barrier Layer 15, Second Barrier Layer 16

The first barrier layer 15 and the second barrier layer 16 are configured in substantially the same manner as those in the first embodiment, but are different in that the surface layer in the second barrier layer 16 is patterned into the low-resistance region 16g. In the second barrier layer 16, the other parts except the patterned low-resistance region 16g ought to be composed as the high-resistance region 16b that is not doped with impurities or that contains n-type impurities. Incidentally, regarding the other parts except the low-resistance region 16g in the second barrier layer 16, the entire region thereof may be composed as an n-type low-resistance region, and may be continuous with the n-type carrier supplying region 15a in the first barrier layer 15.

[Low-Resistance Region 16g]

The low-resistance region 16g is a part into which the surface layer of the second barrier layer 16 is patterned, and the patterned entire region thereof is composed as the p-type low-resistance region 16g that contains the p-type impurities.

Because the low-resistance region 16g like this is formed by pattering the surface layer of the second barrier layer 16, the low-resistance region 16g is composed by using the III-V compound semiconductor material whose valence band energy Ev is lower than that of the compound semiconductor material that constitutes the first barrier layer 15.

The low-resistance region 16g as above contains at least one kind of beryllium (Be), carbon (C), magnesium (Mg) and zinc (Zn) as the p-type impurity, which has been contained in the second barrier layer 16 made of the GaInP mixed crystal, as is the case with the other embodiments.

In addition, the entire surface of the second barrier layer 16 provided at the surface layer thereof with the patterned low-resistance region 16g like this, including the side walls of the low-resistance region 16g, is covered with the gate insulating film 25. With respect to this gate insulating film 25, the source opening 25s/the drain opening 25d that reach the second barrier layer 16 are provided in corresponding positions across the low-resistance region 16g. On top of the second barrier layer 16, the source electrode 23s/the drain electrode 23d are provided which are connected to the high-resistance region 16b of the second barrier layer 16 through the source opening 25s/the drain opening 25d, respectively.

In addition, the gate electrode 27 is formed to be longer than the length of the low-resistance region 16g, in a state of fully covering the top and side surfaces of the low-resistance region 16g via the gate insulating film 25. Incidentally, the gate electrode 27 may be provided so as to be layered only on top of the low-resistance region 16g.

Operations of Semiconductor Apparatus of Eighth Embodiment

The semiconductor apparatus 1-8 having the configuration like this operates in substantially the same manner as the semiconductor apparatus of the first embodiment.

Manufacturing Method of Semiconductor Apparatus of Eighth Embodiment

Figure 21:
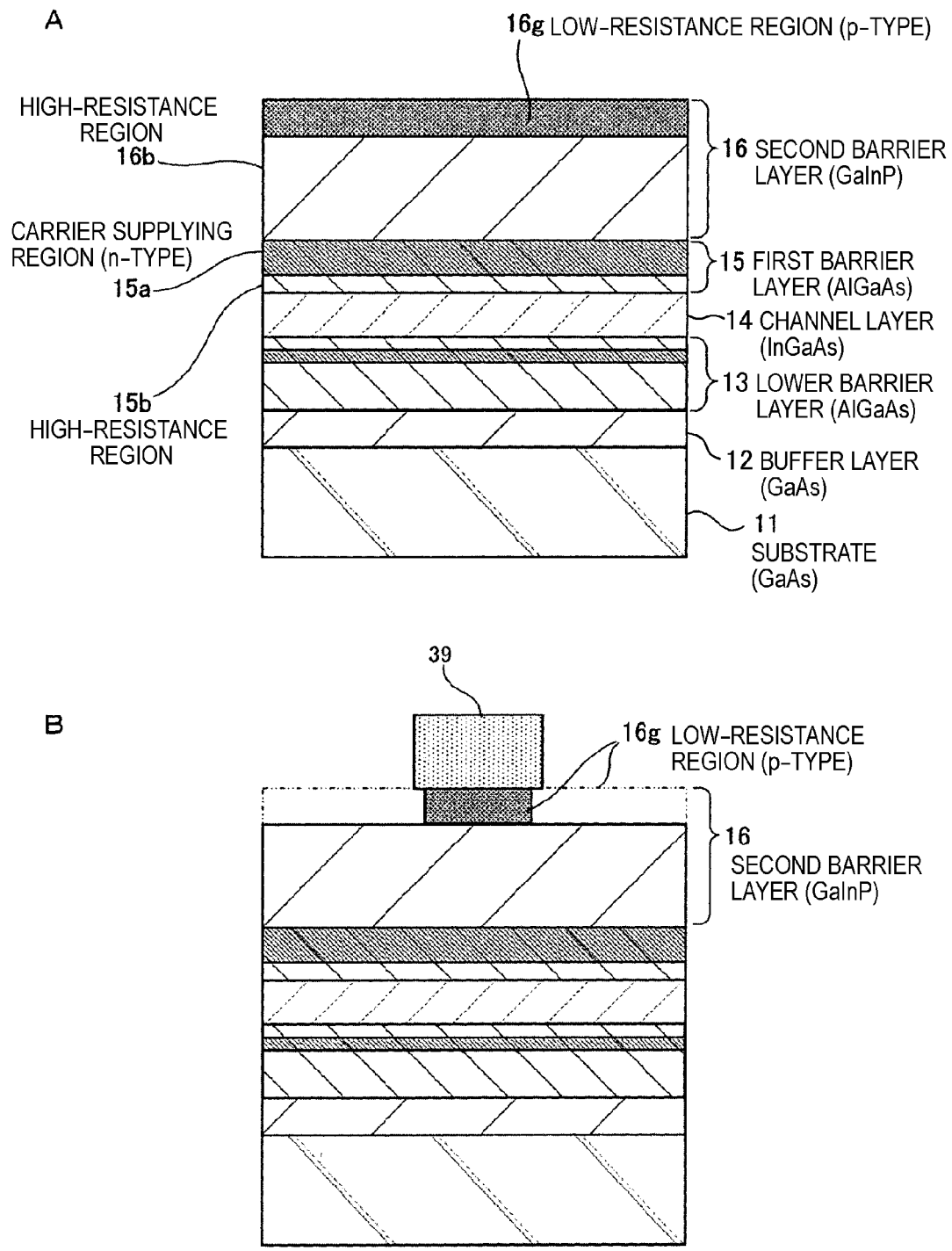
FIG. 21A is a cross-sectional process chart illustrating a manufacturing procedure of the semiconductor apparatus of the eighth embodiment.
FIG. 21B is a cross-sectional process chart illustrating the manufacturing procedure of the semiconductor apparatus of the eighth embodiment.

Next, one example of a manufacturing method of the semiconductor apparatus 1-8 described above is explained based on a cross-sectional process chart of FIG. 21.

[FIG. 21A]

First, as illustrated in FIG. 21A, the buffer layer 12, the lower barrier layer 13, the channel layer 14, and the first barrier layer 15 are epitaxially grown in this order on the substrate 11, and, furthermore, the second barrier layer 16 made of the u-GaInP ($Ga_{0.5}In_{0.5}P$) mixed crystal that is not doped with impurities is formed. The processes until here are performed by substantially the same procedures as explained using FIG. 5A in the first embodiment.

Subsequently, on top of the highly resistive second barrier layer 16 (namely, the high-resistance region 16b), the GaInP ($Ga_{0.5}In_{0.5}P$ mixed crystal) layer that is doped with at least one kind of beryllium, carbon, magnesium, and zinc as the p-type impurity is epitaxially grown as the low-resistance region 16g of the second barrier layer 16, thereby to form the second barrier layer 16. Next, ion implantation of boron is performed, thereby to form deactivated regions that are made highly resistive, which serve as device isolation, of which illustration is omitted here.

[FIG. 21B]

Next, as illustrated in FIG. 21B, a photoresist pattern 39 is formed on a region that is planned to be a p-type low-resistance region on the second barrier layer 16 by applying a photolithography method. Next, the low-resistance region 16g of the second barrier layer 16 is patterned by anisotropic etching using the photoresist pattern 39 as a mask. After the patterning is completed, the photoresist pattern 39 is removed.

After the above, as illustrated in FIG. 20, the gate insulating film 25 made of aluminum oxide is deposited on the second barrier layer 16 in a state of covering the patterned low-resistance region 16g. Next, the gate electrode 27 is pattern-formed above the second barrier layer 16 via the gate insulating film 25, and furthermore, after the source opening 25s/the drain opening 25d are formed in the gate insulating film 25, the source electrode 23s/the drain electrode 23d are formed, thereby to complete the semiconductor apparatus 1-8.

Effects of Semiconductor Apparatus of Eighth Embodiment

The semiconductor apparatus 1-8 explained above is of a configuration in which the second barrier layer 16 whose valence band energy Ev is lower than that of the first barrier layer 15 is provided above the channel layer 14 via the first barrier layer 15, and the gate electrode 27 is provided over the p-type low-resistance region 16g provided in the surface layer of the second barrier layer 16 via the gate insulating film 25, as is the case with the first embodiment. Therefore, substantially the same effects as those of the first embodiment can be obtained.

In addition to the above, specifically, in the semiconductor apparatus 1-8 of this eighth embodiment uses as the p-type low-resistance region 16g a part into which the second barrier layer 16 epitaxially grown so as to contain the p-type impurities is patterned. With this, a thickness of the low-resistance region 16g is controlled with a high degree of accuracy. As a result, compared with the configuration provided with the low-resistance region formed by impurity diffusion, stabilizations of a threshold voltage, the ON resistance Ron, and the maximum drain current Idmax can be sought.

Moreover, the semiconductor apparatus 1-8 has a shape where the gate electrode 27 fully covers over the low-resistance region 16g. Therefore, when a gate voltage (a positive voltage) is applied to the gate electrode 27, it becomes easy to make the p-type low-resistance region 16g fully depleted. Namely, carrier depleted regions are prevented from coming into existence in gate edge portions within the channel layer 14 at the time of the ON operation, and parasitic resistance can be prevented from increasing. As a result, effects can be expected which lower the ON resistance Ron and, furthermore, increase the maximum drain current Idmax.

Incidentally, the configuration of the semiconductor apparatus of this eighth embodiment can be combined with the semiconductor apparatus of a configuration in which the insulating film 21 is provided separately from the gate insulating film 25 as explained in the first to the fifth embodiments.

In a manufacturing method when applying to the first to the fourth embodiments, after the low-resistance region 16g is pattern-formed as illustrated in FIG. 21B, the insulating film 21 is formed and the gate opening 21g is formed therein in substantially the same manner as explained using FIG. 5B. After this, the gate insulating film 25 is formed, and, furthermore, the source electrode 23s/the drain electrode 23d and the gate electrode 27 are formed.

9. Ninth Embodiment

Figure 22:
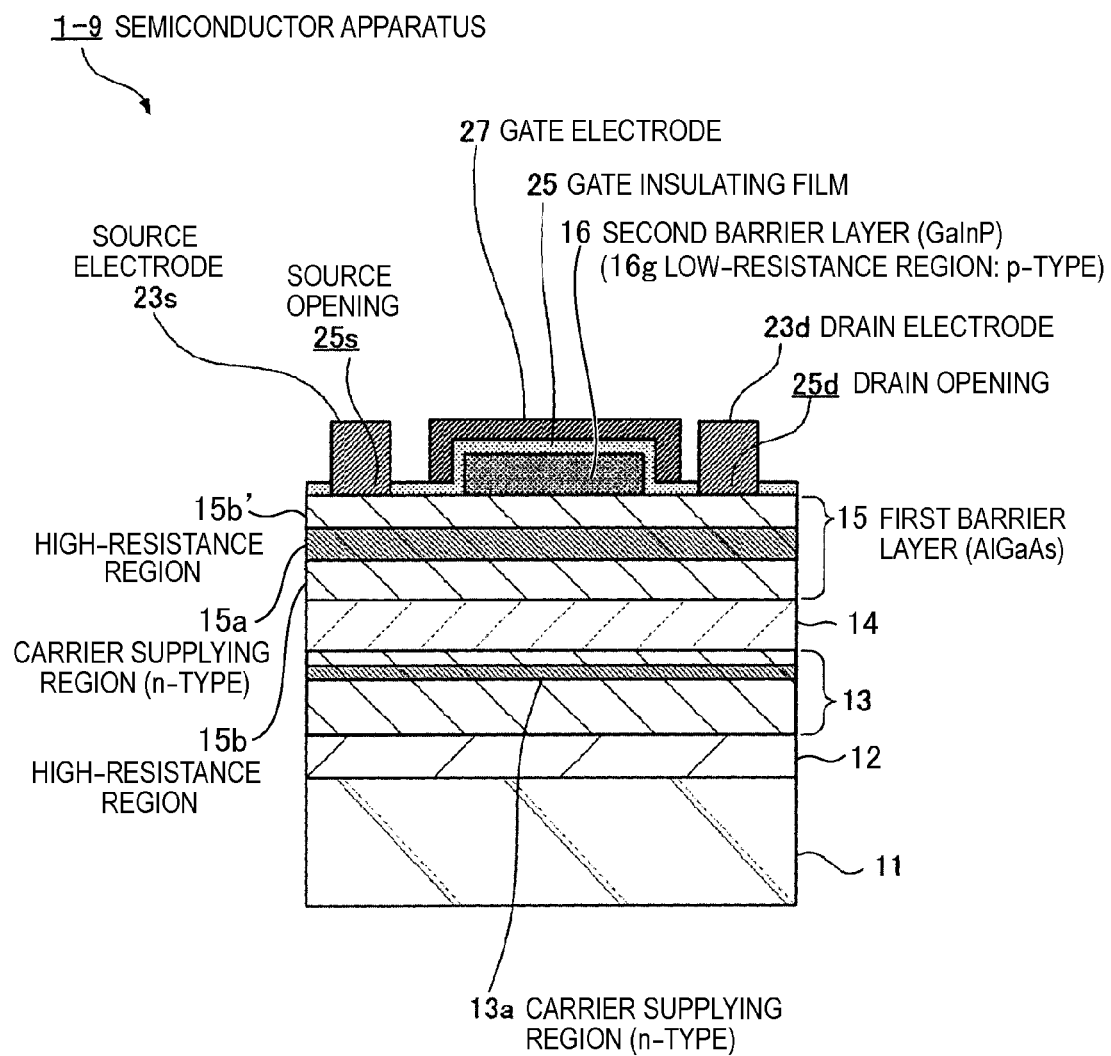
FIG. 22 is a cross-sectional view illustrating a principal configuration of a semiconductor apparatus of a ninth embodiment.

An Example where the Second Barrier Layer on the First Barrier Layer is Patterned as the Low-Resistance Region FIG. 22 is a cross-sectional view illustrating a principal configuration of a semiconductor apparatus of a ninth embodiment. In the following, a configuration of the semiconductor apparatus of the ninth embodiment to which the present technique is applied is explained based on this drawing.

Configuration of Semiconductor Apparatus of Ninth Embodiment

A difference between a semiconductor apparatus 1-9 of this ninth embodiment illustrated in FIG. 22 and the semiconductor apparatus of the first embodiment explained using FIG. 1 exists where the second barrier layer 16 patterned as the low-resistance region 16g is provided on the first barrier layer 15. In addition, other differences exist where the carrier supplying region 15a is provided in the middle portion along the film thickness direction of the first barrier layer 15; and the entire surface of the second barrier layer 16 where the second barrier layer 16 that turns out to be the low-resistance region 16g is formed is covered by the gate insulating film 25 and the underlying insulating film (21) is removed, and the other configurations are substantially the same. Therefore, the same reference signs are given to the same constituting elements as those in the first embodiment, and detailed explanations are omitted in this embodiment.

[First Barrier Layer 15]

Namely, the first barrier layer 15 is substantially the same as the first barrier layer in the first embodiment, composed of the III-V compound semiconductor material that is favorably lattice-matched to the channel layer 14 and has a higher conduction band energy Ec than the compound semiconductor material that constitutes the channel layer 14, and forms the hetero junction with the channel layer 14. The greater a difference between band gaps (conduction bands Ec) of the channel layer 14 and the first barrier layer 15 becomes, the better the first barrier layer 15 like this is.

In the first barrier layer 15 like this, the high-resistance regions 15b, 15b' that are disposed across the carrier supplying region 15a may be formed independently as the high-resistance region 15b that is not doped with impurities or contains impurities at a low concentration, as is the case with the second embodiment. In addition, as for the first barrier layer 15 like this, the entire region thereof may be composed of the carrier supplying region 15a, or only a layer on the side in contact with the channel layer 14 may be the high-resistance region 15b, or only a layer on the second barrier layer 16 side may be the high-resistance region 15b'.

[Second Barrier Layer 16 and Low-Resistance Region 16g]

The second barrier layer 16 is a patterned layer above the channel layer 14 via the first barrier layer 15, and the entire region thereof is composed as the low-resistance region 16g that contains the p-type impurities.

The second barrier layer 16 like this is composed of the compound semiconductor material that is lattice-matched to the first barrier layer 15, and composed of the III-V compound semiconductor material whose valence band energy Ev is lower than that of the compound semiconductor material that constitutes the first barrier layer 15.

The second barrier layer 16 as above may be made of, for example, the GaInP mixed crystal, and contains at least one kind of beryllium (Be), carbon (C), magnesium (Mg), and zinc (Zn) as the p-type impurity.

In addition, the entire surfaces of the second barrier layer 16 like this and the first barrier layer 15 are covered by the gate insulating film 25. With respect to this gate insulating film 25, the source opening 25s/the drain opening 25d that reach the first barrier layer 15 are provided in corresponding positions across the second barrier layer 16 that constitutes the low-resistance region 16g. On top of the second barrier layer 16, the source electrode 23s and the drain electrode 23d are provided which are connected to the first barrier layer 15 through the source opening 25s and the drain opening 25d, respectively.

In addition, the gate electrode 27 is formed to be longer than the length of the second barrier layer 16 as the low-resistance region 16g, in a state of fully covering the top and side surfaces of the low-resistance region 16g via the gate insulating film 25. Incidentally, the gate electrode 27 may be provided so as to be layered only on top of the second barrier layer 16 as the low-resistance region 16g.

Operations of Semiconductor Apparatus of Ninth Embodiment

The semiconductor apparatus 1-9 having the configuration like this operates in substantially the same manner as the semiconductor apparatus of the first embodiment.

Manufacturing Method of Semiconductor Apparatus of Ninth Embodiment

Next, in a manufacturing method of the semiconductor apparatus 1-9 described above, the buffer layer 12, the lower barrier layer 13, the channel layer 14, and the first barrier layer 15 of a three layer structure are epitaxially grown in this order on the substrate 11. Then, the GaInP ($Ga_{0.5}In_{0.5}P$ mixed crystal) layer that is doped with p-type impurities is epitaxially grown as the low-resistance region 16g of the second barrier layer 16, thereby to form the second barrier layer 16. Next, ion implantation of boron is performed, thereby to form deactivated regions that are made highly resistive, which serve as device isolation, of which illustration is omitted here.

Then, the second barrier layer 16 (low-resistance region 16g) is patterned in substantially the same manner as explained using the cross-sectional process chart of FIG. 21B in the eighth embodiment. After this, as illustrated in FIG. 22, the gate insulating film 25 made of aluminum oxide is deposited on the second barrier layer 16 in a state covering the patterned low-resistance region 16g. Next, the gate electrode 27 is pattern-formed above the second barrier layer 16 and the first barrier layer 15 via the gate insulating film 25. Further, after the source opening 25s/the drain opening 25d are formed in the gate insulating film 25, the source electrode 23s/the drain electrode 23d are formed, thereby to complete the semiconductor apparatus 1-9.

Effects of Semiconductor Apparatus of Ninth Embodiment

Even the semiconductor apparatus 1-9 explained above is of a configuration in which the second barrier layer 16 whose valence band energy Ev is lower than that of the first barrier layer 15 is provided above the channel layer 14 via the first barrier layer 15, and with this second barrier layer 16 as the p-type low-resistance region 16, the gate electrode 27 is provided over the p-type low-resistance region 16g via the gate insulating film 25, as is the case with the first embodiment. Therefore, substantially the same effects as those of the first embodiment can be obtained.

In addition to the above, in the semiconductor apparatus 1-9 of this ninth embodiment uses as the p-type low-resistance region 16g a part into which the second barrier layer 16 epitaxially grown so as to contain the p-type impurities is patterned. With this, a thickness of the low-resistance region 16g is controlled with a high degree of accuracy. As a result, compared with the configuration provided with the low-resistance region formed by impurity diffusion, stabilizations of a threshold voltage, the ON resistance Ron, and the maximum drain current Idmax can be achieved.

Moreover, at the time of device processing, when the second barrier layer 16 is patterned into the p-type low-resistance region 16g, because the semiconductor materials are different between in the first barrier layer 15 and in the second barrier layer 16, selective etching can be performed. Namely, only the low-resistance region 16g can be highly accurately etched, thereby to prevent a film thickness of the first barrier layer 15 from decreasing. As a result, the ON resistance Ron can be prevented from increasing, and, additionally, the maximum drain current Idmax can be prevented from lowering.

Incidentally, the configuration of the semiconductor apparatus 1-9 of this ninth embodiment can be combined with the first to the fifth embodiments, in substantially the same manner as explained in the eighth embodiment.

10. Tenth Embodiment

Figure 23:
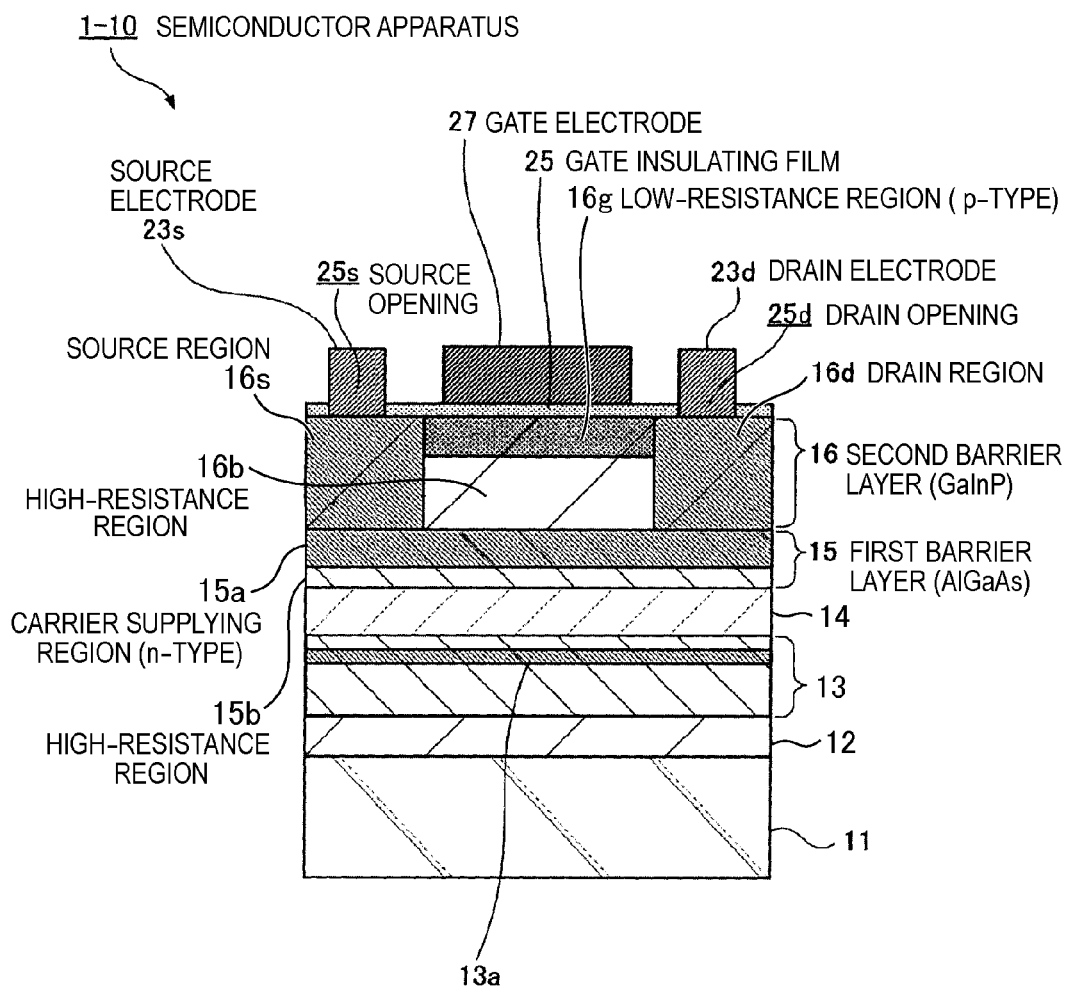
FIG. 23 is a cross-sectional view illustrating a principal configuration of a semiconductor apparatus of a tenth embodiment.

An Example where the Source Region and the Drain Region of an Opposite Conduction Type to that of the Low-Resistance Region FIG. 23 is a cross-sectional view illustrating a principal configuration of a semiconductor apparatus of a tenth embodiment. In the following, a configuration of the semiconductor apparatus of the tenth embodiment to which the present technique is applied is explained based on this drawing.

Configuration of Semiconductor Apparatus of Tenth Embodiment

A difference between a semiconductor apparatus 1-9 of this tenth embodiment illustrated in FIG. 23 and the semiconductor apparatus of the first embodiment explained using FIG. 1 exists where n-type source region 16s/drain region 16d are provided in the second barrier layer 16. And additional differences exist where the entire upper surface of the second barrier layer 16 is covered by the gate insulating film 25 and the underlying insulating film (21) is removed, and the other configurations are substantially the same. Therefore, the same reference signs are given to the same constituting elements as those in the first embodiment, and detailed explanations are omitted in this embodiment.

Namely, the source region 16s/the drain region 16d are provided as low-resistive regions that contain the n-type impurities, in corresponding positions across the gate electrode 17, or in corresponding positions across the p-type low-resistance region 16g. The source region 16s/the drain region 16d may be provided in contact with the p-type low-resistance region 16g. In addition, the source region 16s/the drain region 16d reach the n-type carrier supplying region 15a provided within the first barrier layer 15.

The entire surface of the second barrier layer 16 is covered by the gate insulating film 25. With respect to this gate insulating film 25, the source opening 25s/the drain opening 25d that reach the source region 16s/the drain region 16d disposed in corresponding positions across the low-resistance region 16, respectively. On top of the second barrier layer 16, the source electrode 23s and the drain electrode 23d are provided which are connected to the source region 16s and the drain region 16d through the source opening 25s and the drain opening 25d, respectively.

In addition, the gate electrode 27 is provided above the low-resistance region 16g in the second barrier layer 16 via the gate insulating film 25.

Operations of Semiconductor Apparatus of Tenth Embodiment

The semiconductor apparatus 1-10 having the configuration like this operates in substantially the same manner as the semiconductor apparatus of the first embodiment.

Manufacturing Method of Semiconductor Apparatus of Tenth Embodiment

Next, one example of a manufacturing method of the semiconductor apparatus 1-10 described above is explained based on a cross-sectional process chart of FIG. 24.
[FIG. 24A]

First, as illustrated in FIG. 24A, the buffer layer 12, the lower barrier layer 13, the channel layer 14, and the first barrier layer 15 are epitaxially grown in this order on the substrate 11, and, furthermore, the second barrier layer 16 made of the u-GaInP ($Ga_{0.5}In_{0.5}P$ mixed crystal) layer that is not doped with impurities is formed. The processes until here are performed by substantially the same procedures as explained using FIG. 5A in the first embodiment.

Subsequently, on top of the highly resistive second barrier layer 16 (namely, the high-resistance region 16b), the GaInP ($Ga_{0.5}In_{0.5}P$ mixed crystal) layer that is doped with at least one kind of beryllium, carbon, magnesium, and zinc as the p-type impurity is epitaxially grown as the low-resistance region 16g of the second barrier layer 16, thereby to form the second barrier layer 16. Next, ion implantation of boron is performed, thereby to form deactivated regions that are made highly resistive, which serve as device isolation, of which illustration is omitted here.
[FIG. 24B]

Next, as illustrated in FIG. 24B, a photoresist pattern 41 is formed on a region where the p-type low-resistance region 16g is to be left in the second barrier layer 16 by applying a photolithography method. Then, by impurity diffusion using the photoresist pattern 41 as a mask, the n-type impurities are introduced into the second barrier layer 16. With this, the n-type source region 16s/the drain region 16d are formed to a depth that reaches the n-type carrier supplying region 15a on both sides of the p-type low-resistance region 16g. This impurity diffusion is performed by, for example, ion implantation. After the impurity diffusion, the photoresist pattern 41 is removed.

After the above, as illustrated in FIG. 23, on top of the second barrier layer 16 where the p-type low-resistance region 16g and the n-type source region 16s/the drain region 16d are formed, the gate insulating film 25 made of aluminum oxide is deposited. Next, the gate electrode 27 is pattern-formed above the p-type low-resistance region 16g via the gate insulating film 25. In addition, in the gate insulating film 25, the source opening 25s/the drain opening 25d that reach the n-type source region 16s/the drain region 16d, respectively, are formed. After this, the source electrode 23s/the drain electrode 23d are formed which are connected to the source region 16s/the drain region 16d through the openings, respectively, thereby to complete the semiconductor apparatus 1-10.

Effects of Semiconductor Apparatus of Tenth Embodiment

Even the semiconductor apparatus 1-10 explained above is of a configuration in which the second barrier layer 16 whose valence band energy Ev is lower than that of the first barrier layer 15 is provided above the channel layer 14 via the first barrier layer 15, and with the surface layer of the second barrier layer 16 as the p-type low-resistance region 16, the gate electrode 27 is provided above the p-type low-resistance region 16g via the gate insulating film 25, as is the case with the first embodiment. Therefore, substantially the same effects as those of the first embodiment can be obtained.

In addition to the above, specifically, because the semiconductor apparatus 1-10 of the tenth embodiment is provided with the n-type source region 16s/the drain region 16d in a state of being across the p-type low-resistance region 16g, a sheet carrier density within the channel layer 14 immediately below the n-type source region 16s/the drain region 16d can be increased, thereby to lower the channel resistance and the access resistance. Namely, the ON resistance Ron can be lowered and, additionally, the maximum drain current Idmax can be increased.

Moreover, the second barrier layer 16 that is formed by epitaxial growth is used as the p-type low-resistance region 16g. With this, a thickness of the low-resistance region 16g is controlled with a high degree of accuracy. As a result, compared with the configuration provided with the low-resistance region formed by impurity diffusion, stabilizations of a threshold voltage, the ON resistance Ron, and the maximum drain current Idmax can be achieved.

Incidentally, the configuration of the semiconductor apparatus of this tenth embodiment can be combined with the semiconductor apparatus of a configuration in which the insulating film 21 is provided separately from the gate insulating film 25 as explained in the first to the fifth embodiments. In addition, the configuration of the semiconductor apparatus of this tenth embodiment can be combined with the semiconductor apparatus provided with the patterned p-type low-resistance region 16g as explained in the eighth to the ninth embodiments.

11. Eleventh Embodiment

Figure 25:
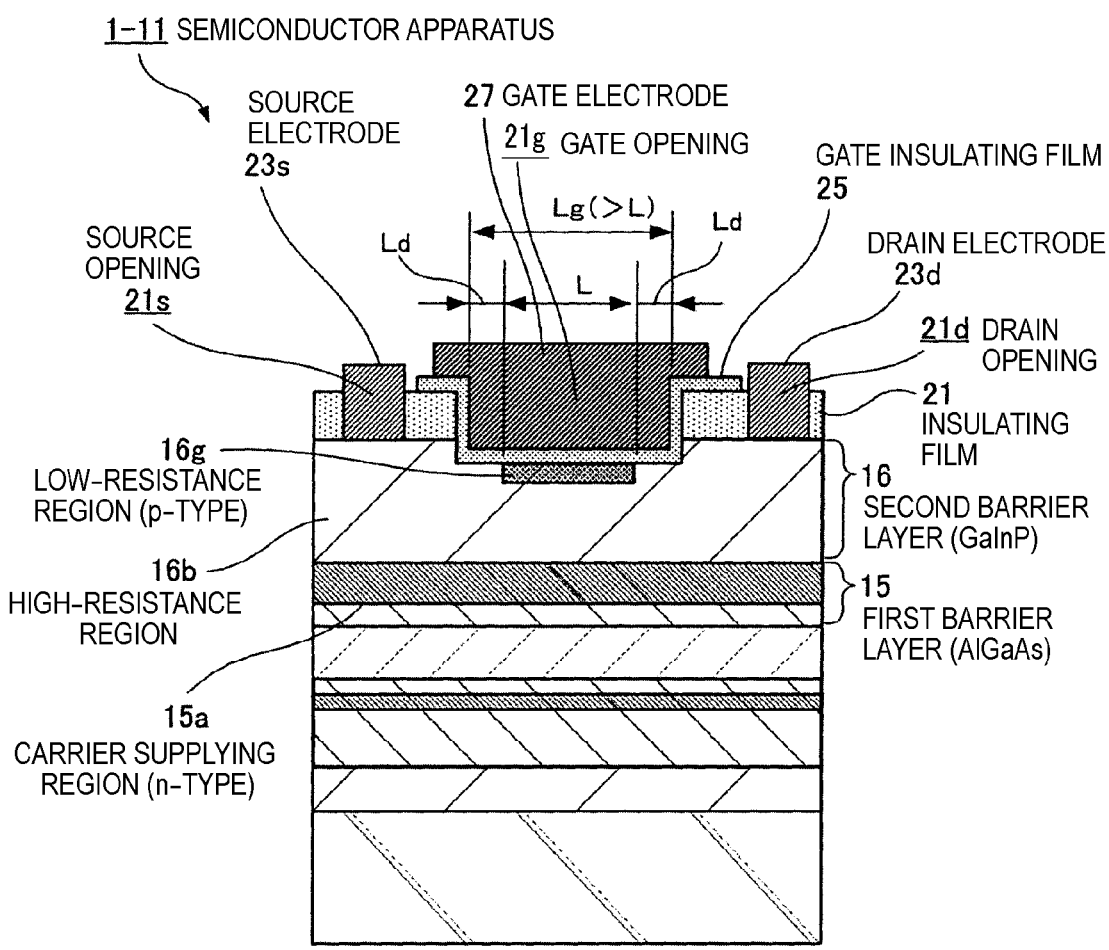
FIG. 25 is a cross-sectional view illustrating a principal configuration of a semiconductor apparatus of an eleventh embodiment.

A First Example where the Gate Electrode Covering the Low-Resistance Region is Provided in Self-Alignment FIG. 25 is a cross-sectional view illustrating a principal configuration of a semiconductor apparatus of an eleventh embodiment. In the following, a configuration of the semiconductor apparatus of the eleventh embodiment to which the present technique is applied is explained based on this drawing.

Configuration of Semiconductor Apparatus of Eleventh Embodiment

Differences between a semiconductor apparatus 1-11 of this eleventh embodiment illustrated in FIG. 25 and the semiconductor apparatus of the first embodiment explained using FIG. 1 exist where the gate electrode 27 covers the low-resistance region 16g, and this gate electrode 27 is formed in self-alignment with respect to the low-resistance region 16g. The other configurations are substantially the same as those of the first embodiment. Therefore, the same reference signs are given to the same constituting elements as those in the first embodiment, and detailed explanations are omitted in this embodiment.

Namely, in the semiconductor apparatus 1-11 of this eleventh embodiment, the entirety of the low-resistance region 16g is exposed at the bottom portion of the gate opening 21g provided in the insulating film 21, and the top thereof is covered by the gate insulating film 25. More specifically, in a state of having a predetermined clearance Ld evenly from the circumferential edge of the gate electrode 21g covered by the gate insulating film 25, the low-resistance region 16g is in a state of being exposed at the center in the bottom portion of the gate opening 21g. The clearance Ld is even along the circumferential edge, and is provide in self-alignment with respect to the low-resistance region 16g. It suffices that the clearance Ld is greater than 0 nm and has a size with a manufacturing process margin taken into consideration.

In addition, the semiconductor apparatus 1-11 has a level difference caused because the upper surface of the second barrier layer 16 is etched, with respect to the bottom portion of the gate opening 21g, which stems from a manufacturing method described later.

Moreover, it is important that the gate electrode 27 is provided in a state of fully covering the bottom portion of the gate opening 21g via the gate insulating film 25. An effective gate length Lg of the gate electrode 27 like this is a width of the bottom portion of the gate opening 21g, or more specifically an opening width of the gate opening 21g covered by the gate insulating film 25. Namely, a part functioning as the effective gate length Lg in the gate electrode 27 has a size that is extended by an extent of the clearance Ld beyond the length L of the low-resistance region 16g along the circumferential direction, and fully covers over low-resistance region 16g.

Operations of Semiconductor Apparatus of Eleventh Embodiment

The semiconductor apparatus 1-11 having the configuration like this operates in substantially the same manner as the semiconductor apparatus of the first embodiment.

Manufacturing Method of Semiconductor Apparatus of Eleventh Embodiment

Figure 26:
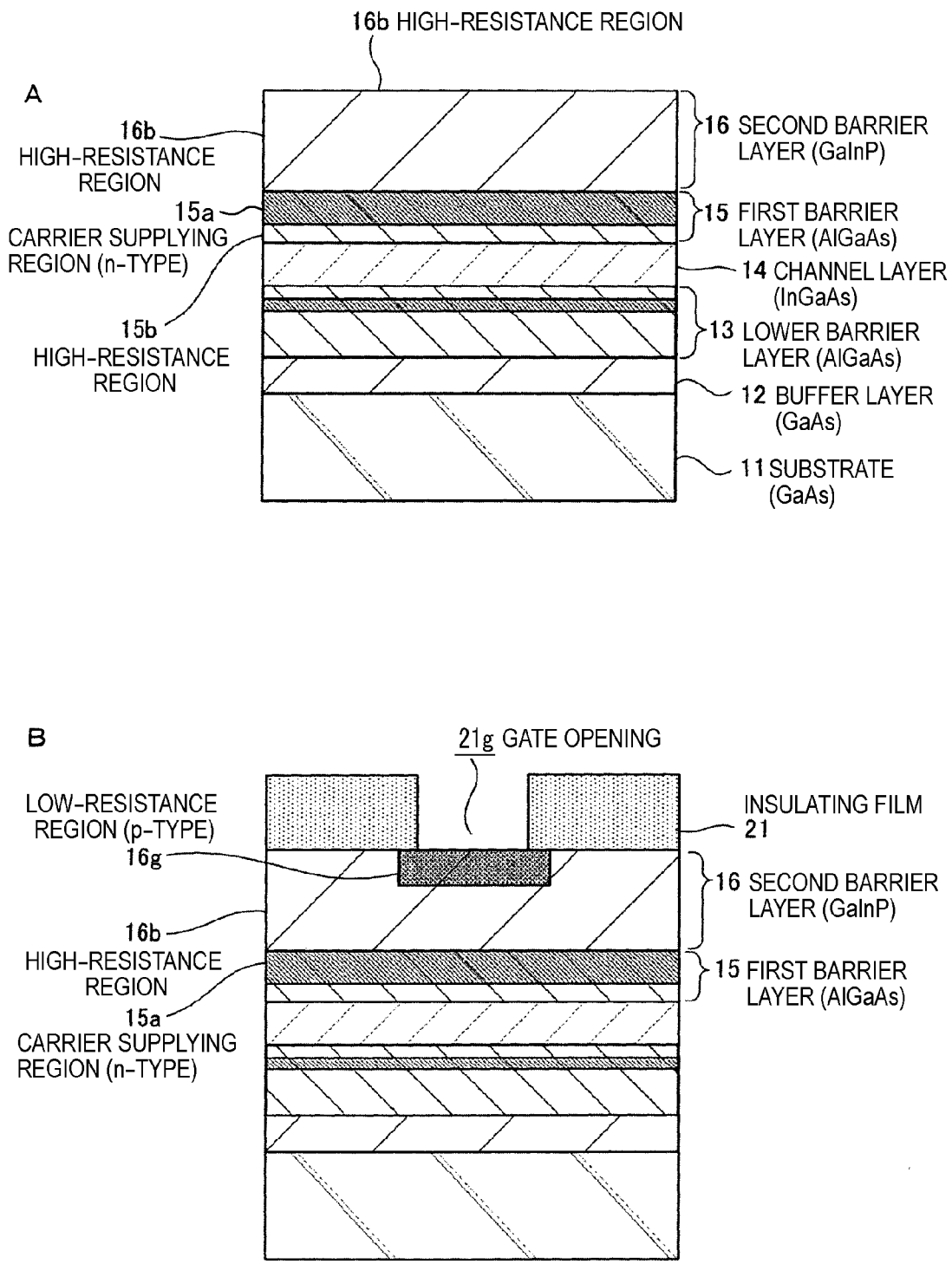
FIG. 26A is a cross-sectional process chart (part 1) illustrating a first example.
FIG. 26B is a cross-sectional process chart (part 1) illustrating the first example.
Figure 27:
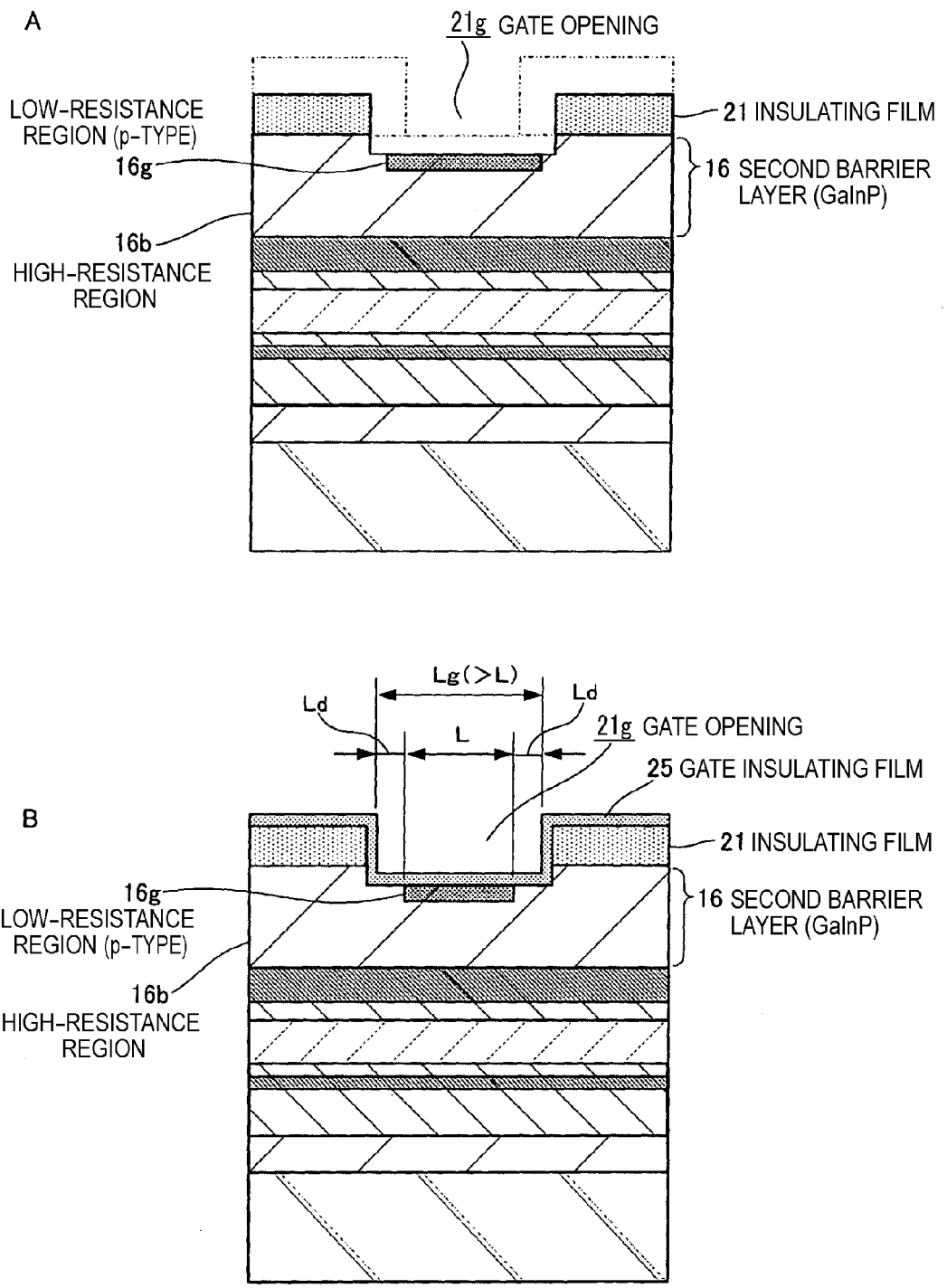
FIG. 27A is a cross-sectional process chart (part 2) illustrating the first example.
FIG. 27B is a cross-sectional process chart (part 2) illustrating the first example.
Figure 28:
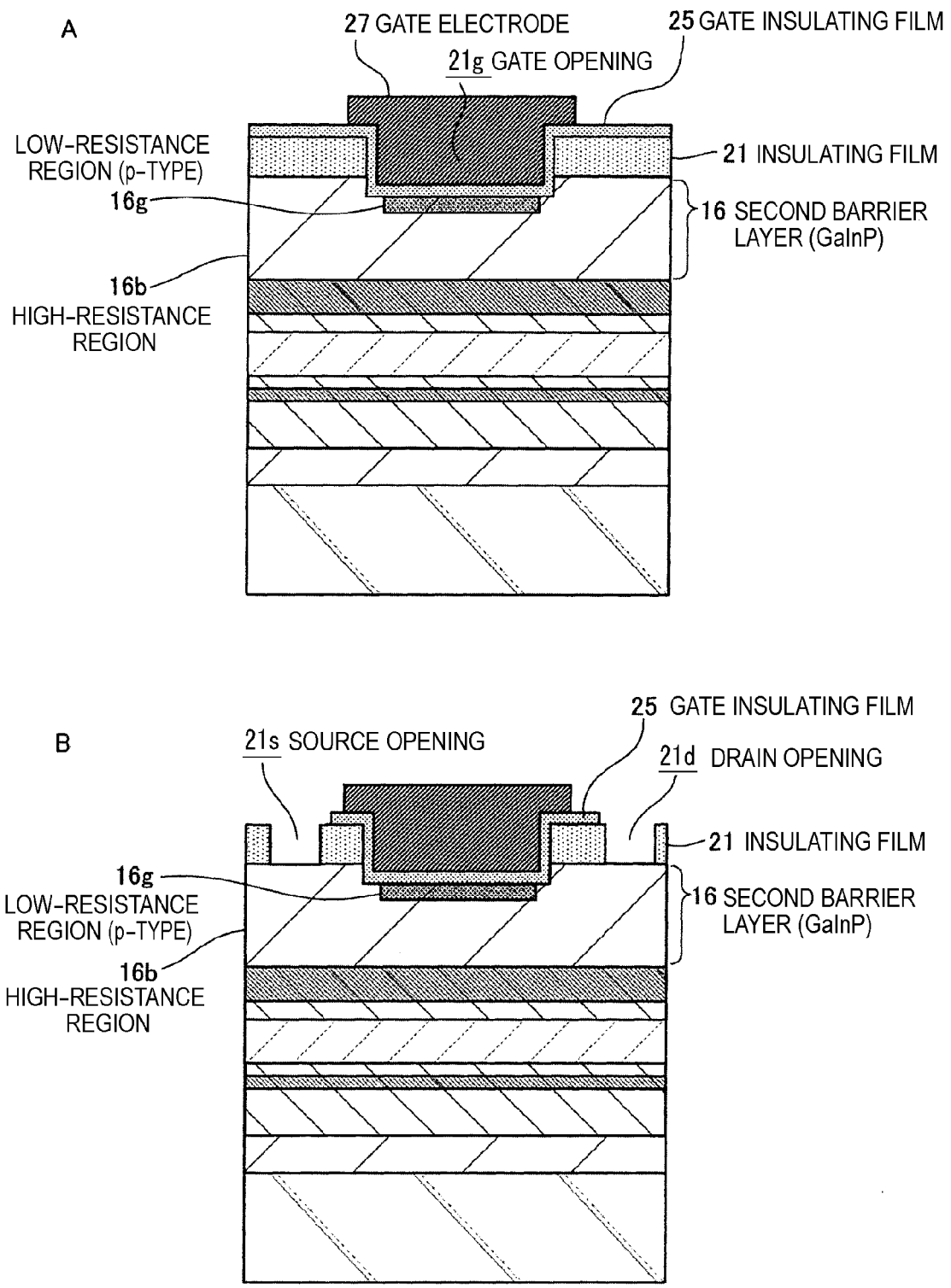
FIG. 28A is a cross-sectional process chart (part 3) illustrating the first example.
FIG. 28B is a cross-sectional process chart (part 3) illustrating the first example.

Next, one example of a manufacturing method of the semiconductor apparatus 1-11 of the configuration described above is explained based on cross-sectional process charts of FIG. 26 through FIG. 28.

[FIG. 26A]

First, as illustrated in FIG. 26A, the buffer layer 12, the lower barrier layer 13 of a 3-layer structure, the channel layer 14, a first barrier layer 15 of a 2-layer structure, and the second barrier layer 16 (the high-resistance region 16b) are epitaxially grown in this order on the substrate 11. At this time, it suffices that a film deposition of each layer may be performed by substantially the same procedures as explained in each embodiment, and, furthermore, after the film deposition of each layer, device isolation is formed.

[FIG. 26B]

Next, as illustrated in FIG. 26B, the insulating film 21 provided with the gate opening 21g is formed on the second barrier layer 16, and, furthermore, the low-resistance region 16g is formed by diffusing impurities from the gate opening 21g. It suffices that this process is performed by substantially the same procedures as explained using FIG. 5B in the first embodiment.

Namely, here, on top of the second barrier layer 16 (high-resistance region 16b) made of the u-GaInP layer that is not doped with impurities, the insulating film 21 made of silicon nitride ($Si_3N_4$) is deposited by, for example, a Chemical Vapor Deposition (CVD) method. Then, by pattern-etching the insulating film 21, the gate opening 21g is formed which allows the upper surface of the second barrier layer 16 to be exposed.

In this state, by introducing p-type impurities from the upper surface of the second barrier layer 16 exposed at the bottom portion of the gate opening 21g, the p-type low-resistance region 16g is formed within the second barrier layer 16. Here, as illustrated, zinc (Zn) serving as the p-type impurity is diffused until a position that does not reach the carrier supplying region 15a, or only in the surface layer within the second barrier layer 16, thereby to form the low-resistance region 16g. Diffusion of zinc (Zn) is performed by vapor-phase diffusion using a zinc compound gas at a temperature of, for example, 600° C. With this, the low-resistance region 16g is formed at the bottom portion of the gate opening 21g in self-alignment.

[FIG. 27A]

Then, a process illustrated in FIG. 27A is a characteristic process as the manufacturing method of this eleventh embodiment.

Namely, here, by performing isotropic etching of the insulating film 21, the insulating film 21 is receded in a traverse direction, thereby to extend a width of the gate opening 21g to a size that allows the low-resistance region 16g to be fully exposed. As the isotropic etching, wet-etching using a chemical solution of, for example, a hydrofluoric acid (HF) group, or plasma etching in the case of dry-etching is performed.

However, when the wet-etching using the chemical solution is performed, the second barrier layer 16 of the GaInP layer that underlies the insulating film 21 is also etched. Therefore, it is preferable to suppress the etching of the second barrier layer 16 to a smaller extent, by using a chemical solution of the hydrofluoric acid group having a low etching rate.

[FIG. 27B]

Next, as illustrated in FIG. 27B, the gate insulating film 25 is deposited on the insulating film 21 in a state of covering the second barrier layer 16 exposed through the gate opening 21g and an inner wall of the gate opening 21g whose width has been extended. Here, the gate insulating film 26 made of aluminum oxide ($Al_2O_3$) having a film thickness of about 10 nm is deposited with a high degree of accuracy by, for example, an Atomic Layer Deposition (ALD) method. Incidentally, in this state, the opening width of the gate opening 21g whose inner wall is covered by the gate insulating film 25 is the effective gate length Lg of the gate electrode formed afterward. This gate length Lg is greater than the width of the low-resistance region 16g. There exists a configuration where the side wall of the gate opening 21g covered by the gate insulating film 25 is positioned with the even clearance Ld away from the entire circumference of the low-resistance region 16g.

[FIG. 28A]

Next, as illustrated in FIG. 28A, the gate electrode 27 is formed in as state of fully covering the bottom portion of the gate opening 21g via the gate insulating film 25. At this time, nickel (Ni) and gold (Au) are vapor-deposited in series, with a mask used, onto the gate insulating film 25, thereby to pattern-form the gate electrode 27. With this, the gate electrode 27 of a shape that fully covers over the low-resistance region 16g is obtained.

[FIG. 28B]

After the above, as illustrated in FIG. 28B, by pattern-etching the gate insulating film 25 and the insulating film 21, the source opening 21s and the drain opening 21d that allow the high-resistance region 16b of the second barrier layer 16 to be exposed are formed in corresponding positions across the low-resistance region 16g.

[FIG. 25]

Then, as illustrated in FIG. 25, the source electrode 23s and the drain electrode 23d are formed which are in ohmic contact with the high-resistance region 16b of the second barrier layer 16 through the source opening 21s and the drain opening 21d, respectively. At this time, gold-germanium (AuGe), nickel (Ni), and gold (Au) are vapor-deposited in series, patterned, and formed into a gold group alloy by a heat treatment at, for example, about 400° C., thereby to form the source electrode 23s and the drain electrode 23d, so that the semiconductor apparatus 1-11 is completed.

By the above-explained manufacturing method, the semiconductor apparatus 1-11 of the eleventh embodiment can be formed. According to this method, the low-resistance region 16g is formed by the p-type impurity diffusion from the gate opening 21g formed in the insulating film 21, and after the insulating film 21 is receded in the traverse direction by wet-etching, the gate electrode 27 is formed via the gate electrode 25. Therefore, the gate electrode 27 of a shape that fully covers the low-resistance region 16g is formed over the low-resistance region 16g in self-alignment with respect to the low-resistance region 16g. Therefore, the semiconductor apparatus 1-11 of the eleventh embodiment can be obtained with ease.

Incidentally, the gate opening 21g, the gate insulating film 25, and the gate electrode 27 may be formed after the source opening 21s/the drain opening 21d and the source electrode 23s/the drain electrode 23d are formed. Even in this case, the gate electrode 27 is formed to have a wider width than that of the low-resistance region 16g, with being self-aligned with respect to the low-resistance region 16g via the gate insulating film 25. Therefore, the semiconductor apparatus 1-11 of the eleventh embodiment can be obtained with ease.

Effects of Semiconductor Apparatus of Eleventh Embodiment

The semiconductor apparatus 1-11 explained above has the shape where the gate electrode 27 fully covers over the low-resistance region 16g. Therefore, when a gate voltage (a positive voltage) is applied to the gate electrode 27, it becomes easy to make the p-type low-resistance region 16g fully depleted. Namely, carrier depleted regions are prevented from coming into existence in gate edge portions within the channel layer 14 at the time of the ON operation, and parasitic resistance can be prevented from increasing. As a result, effects can be expected which lower the ON resistance Ron and, furthermore, increase the maximum drain current Idmax.

And, specifically, because the gate electrode 27 is formed in self-alignment with respect to the low-resistance region 16g, a margin can be reduced as for a clearance for ensuring a withstand voltage between the gate electrode 27 and the source electrode 23s/the drain electrode 23d. Therefore, a finer element structure can be achieved.

Incidentally, when this eleventh embodiment is combined with the semiconductor apparatus of the second embodiment explained using FIG. 9, it suffices that the carrier supplying region 15a is provided in the middle portion of the first barrier layer 15 illustrated in FIG. 25 in the thickness direction, and substantially the same effects as those of the second embodiment can be obtained in combination.

In addition, when this eleventh embodiment is combined with the semiconductor apparatus of the third embodiment explained using FIG. 11, it suffices that the low-resistance region 16g illustrated in FIG. 25 is extended to a depth that reaches the carrier supplying region 15a, and substantially the same effects as those of the third embodiment can be obtained in combination.

Moreover, when this eleventh embodiment is combined with the semiconductor apparatus of the fourth embodiment explained using FIG. 12, it suffices that a portion surrounding the p-type low-resistance region 16g in the second barrier layer 16 illustrated in FIG. 25 is composed as a low-resistance region, and substantially the same effects as those of the fourth embodiment can be obtained in combination.

In addition, as other examples of cases where this eleventh embodiment is combined with each of the semiconductor apparatuses of the second through the fourth embodiments explained using FIG. 9 through 12, the eleventh embodiment can be applied to a configuration, for example, where a low-resistance region or a high-resistance region is provided as an upper layer than the carrier supplying region 15a within the first barrier layer 15, without providing the second barrier layer 16. In this case, the low-resistance region is formed by diffusion as the upper layer than the carrier supplying region 15a within the first barrier layer 15 made of, for example, the AlGaAs layer, and an isotropic etching is performed on the insulating film 21 made of silicon nitride ($Si_3N_4$) thereabove. This etching is performed in substantially the same procedures as those of the etching explained using FIG. 27A in the eleventh embodiment. Even in a case like this, the effects added in the eleventh embodiment can be obtained.

12. Twelfth Embodiment

Figure 29:
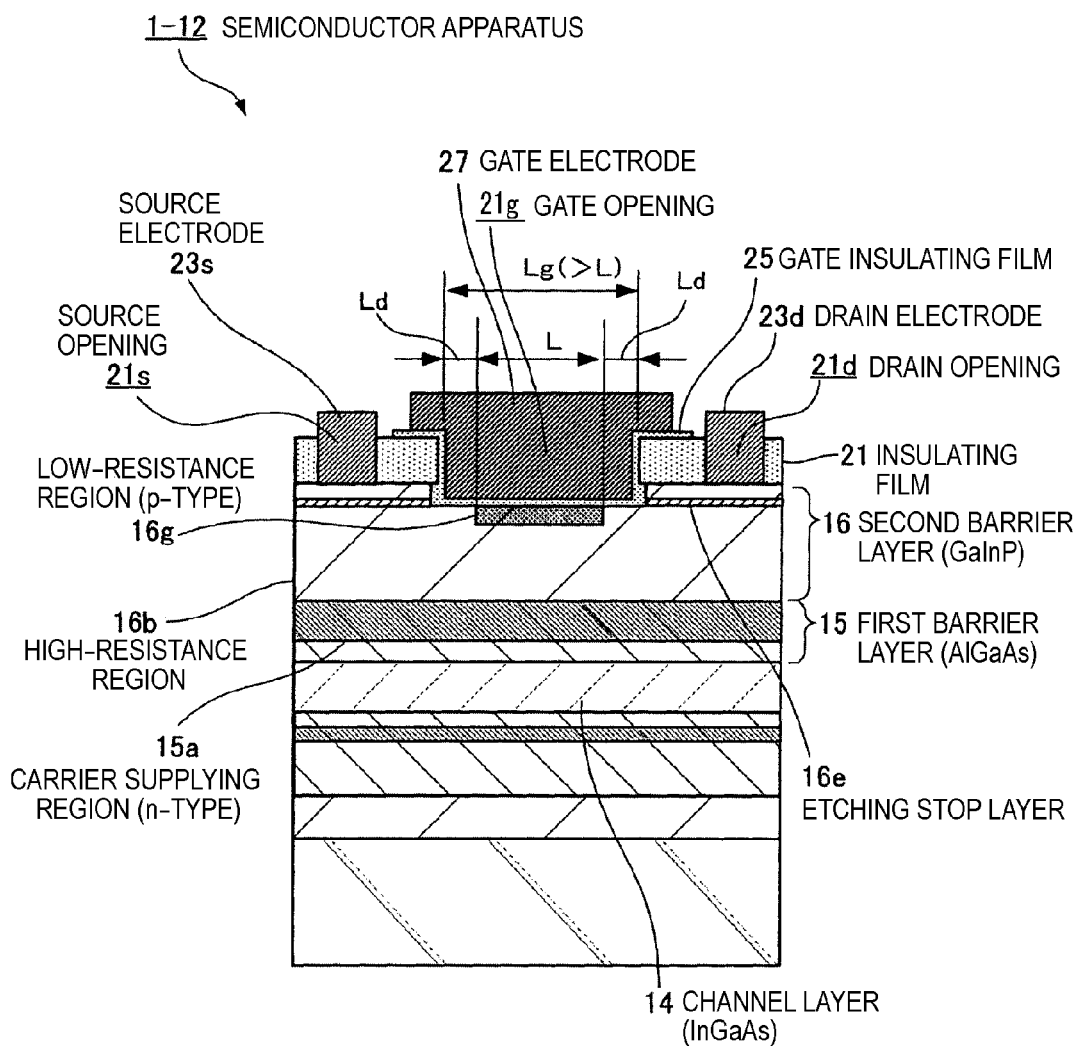
FIG. 29 is a cross-sectional view illustrating a principal configuration of a semiconductor apparatus of a twelfth embodiment.

A Second Example where the Gate Electrode Covering the Low-Resistance Region is Provided in Self-Alignment FIG. 29 is a cross-sectional view illustrating a principal configuration of a semiconductor apparatus of a twelfth embodiment. In the following, a configuration of the semiconductor apparatus of the twelfth embodiment to which the present technique is applied is explained based on this drawing.

Configuration of Semiconductor Apparatus of Twelfth Embodiment

A difference between a semiconductor apparatus 1-12 of this twelfth embodiment illustrated in FIG. 29 and the semiconductor apparatus of the first embodiment explained using FIG. 1 exists where the second barrier layer 16 is provided with an etching stop layer 16e, in addition to the differences in the previous eleventh embodiment (see FIG. 25). Therefore, here, a configuration of the twelfth embodiment is explained, centering on the difference from the eleventh embodiment.

Namely, in the semiconductor apparatus 1-12 of this twelfth embodiment, the etching stop layer 16e is provided on the upper surface side in the second barrier layer 16. Therefore, the second barrier layer 16 takes a 3-layer structure where the high-resistance region 16b, the etching stop layer 16e, and the high-resistance region 16b are layered in this order.

The etching stop layer 16e is composed of a material that has a smaller etching ratio than, and is lattice-matched to the other parts (namely, the high-resistance region 16b) that constitute the second barrier layer 16. In addition, the etching stop layer 16e ought to be a film thin to a degree that does not influence electric characteristics of the second barrier layer 16, and about 3 nm thick, for example. Here, because the second barrier layer 16 is composed of the GaInP mixed crystal, the etching stop layer 16e is composed of GaAs or AlGaAs.

The etching stop layer 16e as above is, for example, a middle layer at the upper surface side in the second barrier layer 16, and is provided at a depth, to a degree that allows the etching stop layer 16e not to be exposed, in the isotropic etching of the insulating film 21 during a manufacturing process explained next.

On top of the second barrier layer 16 having the etching stop layer 16e like this, the insulating film 21 provided with the gate opening 21g is provided. The entirety of the low-resistance region 16g is exposed at the bottom portion of the gate opening 21g, and the top thereof is covered by the gate insulating film 25, which are substantially the same as the eleventh embodiment. In addition, arrangement of the low-resistance region 16g at the bottom portion of the gate opening 21g is substantially the same as that of the eleventh embodiment. Namely, with a predetermined clearance Ld (Ld>0) left evenly from the circumferential edge of the gate electrode 21g covered by the gate insulating film 25, the low-resistance region 16g is in a state of being exposed at the center in the bottom portion of the gate opening 21g.

Specifically, in the semiconductor apparatus 1-12 of this twelfth embodiment, a depth of the gate opening 21g is craved into the surface layer of the second barrier layer 21 beyond the film thickness of the insulating film 21, and, furthermore, reaches a position deeper than the etching stop layer 16e. With this, at the bottom portion of the gate opening 21g, a part of the second barrier region 16, which is a lower layer than the etching stop layer 16e, is exposed, and the low-resistance region 16g provided in the second barrier region 16 is fully exposed through the gate opening 21g.

In addition, it is important that the gate electrode 27 is provided in a state of fully covering the bottom portion of the gate opening 21g, via the gate insulating film 25. An effective gate length Lg of the gate electrode 27 like this is a width of the bottom portion of the gate opening 21g, or more specifically an opening width of the gate opening 21g covered by the gate insulating film 25. Namely, a part functioning as the effective gate length Lg in the gate electrode 27 has a size that is extended by an extend of the clearance Ld beyond the length L of the low-resistance region 16g along the circumferential direction, and fully covers over the low-resistance region 16g.

Operations of Semiconductor Apparatus of Twelfth Embodiment

The semiconductor apparatus 1-12 having the configuration like this operates in substantially the same manner as the semiconductor apparatus of the first embodiment.

Manufacturing Method of Semiconductor Apparatus of Twelfth Embodiment

Figure 30:
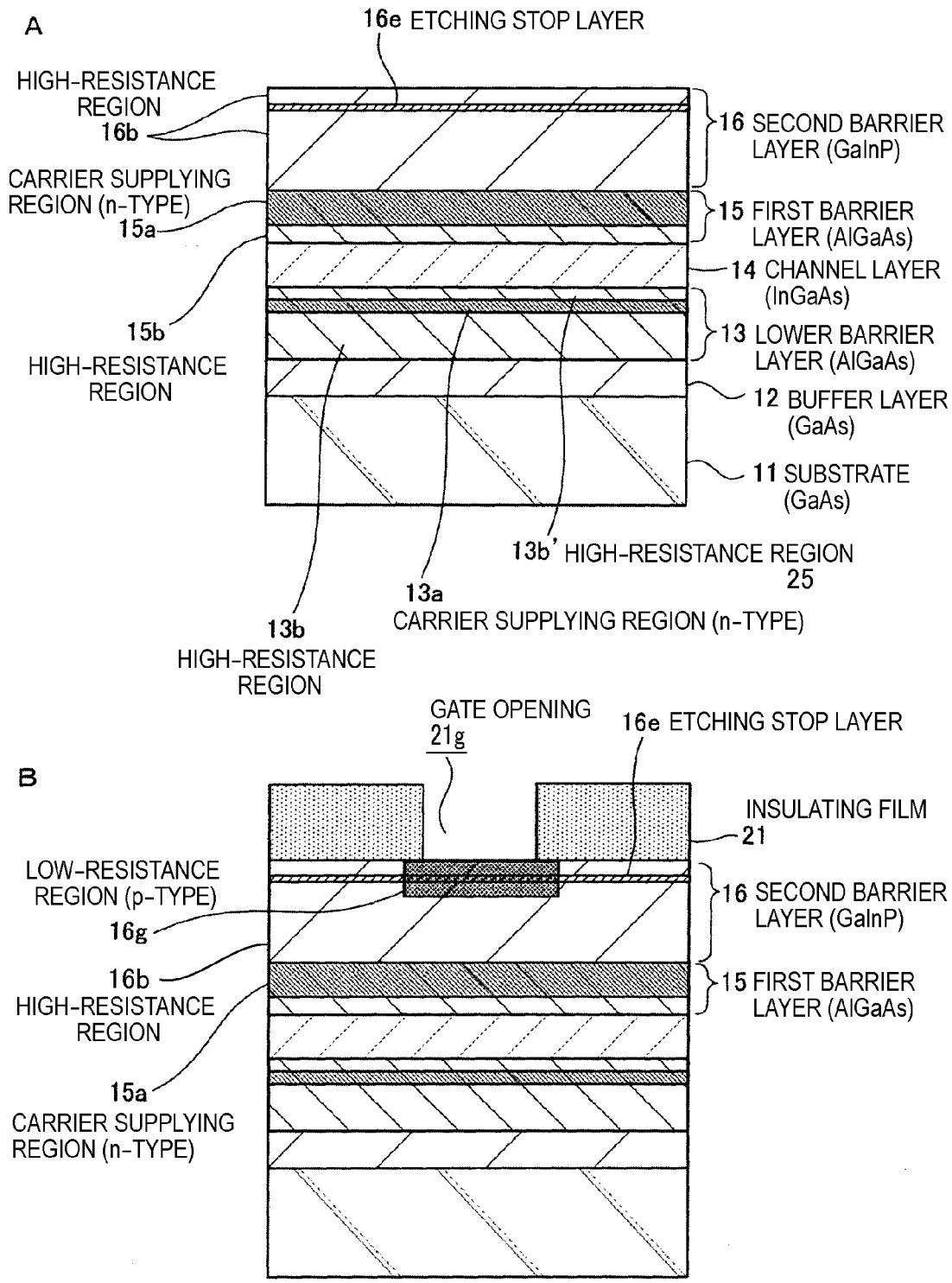
FIG. 30A is a cross-sectional process chart (part 1) illustrating a second example.
FIG. 30B is a cross-sectional process chart (part 1) illustrating the second example.

Next, one example of a manufacturing method of the semiconductor apparatus 1-12 of the configuration described above is explained based on cross-sectional process charts of FIG. 30 through FIG. 33.
[FIG. 30A]

First, as illustrated in FIG. 30A, the buffer layer 12, the lower barrier layer 13 of a 3-layer structure, the channel layer 14, the first barrier layer 15 of a 2-layer structure, the high-resistance region 16b of the second barrier layer 16, the etching stop layer 16e of the second barrier layer 16, and the high-resistance region 16b of the second barrier layer 16 are deposited in this order on the substrate 11. It suffices that a film deposition of each layer, including the etching stop layer 16e, may be performed by epitaxial growth from the lower layer side in series in substantially the same manner as explained in each embodiment, and after the film deposition of each layer, device isolation is formed. Incidentally, depending on a position where the etching stop layer 16e is formed, a distance between the channel layer 14 and the gate electrode formed in the following can be arbitrarily set.
[FIG. 30B]

Then, as illustrated in FIG. 30B, the insulating film 21 provided with the gate opening 21g is formed on the second barrier layer 16. At this time, as is the case with the eleventh embodiment, the insulating film 21 made of silicon nitride ($Si_3N_4$) is deposited by, for example, a Chemical Vapor Deposition (CVD) method, and then the insulating film 21 is pattern-etched, thereby to allow the upper surface of the second barrier layer 16 to be exposed, so that the gate opening 21g is formed in the insulating film 21.

In this state, by introducing p-type impurities from the upper surface of the second barrier layer 16 exposed at the bottom portion of the gate opening 21g, the p-type low-resistance region 16g is formed within the second barrier layer 16. At this time, it is important that the low-resistance region 16g is formed so as to extend to a position deeper than the etching stop layer 16e by diffusing zinc (Zn) as the p-type impurity to the position deeper than the etching stop layer 16e. Diffusion of zinc (Zn) is performed by vapor-phase diffusion using a zinc compound gas at a temperature of, for example, about 600° C., as is the case with the other embodiments. With this, the low-resistance region 16g is formed at the bottom portion of the gate opening 21g in self-alignment.
[FIG. 31A]

Next, as illustrated in FIG. 31A, by performing isotropic etching of the insulating film 21, the insulating film 21 is receded in the traverse direction, thereby to extend the width of the gate opening 21g. As the isotropic etching, wet-etching using a chemical solution of a hydrofluoric acid (HF) group or a phosphoric acid group, or plasma etching in the case of dry-etching is performed.

However, when the second barrier layer 16 of the GaInP layer that underlies the insulating film 21 is etched in the etching here, the high-resistance region 16b should remain on the etching stop layer 16e. In this case, it is preferable to perform the etching where a chemical solution having a low etching rate with respect to the second barrier layer 16 is selected.

On the other hand, when the second barrier layer 16 of the GaInP layer that underlies the insulating film 21 is not etched in the etching here, an etching process may be added in which the second barrier layer 16 is etched to a degree that the second barrier layer 16 is left extremely thin on top of the etching stop layer 16e by using a chemical solution of a hydrochloric acid group or a phosphoric acid group.
[FIG. 31B]

After the above, as illustrated in FIG. 31B, by a wet-etching method, the high-resistance region 16b on top of the etching stop layer 16e is removed, and, furthermore, the etching stop layer 16e is removed. Here, in order to control the etching of the etching stop layer 16e with a higher degree of accuracy, first, wet-etching of the high-resistance region 16b is performed by using a chemical solution having a low etching rate with respect to the etching stop layer 16e composed of GaAs. As such a chemical solution, for example, chemical solutions of a hydrochloric acid group or a phosphoric acid group are used. Then, in removal of the etching stop layer 16e composed of GaAs, wet-etching is performed using a chemical solution of a citric acid group.

Incidentally, in the wet-etching of the second barrier layer 16 and the etching stop layer 16e using the citric acid group chemical solution or the chemical solution of the hydrochloric acid group or the phosphoric acid group, the etching of the insulating film 21 is not promoted. Therefore, the etching stop layer 16e and the second barrier layer 16 below the insulating film 21 are isotropically etched, so that the insulating film 21 comes into a shape that slightly hangs over like a window roof.
[FIG. 32A]

As for the next processes in FIG. 32A and beyond, it suffices that substantially the same processes as the processes explained using FIG. 27B and beyond in the eleventh embodiment are performed.

Namely, first, the gate insulating film 25 is deposited on the insulating film 21 in a state of covering the second barrier layer 16 exposed through the gate opening 21g and the inner wall of the gate opening 21 whose width is extended.
[FIG. 32B]

Figure 33:
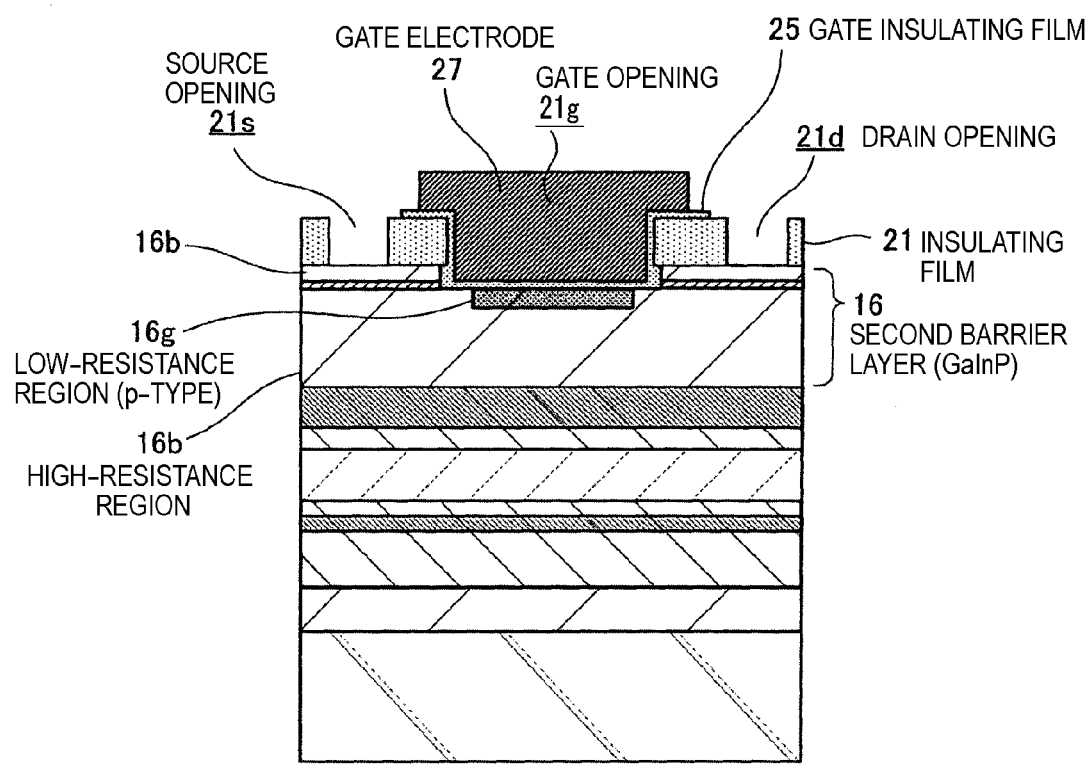
FIG. 33 is a cross-sectional process chart (part 4) illustrating the second example.

Next, as illustrated in FIG. 32B, the gate electrode 27 is formed in a state of fully covering the bottom portion of the gate opening 21g via the gate insulating film 25.
[FIG. 33]

After the above, as illustrated in FIG. 33, by pattern-etching the insulating film 21 and the gate insulating film 25, the source opening 21s and the drain opening 21d that allow the high-resistance region 16b of the second barrier layer 16 to be exposed are formed in corresponding positions across the low-resistance region 16g.
[FIG. 29]

Then, as illustrated in FIG. 29, the source electrode 23s and the drain electrode 23d are formed which are in ohmic contact with the high-resistance region 16b of the second barrier layer 16 through the source opening 21s and the drain opening 21d, respectively, so that the semiconductor apparatus 1-12 is completed.

By the above-explained manufacturing method, the semiconductor apparatus 1-12 of the twelfth embodiment can be formed. According to this method, the low-resistance region 16g is formed by the p-type impurity diffusion through the gate opening 21g formed in the insulating film 21, and after the insulating film 21 is receded in the traverse direction, the gate electrode 27 is formed via the gate electrode 25. Therefore, the gate electrode 27 of a shape that fully covers the low-resistance region 16g is formed over the low-resistance region 16g in self-alignment with respect to the low-resistance region 16g. Therefore, the semiconductor apparatus 1-12 of the twelfth embodiment can be obtained with ease.

Effects of Semiconductor Apparatus of Twelfth Embodiment

The semiconductor apparatus 1-12 explained above has the shape where the gate electrode 27 fully covers over the low-resistance region 16g. Therefore, when a gate voltage (a positive voltage) is applied to the gate electrode 27, it becomes easy to make the p-type low-resistance region 16g fully depleted, as is the case with the eleventh embodiment. Namely, carrier depleted regions are prevented from coming into existence in gate edge portions within the channel layer 14 at the time of the ON operation, and parasitic resistance can be prevented from increasing. As a result, effects can be expected which lower the ON resistance Ron and, furthermore, increase the maximum drain current Idmax.

In addition, because the gate electrode 27 is formed in self-alignment with respect to the low-resistance region 16g, a margin can be reduced as for a clearance for ensuring a withstand voltage between the gate electrode 27 and the source electrode 23s/the drain electrode 23d. Therefore, a finer element structure can be achieved.

And, specifically, when the etching stop layer 16e is provided in the middle layer at the upper surface side in the second barrier layer 16, and the width of the gate opening 21g of the insulating film 21 is extended, the procedure is taken in which after the etching is once stopped at the upper portion of the etching stop layer 16e, the etching stop layer 16e is removed by wet-etching. Therefore, the upper surface of the low-resistance region 16g, which is a bottom surface of the etching, or a boundary face with the gate insulating film 25 can be a surface where damages at the time of forming the low-resistance region 16g and damages at the time of pattern-etching the insulating film 21 are removed, thereby to make the upper surface whose damages are suppressed to minimum. With excellent interfacial properties, reduction of a drain current Id or the like can be circumvented. Besides, because an etching depth can be controlled by a film deposition designing of the etching stop layer 16e, controllability of a distance between the gate insulating film 25 and the channel layer 14 is excellent, and device characteristic uniformity is also excellent.

Incidentally, in this twelfth embodiment, the configuration where the etching stop layer 16e is provided as the middle layer at the upper surface side in the second barrier layer 16 is explained. However, the etching stop layer 16e may be provided as a layer that constitutes the surface layer of the second barrier layer 16. In this case, it suffices that after the low-resistance region 16g is formed and the gate opening 21g of the insulating film 21 is widened, the etching stop layer 16e made of GaAs is removed by the wet-etching using the chemical solution of the citric acid group.

In addition, when this twelfth embodiment is combined with the semiconductor apparatus of the second embodiment explained using FIG. 9, it suffices that the carrier supplying region 15a is provided in the middle portion of the first barrier layer 15 illustrated in FIG. 29 in the thickness direction, and substantially the same effects as those of the second embodiment can be obtained.

Moreover, when this twelfth embodiment is combined with the semiconductor apparatus of the third embodiment explained using FIG. 11, it suffices that the low-resistance region 16g illustrated in FIG. 29 is extended to a depth that reaches the carrier supplying region 15a, and substantially the same effects as those of the third embodiment can be obtained.

Furthermore, when this twelfth embodiment is combined with the semiconductor apparatus of the fourth embodiment explained using FIG. 12, it suffices that a portion surrounding the p-type low-resistance region 16g in the second barrier layer 16 illustrated in FIG. 29 is composed as the low-resistance region 16, and substantially the same effects as those of the fourth embodiment can be obtained.

In addition, as other examples of cases where this twelfth embodiment is combined with each of the semiconductor apparatuses of the second through the fourth embodiments explained using FIG. 9 through 12, the twelfth embodiment can be applied to a configuration where a low-resistance region or a high-resistance region is provided as an upper layer than the carrier supplying region 15a within the first barrier layer 15, for example, without providing the second barrier layer 16. In this case, it suffices that the etching stop layer composed of the AlAs layer is provided as the surface layer or middle layer in the upper layer side than the carrier supplying region 15a within the first barrier layer 15 composed of, for example, the AlGaAs layer, and the low-resistance region is formed by diffusion to a depth exceeding this etching stop layer. Even in this case, the isotropic etching of the insulating film 21 made of silicon nitride ($Si_3N_4$) is performed in substantially the same procedures as those explained using FIG. 31A and FIG. 31B in the twelfth embodiment. Even in a case like this, the effects added in the twelfth embodiment can be obtained.

13. Thirteenth Embodiment

Figure 34:
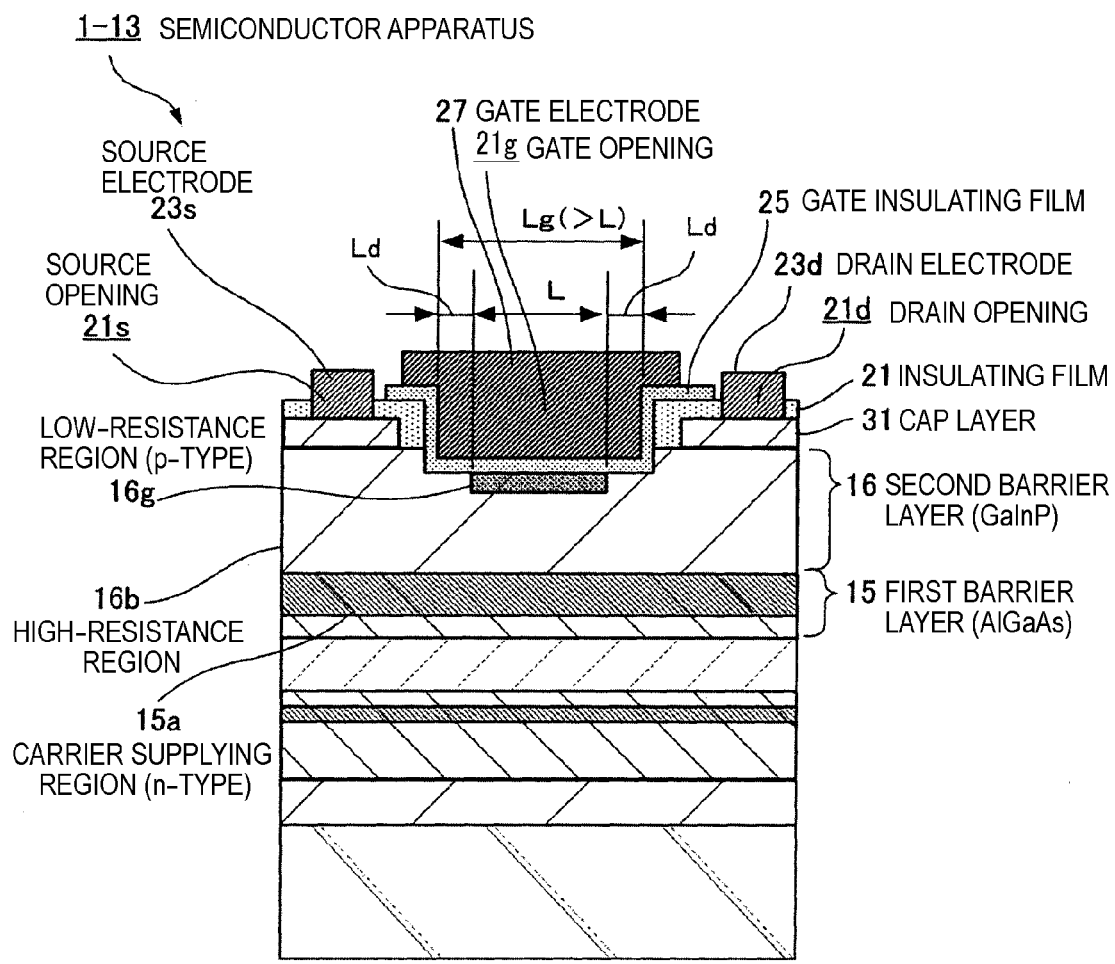
FIG. 34 is a cross-sectional view illustrating a principal configuration of a semiconductor apparatus of a thirteenth embodiment.
Figure 36:
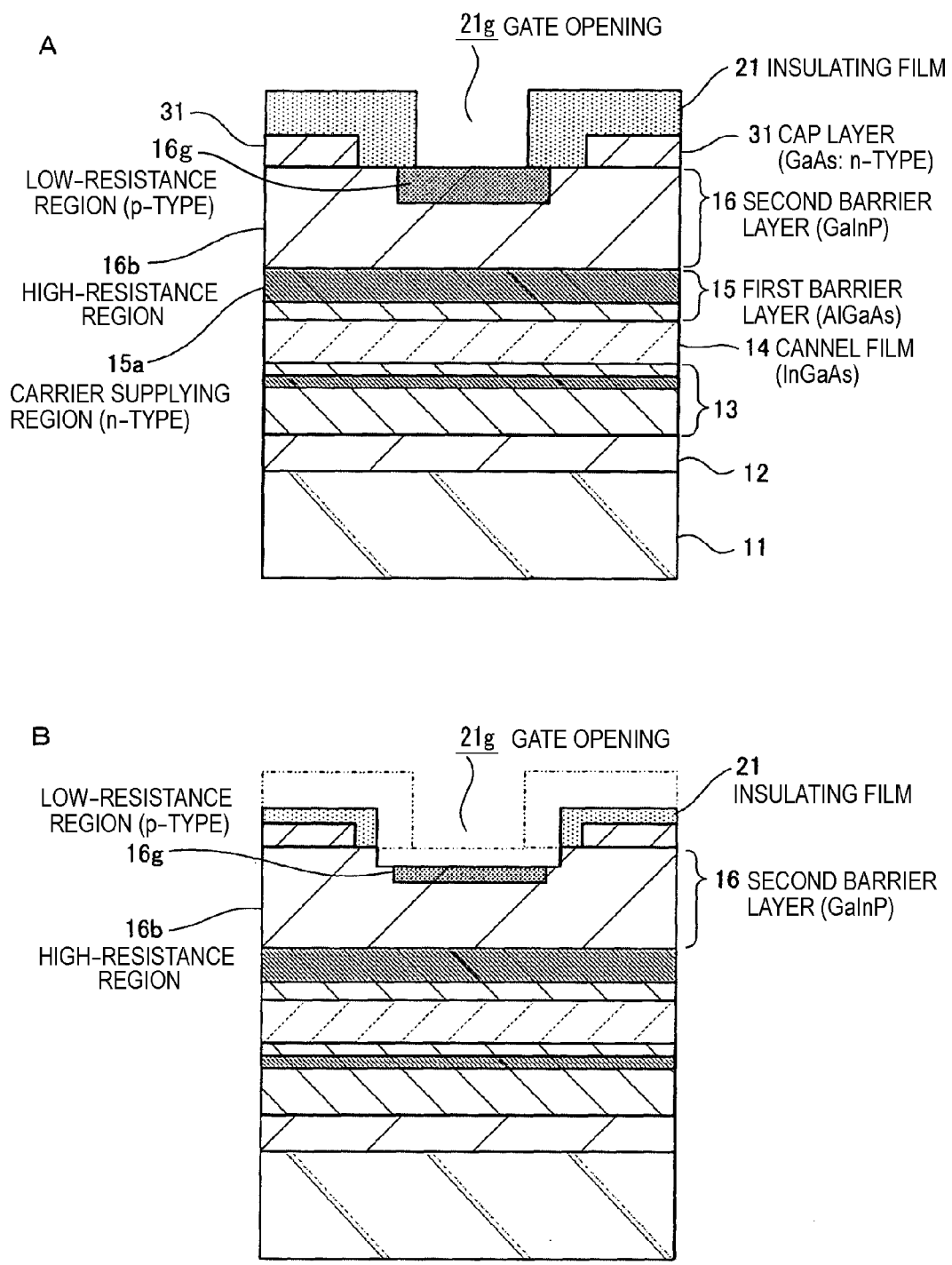
FIG. 36 is a cross-sectional process chart (part 2) illustrating the third example.

A Third Example where the Gate Electrode Covering the Low-Resistance Region is Provided in Self-Alignment FIG. 34 is a cross-sectional view illustrating a principal configuration of a semiconductor apparatus of a thirteenth embodiment. In the following, a configuration of the semiconductor apparatus of the thirteenth embodiment to which the present technique is applied is explained based on this drawing.

Configuration of Semiconductor Apparatus of Thirteenth Embodiment

A difference between a semiconductor apparatus 1-13 of this thirteenth embodiment illustrated in FIG. 34 and the semiconductor apparatus of the first embodiment explained using FIG. 1 exists where the cap layer 31 is provided between the second barrier layer 16 and the source electrode 23s/the drain electrode 23d, in addition to the differences in the previous eleventh embodiment (see FIG. 25). Namely, this thirteenth embodiment is of a configuration into which the eleventh embodiment and the fifth embodiment (see FIG. 13) are combined.

Namely, in the semiconductor apparatus 1-13 of this thirteenth embodiment, the cap layer 31 containing impurities of a conduction type opposite to that in the low-resistance region 16g is provided between the second barrier layer 16 and the source electrode 23s/the drain electrode 23d. It suffices that the cap layer 31 like this is composed of a compound semiconductor material lattice-matched to the second barrier layer 16, and is not necessary to be in agreement with the second barrier layer 16 in terms of a band gap. However, when the band gaps are extremely different, a potential barrier is caused at the junction portion, which may lead to an increased resistance in the ohmic contact. Therefore, the band gap of the cap layer 31 should be in agreement with that of the second barrier layer 16 serving as the underlying layer within a range that does not influence the characteristics of the semiconductor apparatus 1-13.

When the second barrier layer 16 is made of the GaInP mixed crystal, the cap layer 31 as above ought to be composed of GaAs containing, for example, the n-type impurities.

In addition, on top of the second barrier layer 16, the insulating film 21 is provided in a state of covering the cap layer 31. The entirety of the low-resistance region 16g is exposed at the bottom portion of the gate opening 21 provided in the insulating film 21, and the top thereof is covered by the gate insulating film 25, which is substantially the same as the eleventh embodiment. Moreover, an arrangement of the low-resistance region 16g at the bottom portion of the gate opening 21g is substantially the same as that in the eleventh embodiment. Namely, with a predetermined clearance Ld (Ld>0) left evenly from the circumferential edge of the gate electrode 21g covered by the gate insulating film 25, the low-resistance region 16g is in a state of being exposed at the center in the bottom portion of the gate opening 21g.

Operations of Semiconductor Apparatus of Thirteenth Embodiment

The semiconductor apparatus 1-13 having the configuration like this operates in substantially the same manner as the semiconductor apparatus of the first embodiment.

Manufacturing Method of Semiconductor Apparatus of Thirteenth Embodiment

Next, one example of a manufacturing method of the semiconductor apparatus 1-13 of the configuration described above is explained based on cross-sectional process charts of FIG. 35 through FIG. 38.

[FIG. 35A]

First, as illustrated in FIG. 35A, the buffer layer 12, the lower barrier layer 13 of a 3-layer structure, the channel layer 14, the first barrier layer 15 of a 2-layer structure, the second barrier layer 16 (the low-resistance region 16b), and, furthermore, the n-type GaAs layer that turns out to be the cap layer 31 are deposited in this order on the substrate 11. It suffices that a film deposition of each layer may be performed by epitaxial growth from the lower layer side in series in substantially the same manner as explained in each embodiment, and after the film deposition of each layer, device isolation is formed. Then, the n-type GaAs layer is pattern-etched, thereby to form the cap layer 31.

[FIG. 35B]

Next, as illustrated in FIG. 35B, the insulating film 21 is formed in a state of covering the cap layer 31, and the gate opening 21g is formed in the insulating film 21. It suffices that this process is performed by substantially the same procedures as explained using FIG. 5B in the first embodiment. Namely, here, the insulating film 21 made of silicon nitride ($Si_3N_4$) is deposited in a state of covering the cap layer 31 on the second barrier layer 16 by, for example, a Chemical Vapor Deposition (CVD) method. Then, by pattern-etching the insulating film 21, the gate opening 21g that allows the upper surface of the second barrier layer 16 to be exposed is formed in the insulating film 21. The gate opening 21g is formed in a position that does not allow the cap layer 31 to be exposed.

[FIG. 36A]

Next, as illustrated in FIG. 36A, by introducing the p-type impurities from the surface layer of the second barrier layer 16 exposed at the bottom portion of the gate opening 21g, the p-type low-resistance region 16g is formed within the second barrier layer 16. Here, as illustrated, zinc (Zn) serving as the p-type impurity is diffused until a position that does not reach the carrier supplying region 15a, or only in the surface layer within the second barrier layer 16, thereby to form the low-resistance region 16g. Diffusion of zinc (Zn) is performed by vapor-phase diffusion using a zinc compound gas at a temperature of, for example, about 600° C. With this, the low-resistance region 16g is formed at the bottom portion of the gate opening 21g in self-alignment.

[FIG. 36B]

Next, as for the next processes in FIG. 36B and beyond, it suffices that substantially the same processes as the processes explained using FIG. 27A and beyond in the eleventh embodiment are performed.

Namely, first, by performing isotropic etching of the insulating film 21, the insulating film 21 is made receded in the traverse direction, thereby to extend a width of the gate opening 21g. Here, the second barrier layer 16 of the GaInP layer that underlies the insulating film 21 is also etched.

[FIG. 37A]

Next, as illustrated in FIG. 37A, the gate insulating film 25 is deposited in a state of covering the second barrier layer 16 exposed through the gate opening 21g and the inner wall of the gate opening 21g whose width has been extended.

[FIG. 37B]

Next, as illustrated in FIG. 37B, the gate electrode 27 is formed in a state of fully covering the bottom portion of the gate opening 21g via the gate insulating film 25.

[FIG. 38]

Figure 38:
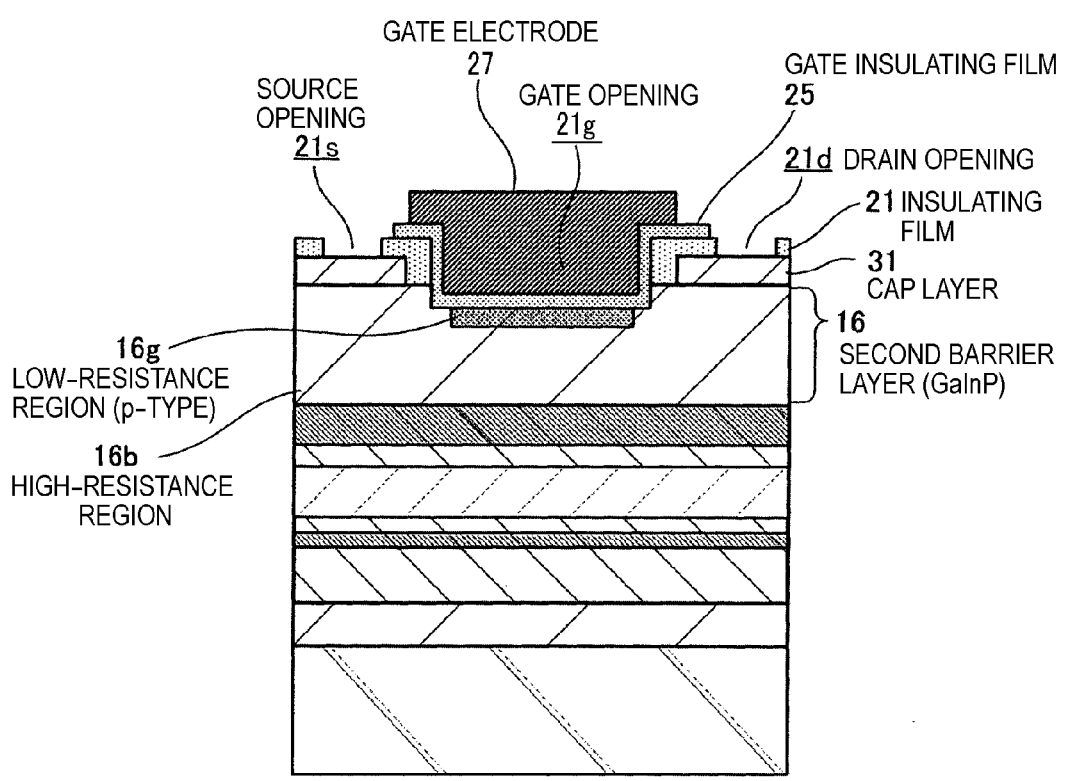
FIG. 38 is a cross-sectional process chart (part 4) illustrating the third example.

After the above, as illustrated in FIG. 38, by pattern-etching the gate insulating film 25 and the insulating film 21, the source opening 21s and the drain opening 21d that allow the cap layer 31 to be exposed are formed in corresponding positions across the low-resistance region 16g.

[FIG. 34]

Then, as illustrated in FIG. 34, the source electrode 23s and the drain electrode 23d are formed which are in ohmic contact with the cap layer 31 through the source opening 21s and the drain opening 21d, respectively, so that the semiconductor apparatus 1-13 is completed.

By the above-explained manufacturing method, the semiconductor apparatus 1-13 of the thirteenth embodiment can be formed. According to this method, the low-resistance region 16g is formed by the p-type impurity diffusion through the gate opening 21g formed in the insulating film 21, and after the insulating film 21 is receded in the traverse direction, the gate electrode 27 is formed via the gate electrode 25. Therefore, the gate electrode 27 of a shape that fully covers the low-resistance region 16g is formed over the low-resistance region 16g in self-alignment with respect to the low-resistance region 16g. Therefore, the semiconductor apparatus 1-13 of the thirteenth embodiment can be obtained with ease.

Effects of Semiconductor Apparatus of Thirteenth Embodiment

The semiconductor apparatus 1-13 explained above has the shape where the gate electrode 27 fully covers over the low-resistance region 16g. Therefore, when a gate voltage (a positive voltage) is applied to the gate electrode 27, it becomes easy to make the p-type low-resistance region 16g fully depleted, as is the case with the eleventh embodiment.

Namely, carrier depleted regions are prevented from coming into existence in gate edge portions within the channel layer 14 at the time of the ON operation, and parasitic resistance can be prevented from increasing. As a result, effects can be expected which lower the ON resistance Ron and, furthermore, increase the maximum drain current Idmax.

In addition to the above, because of the configuration where the cap layer 31 made of the compound semiconductor is provided between the second barrier layer 16 and the source electrode 23s/the drain electrode 23d, a sheet carrier density in the channel layer 14 immediately below the cap layer 31 can be increased. Also with this, effects can be expected which reduce the channel resistance and the access resistance, thereby to lower the ON resistance Ron, and, furthermore, increase the maximum drain current Idmax.

In addition, because the gate electrode 27 is formed in self-alignment with respect to the low-resistance region 16g, a margin can be reduced as for a clearance for ensuring a withstand voltage between the gate electrode 27 and the source electrode 23s/the drain electrode 23d. Therefore, a finer element structure can be achieved.

Incidentally, when this thirteenth embodiment is combined with the semiconductor apparatus of the second embodiment explained using FIG. 9, it suffices that the carrier supplying region 15a is provided in the middle portion of the first barrier layer 15 illustrated in FIG. 34 in the thickness direction, and substantially the same effects as those of the second embodiment can be obtained in combination.

In addition, when this thirteenth embodiment is combined with the semiconductor apparatus of the third embodiment explained using FIG. 11, it suffices that the low-resistance region 16g illustrated in FIG. 34 is extended to a depth that reaches the carrier supplying region 15a, and substantially the same effects as those of the third embodiment can be obtained in combination.

Moreover, when this thirteenth embodiment is combined with the semiconductor apparatus of the fourth embodiment explained using FIG. 12, it suffices that a part surrounding the p-type low-resistance region 16g in the second barrier layer 16 illustrated in FIG. 34 is composed as the low-resistance region 16a, and substantially the same effects as those of the fourth embodiment can be obtained in combination.

In addition, as other examples of cases where this thirteenth embodiment is combined with each of the semiconductor apparatuses of the second through the fourth embodiments explained using FIG. 9 through 12, the thirteenth embodiment can be applied to a configuration where a low-resistance region or a high-resistance region is provided as an upper layer than the carrier supplying region 15a within the first barrier layer 15, for example, without providing the second barrier layer 16. In this case, the low-resistance region is formed by diffusion in the upper layer than the carrier supplying region 15a within the first barrier layer 15 composed of, for example, the AlGaAs layer, and in the above, an isotropic etching of the insulating film 21 made of silicon nitride ($Si_3N_4$) is performed. This etching is performed by substantially the same procedures as those explained using FIG. 27A in the eleventh embodiment. Even in a case like this, the effects added in the thirteenth embodiment can be obtained.

14. Fourteenth Embodiment

Figure 39:
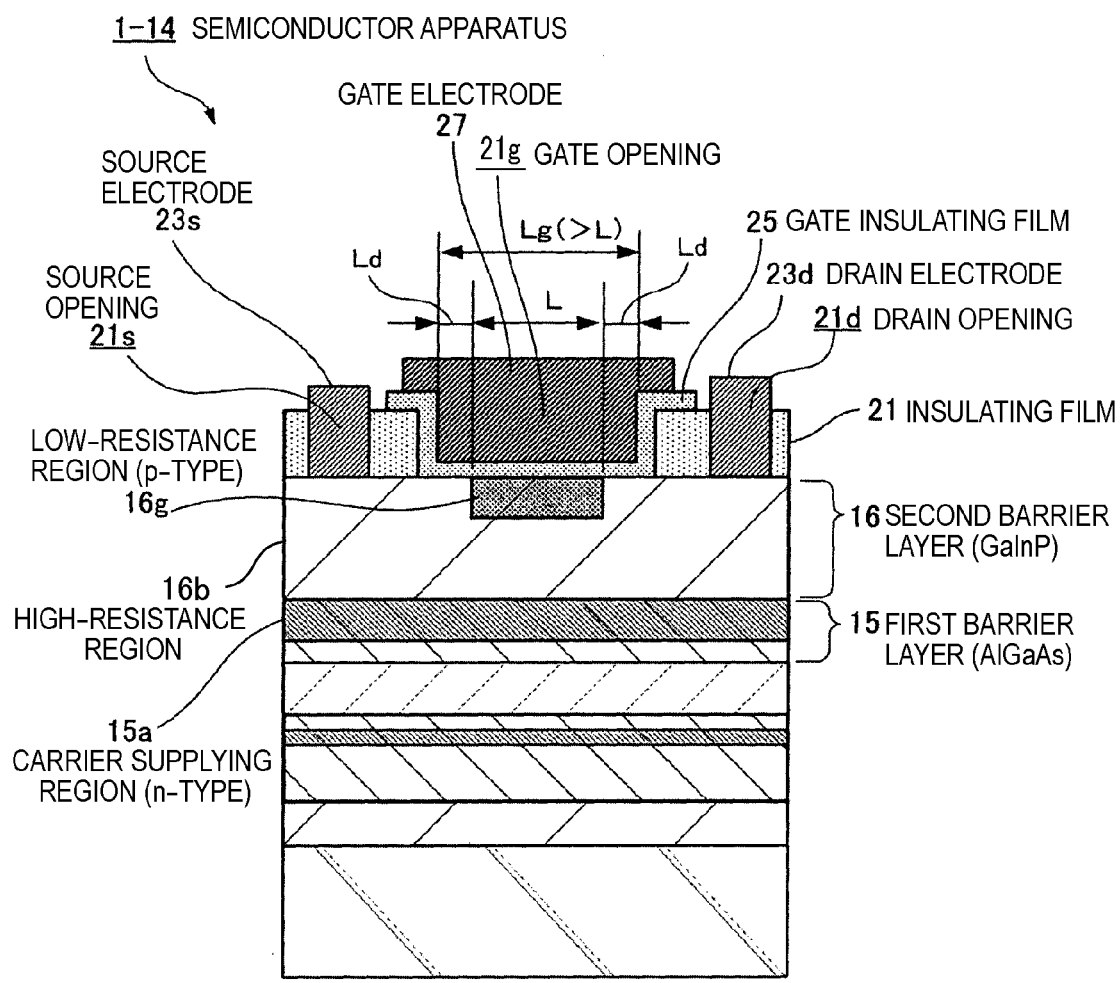
FIG. 39 is a cross-sectional view illustrating a principal configuration of a semiconductor apparatus of a fourteenth embodiment.

A Fourth Example where the Gate Electrode Covering the Low-Resistance Region is Provided in Self-Alignment FIG. 39 is a cross-sectional view illustrating a principal configuration of a semiconductor apparatus of a fourteenth embodiment. In the following, a configuration of the semiconductor apparatus of the fourteenth embodiment to which the present technique is applied is explained based on this drawing.

Configuration of Semiconductor Apparatus of Fourteenth Embodiment

Differences between a semiconductor apparatus 1-14 of this fourteenth embodiment illustrated in FIG. 39 and the semiconductor apparatus of the first embodiment explained using FIG. 1 exist where the gate electrode 27 covers the low-resistance region 16g, and the gate electrode 27 is formed in self-alignment with respect to the low-resistance region 16g. The other configurations are substantially the same as those of the first embodiment. Therefore, here, a configuration of the fourteenth embodiment is explained, centering on the difference with respect to the eleventh embodiment.

Namely, in the semiconductor apparatus 1-14 of this fourteenth embodiment, the insulating film 21 provided with the gate opening 21g is provided on top of the second barrier layer 16; the entirety of the low-resistance region 16g is exposed at the bottom portion of the gate opening 21g; and the top thereof is covered by the gate insulating film 25, which are substantially the same as the first embodiment. In addition, a disposed state of the low-resistance region 16g at the bottom portion of the gate opening 21g is substantially the same as that in the eleventh embodiment, and, with a predetermined clearance Ld (Ld>0) left evenly from the circumferential edge of the gate electrode 21g covered by the gate insulating film 25, the low-resistance region 16g is in a state of being exposed at the center in the bottom portion of the gate opening 21g.

In addition, it is important that the gate electrode 27 is provided in a state of fully covering the bottom portion of the gate opening 21g, via the gate insulating film 25. An effective gate length Lg of the gate electrode 27 like this is a width of the bottom portion of the gate opening 21g, or more specifically an opening width of the gate opening 21g covered by the gate insulating film 25. Namely, a part functioning as the effective gate length Lg in the gate electrode 27 has a size whose width is extended radially beyond the length L of the low-resistance region 16g by an extent of the clearance Ld, and is provided so as to fully cover over the low-resistance region 16g.

Operations of Semiconductor Apparatus of Fourteenth Embodiment

The semiconductor apparatus 1-14 having the configuration like this operates in substantially the same manner as the semiconductor apparatus of the first embodiment.

Manufacturing Method of Semiconductor Apparatus of Fourteenth Embodiment

Figure 40:
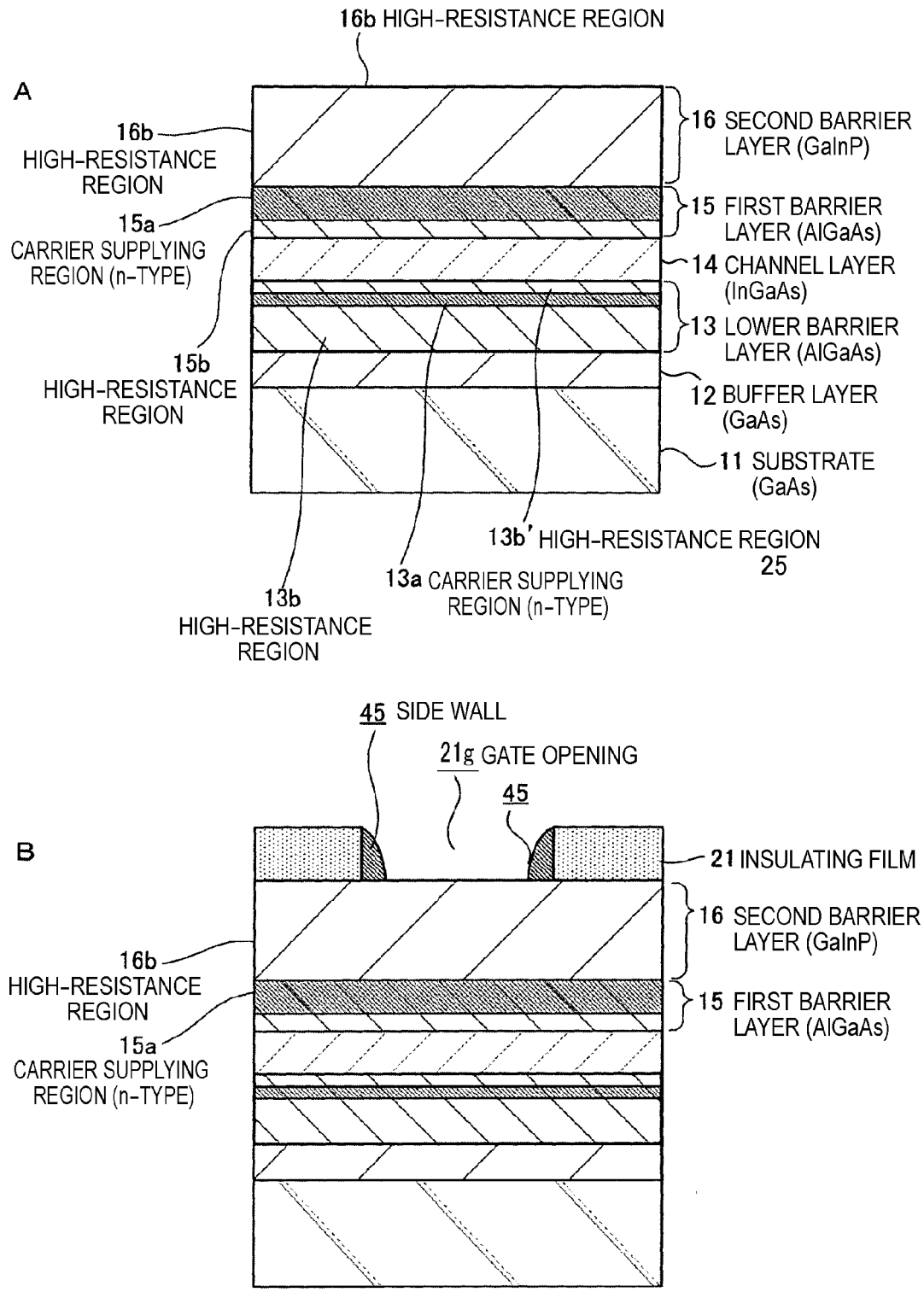
FIG. 40A is a cross-sectional process chart (part 1) illustrating a fourth example.
FIG. 40B is a cross-sectional process chart (part 1) illustrating the fourth example.
Figure 41:
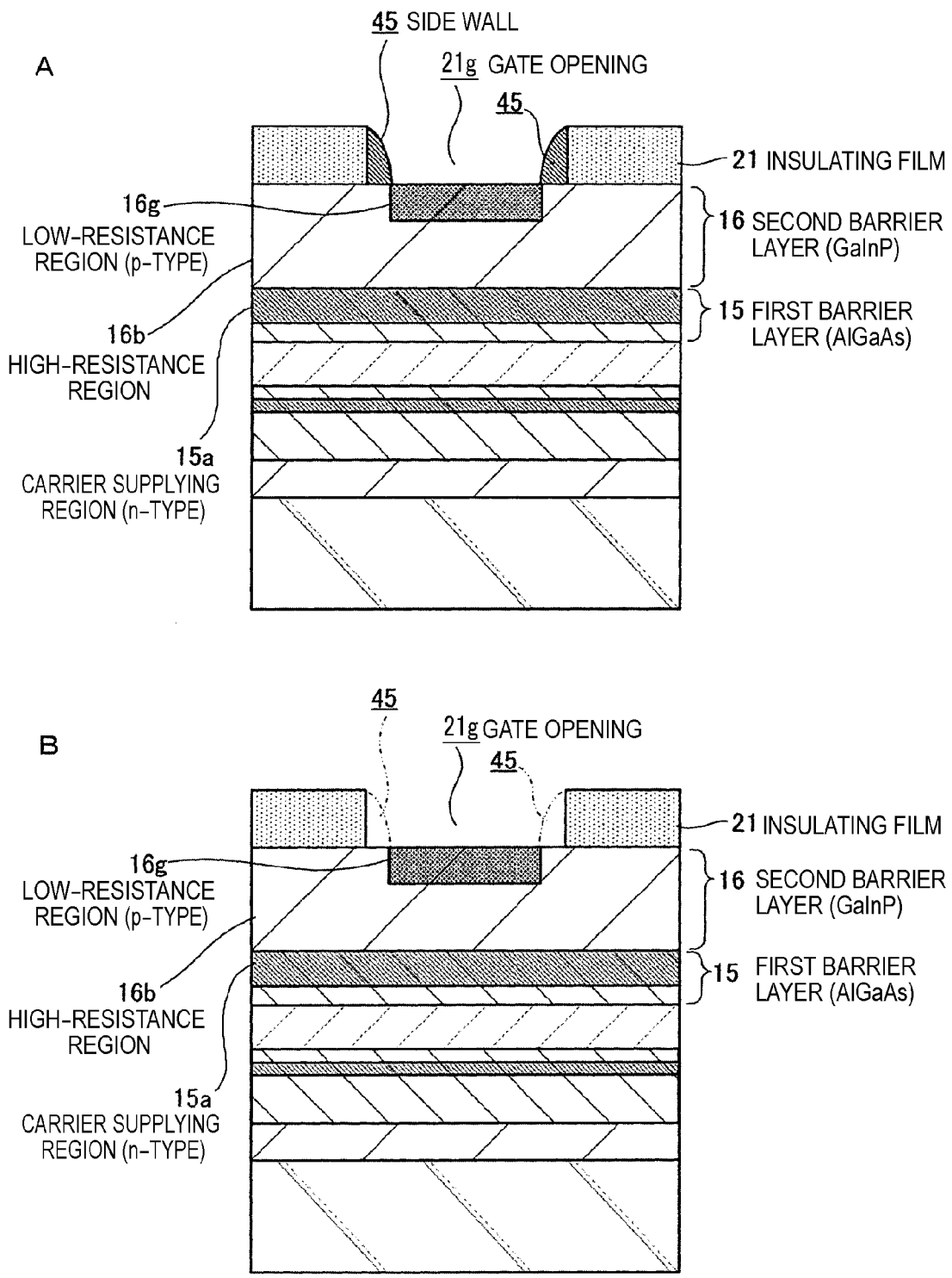
FIG. 41A is a cross-sectional process chart (part 2) illustrating the fourth example.
FIG. 41B is a cross-sectional process chart (part 2) illustrating the fourth example.
Figure 42:
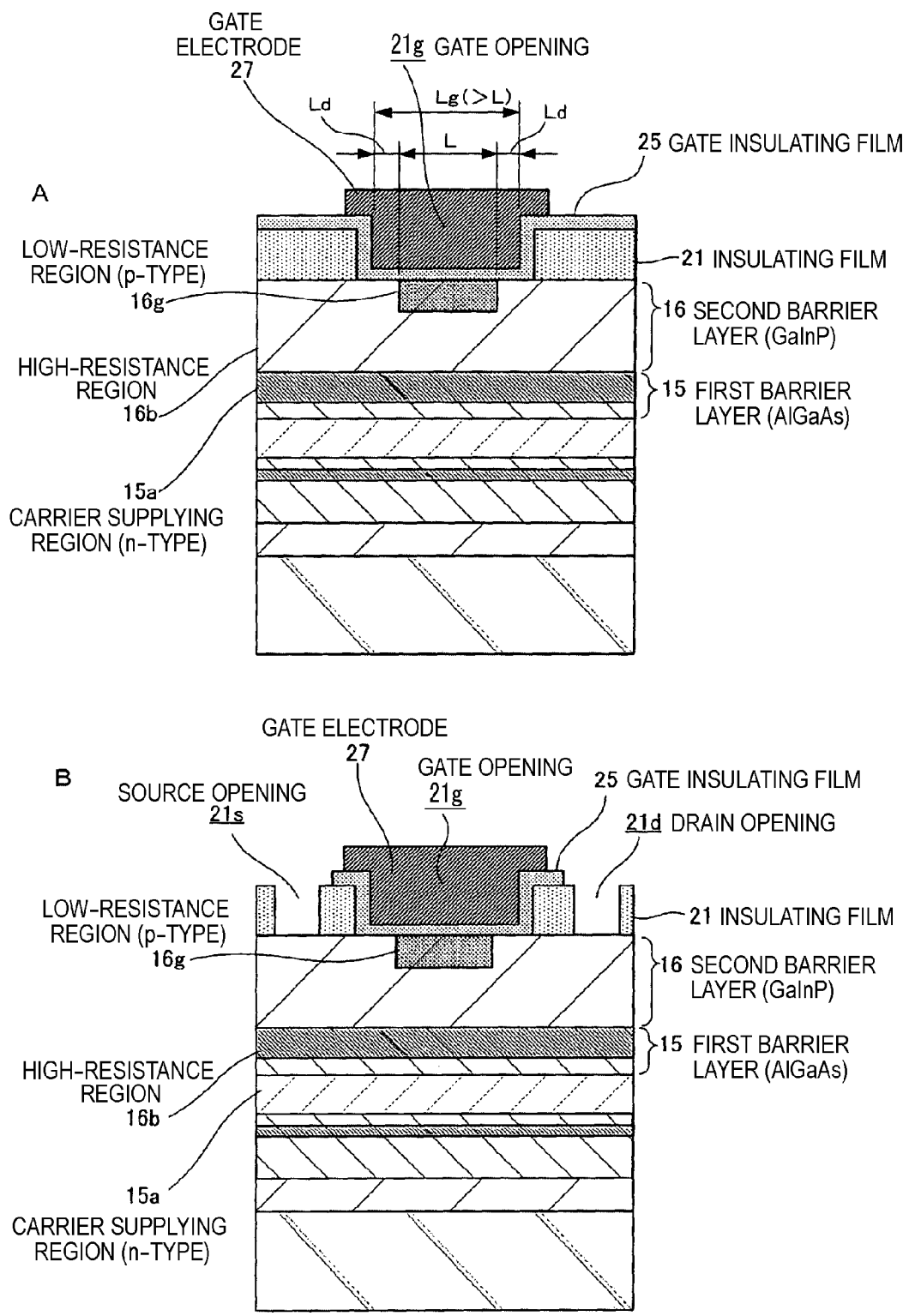
FIG. 42A is a cross-sectional process chart (part 3) illustrating the fourth example.
FIG. 42B is a cross-sectional process chart (part 3) illustrating the fourth example.

Next, one example of a manufacturing method of the semiconductor apparatus 1-14 described above is explained based on cross-sectional process charts of FIG. 40 through FIG. 42.

[FIG. 40A]

First, as illustrated in FIG. 40A, the buffer layer 12, the lower barrier layer 13 of a 3-layer structure, the channel layer 14, the first barrier layer 15 of a 2-layer structure, and the second barrier layer 16 (the low-resistance region 16b) are deposited in this order on the substrate 11. It suffices that a film deposition of each layer may be performed by epitaxial growth from the lower layer side in series in substantially the same manner as explained in each embodiment, and after the film deposition of each layer, device isolation is formed.

[FIG. 40B]

Then, as illustrated in FIG. 40B, the insulating film 21 provided with the gate opening 21g is formed on the second barrier layer 16. At this time, as is the case with the eleventh embodiment, the insulating film 21 made of silicon nitride ($Si_3N_4$) is deposited by, for example, a Chemical Vapor Deposition (CVD) method, and then, by pattern-etching the insulating film 21, the gate opening 21g that allows the upper surface of the second barrier layer 16 to be exposed is formed in the insulating film 21.

Next, a side wall 45 is formed on a side wall of the insulating film 21, so that a width of the gate opening 21g is narrowed by an extent of widths of the side wall 45. Here, first, a material film that forms the side wall 45 is deposited in a state of covering the insulating film 21. This material film is composed by using a material whose etching ratio with respect to the insulating film 21 and the second barrier layer 16 becomes high. Here, the material film composed of silicon nitride, aluminum oxide, or aluminum nitride, of which etching rates are controlled, is formed by, for example, a deposition method. However, when the side wall 45 is formed by using silicon nitride that is the same material as that of the insulating film 21, an insulating film made of silicon nitride ($Si_3N_4$), of which etching rate in isotropic etching performed subsequently is controlled, is deposited by adjusting flow rates of nitrogen gas ($N_2$) and ammonia gas ($NH_3$) used as a deposition gas.

Next, the deposited material film is anisotropically etched by dry-etching, and is left only on the side wall of the insulating film 21. With this, on the side wall of the insulating film 21, the side wall 45 composed of the previous material film is formed, thereby to narrow the width of the gate opening 21g.

[FIG. 41A]

Next, as illustrated in FIG. 41A, by introducing the p-type impurities from the bottom portion of the gate opening 21g narrowed by the side wall 45, the p-type low-resistance region 16g is formed. Here, as illustrated, zinc (Zn) serving as the p-type impurity is diffused until a position that does not reach the carrier supplying region 15a, or only in the surface layer within the second barrier layer 16, thereby to form the low-resistance region 16g. Diffusion of zinc (Zn) is performed by vapor-phase diffusion using a zinc compound gas at a temperature of, for example, about 600° C. With this, the low-resistance region 16g is formed at the bottom portion of the gate opening 21g in self-alignment.

[FIG. 41B]

Then, as illustrated in FIG. 41B, the side wall 45 composed of silicon nitride ($Si_3N_4$) is selectively etched and thus removed, with respect to the insulating film 21 composed of silicon nitride ($Si_3N_4$) and the second barrier layer 16 composed of the GaInP mixed crystal. As the etching like this, a wet-etching using a chemical solution of, for example, hydrofluoric acid (HF) group, or a plasma-etching in the case of a dry-etching is performed. With this, the opening width of the gate opening 21g is widened.

[FIG. 42A]

Then, as for processes in FIG. 42A and beyond, it suffices that substantially the same processes as the processes explained using FIG. 27B and beyond in the eleventh embodiment are performed.

Namely, first, the gate insulating film 25 is deposited on the insulating film 21 in a state of covering the second barrier layer 16 exposed through the gate opening 21g and the inner wall of the gate opening 21g whose width has been extended.

Next, the gate electrode 27 is formed in a state of fully covering the bottom portion of the gate opening 21g via the gate insulating film 25.

[FIG. 42B]

After the above, as illustrated in FIG. 42B, by pattern-etching the gate insulating film 25 and the insulating film 21, the source opening 21s and the drain opening 21d that allow the high-resistance region 16b of the second barrier layer 16 to be exposed are formed in corresponding positions across the low-resistance region 16g.

[FIG. 39]

Then, as illustrated in FIG. 39, the source electrode 23s and the drain electrode 23d are formed which are in ohmic contact with the high-resistance region 16b of the second barrier layer 16 through the source opening 21s and the drain opening 21d, respectively, thereby to complete the semiconductor apparatus 1-14.

By the above-explained manufacturing method, the semiconductor apparatus 1-14 of the fourteenth embodiment can be formed. According to this method, the low-resistance region 16g is formed by diffusing the p-type impurities from the gate opening 21g provided with the side wall 45, and after the side wall 45 is removed by the wet-etching thereby to extend the width of the gate opening 21g, the gate electrode 27 is formed via the gate insulating film 25. Therefore, the gate electrode 27 of the shape that fully covers the low-resistance region 16g is formed in self-alignment over the low-resistance region 16g. Therefore, the semiconductor apparatus 1-14 of the fourteenth embodiment can be obtained with ease.

Effects of Semiconductor Apparatus of Fourteenth Embodiment

The semiconductor apparatus 1-14 explained above has the shape where the gate electrode 27 fully covers over the low-resistance region 16g. Therefore, when a gate voltage (a positive voltage) is applied to the gate electrode 27, it becomes easy to make the p-type low-resistance region 16g fully depleted, as is the case with the eleventh embodiment. Namely, carrier depleted regions are prevented from coming into existence in gate edge portions within the channel layer 14 at the time of the ON operation, and parasitic resistance can be prevented from increasing. As a result, effects can be expected which lower the ON resistance Ron and, furthermore, increase the maximum drain current Idmax.

In addition, because the gate electrode 27 is formed in self-alignment with respect to the low-resistance region 16g, a margin can be reduced as for a clearance for ensuring a withstand voltage between the gate electrode 27 and the source electrode 23s/the drain electrode 23d. In addition to this, because the low-resistance region 16g is formed by impurity diffusion through the gate opening 21g whose opening width has been narrowed, a reduction of the low-resistance region 16g is sought. Therefore, a further finer element structure can be achieved, compared with the eleventh to the thirteenth embodiments.

Incidentally, when this fourteenth embodiment is combined with the semiconductor apparatus of the second embodiment explained using FIG. 9, it suffices that the carrier supplying region 15a is provided in the middle portion of the first barrier layer 15 illustrated in FIG. 39 in the thickness direction, and substantially the same effects as those of the second embodiment can be obtained in combination.

In addition, when this fourteenth embodiment is combined with the semiconductor apparatus of the third embodiment explained using FIG. 11, it suffices that the low-resistance region 16g illustrated in FIG. 39 is extended to a depth that reaches the carrier supplying region 15a, and substantially the same effects as those of the third embodiment can be obtained in combination.

Moreover, when this fourteenth embodiment is combined with the semiconductor apparatus of the fourth embodiment explained using FIG. 12, it suffices that a part surrounding the p-type low-resistance region 16g in the second barrier layer 16 illustrated in FIG. 39 is composed as the low-resistance region 16a, and substantially the same effects as those of the fourth embodiment can be obtained in combination.

In addition, as other examples of cases where this fourteenth embodiment is combined with each of the semiconductor apparatuses of the second through the fourth embodiments explained using FIG. 9 through 12, the fourteenth embodiment can be applied to a configuration, for example, where a low-resistance region or a high-resistance region is provided as an upper layer than the carrier supplying region 15a within the first barrier layer 15, without providing the second barrier layer 16. In this case, the low-resistance region is formed by diffusion in the upper layer than the carrier supplying region 15a within the first barrier layer 15 composed of, for example, the AlGaAs layer, and in the above, the isotropic etching of the insulating film 21 made of silicon nitride ($Si_3N_4$) is performed. This etching is performed by substantially the same procedures as those explained using FIG. 27A in the eleventh embodiment. Even in a case like this, the effects added in the fourteenth embodiment can be obtained.

Moreover, this fourteenth embodiment may be combined with the semiconductor apparatus of the twelfth embodiment explained using FIG. 29. In this case, it suffices that the second barrier layer 16 is provided with the etching stop layer, and before the process of forming the gate insulating film 25, which is explained using FIG. 42, it suffices that a process of wet-etching until the etching stop layer using the insulating film 21 as a mask is added. With this, substantially the same effects as those of the twelfth embodiment can be obtained in combination.

Furthermore, this fourteenth embodiment may be combined with the semiconductor apparatus of the thirteenth embodiment explained using FIG. 32. In this case, it suffices that before the process of forming the insulating film 21, which is explained using FIG. 40B, a process of providing the cap layer is performed and the insulating film 21 is formed to cover the cap layer. With this, substantially the same effects as those of the thirteenth embodiment can be obtained in combination.

15. Modified Example-1

In the first through the fourteenth embodiments explained above, each layer using the compound semiconductors formed on top of the substrate 11 is lattice-matched to one another. However, this technique is not limited to such a configuration, but as each layer using the compound semiconductors formed on top of the substrate 11, a compound semiconductor layer grown by a pseudo-morphic technique or a compound semiconductor layer grown to have different lattice constants by a meta-morphic technique may be used. For example, on a substrate made of GaAs, each layer made of corresponding compound semiconductors that have lattice constants different from that of the GaAs may be grown.

For example, one example of a configuration where the meta-morphic technique is applied is as follows:
the substrate 11 and the buffer layer 12—GaAs
the lower barrier layer 13—InAlAs ($In_{0.52}Al_{0.48}As$)

the channel layer 14—InGaAs ($In_{0.53}Ga_{0.47}As$)
the first barrier layer 15—InAlAs ($In_{0.52}Al_{0.48}As$)
the second barrier layer 16—InAlP or InAlAs or AlGaAsSb However, when InAlP or InAlAs is used as the second barrier layer 16, lattice-matching to respect to the first barrier layer is sought by increasing a compositional ratio of Al.

16. Modified Example-2

In addition, in the first through the fourteenth embodiments explained above, the upper barrier layer above the channel layer 14 is composed of the first barrier layer 15 and the second barrier layer 16. However, the upper barrier layer is not limited to the 2-layer structure, but an additional barrier layer made of a different compound semiconductor material may be provided between the first barrier layer 15 and the second barrier layer 16. Even in a case like this, in a state where the first barrier layer 15 and the second barrier layer 16 are directly joined, it suffices that a relationship is maintained in which the energy band opposite to the carrier running energy band in the second barrier layer 16 is farther from the intrinsic Fermi level within the first barrier layer than the energy band opposite to the carrier running energy band in the first barrier layer 15 at the junction portion is. In addition, it suffices that the additional barrier layer is composed using a semiconductor material that is lattice-matched to the first barrier layer 15 and the second barrier layer 16. The carrier supplying region may be provided in this additional barrier layer. In addition, the low-resistance region 16g may be provided to be extended from the surface layer of the second barrier layer 16.

17. Application Example

Wireless Communications Apparatus

The semiconductor apparatus explained in each of the embodiments as above is used, for example, in a wireless communications apparatus in a mobile communications system, specifically used as an antenna switch thereof. As the wireless communications apparatus like this, the effects are especially exerted in communication frequencies of an ultra-high frequency (UHF) band and above.

Namely, by using in the antenna switch of the wireless communications system the semiconductor apparatuses whose an OFF current is smaller, whose maximum drain current Idmax is greater, and whose harmonic distortion characteristics are excellent, which have been explained in the first through the fourteenth embodiments, downscaling and energy consumption saving of the wireless communications apparatus can be sought. Specifically, in a mobile communications terminal, owing to a prolonged operation time by the energy consumption saving and downscaling of the apparatus, an improvement of portability can be sought.

Additionally, the present technology may also be configured as below.

(1)
A semiconductor apparatus including:
a channel layer that is composed of a compound semiconductor;
an upper barrier layer that is composed of a compound semiconductor and provided on the channel layer;
a first barrier layer that constitutes a boundary layer on a side of the channel layer in the upper barrier layer, and is composed of a compound semiconductor whose carrier running energy band at a junction portion with the channel layer is farther from an intrinsic Fermi level within the channel layer than that of the channel layer is;
a second barrier layer that is provided in a surface layer of the upper barrier layer, and is composed of a compound semiconductor whose energy band opposite to a carrier running energy band across a band gap at a junction portion, in a state of forming a junction with the first barrier layer, is farther from an intrinsic Fermi level within the first barrier layer than that of the first barrier layer is;
a low-resistance region that is provided in at least a surface layer in the second barrier layer, and contains an impurity of a conduction type opposite to that of a carrier thereby to be kept at a lower resistance than a surrounding area thereof;
a source electrode and a drain electrode that are connected to the second barrier layer, at positions across the low-resistance region;
a gate insulating film that is provided on the low-resistance region; and
a gate electrode that is provided above the low-resistance region via the gate insulating film.

(2)
The semiconductor apparatus according to (1), wherein the low-resistance region has a depth that reaches the first barrier layer from the surface layer of the second barrier layer.

(3)
The semiconductor apparatus according to (1) or (2), including:
a lower barrier layer that is composed of a compound semiconductor whose carrier running energy band at a junction portion with the channel layer is farther from the intrinsic Fermi level within the channel layer than that of the channel layer is, at a position across the channel layer in relation to the upper barrier layer.

(4)
The semiconductor apparatus according to any of (1) to (3), including:
a layer containing an impurity that turns out to be a carrier between the upper barrier layer and the source electrode and the drain electrode.

(5)
The semiconductor apparatus according to any of (1) to (4), wherein the second barrier layer is pattern-formed above the first barrier layer as the low-resistance region.

(6)
The semiconductor apparatus according to any of (1) to (5), wherein the gate electrode has a shape that fully covers over the low-resistance region.

(7)
The semiconductor apparatus according to any of (1) to (6), wherein the lowest energy of a conduction band in the first barrier layer is higher than the lowest energy of a conduction band in the channel layer, and
wherein the highest energy of a valence band in the second barrier layer is lower than the highest energy of a valence band in the first barrier layer.

(8)
The semiconductor apparatus according to any of (1) to (7), wherein the channel layer is composed of an InGaAs mixed crystal, which is a III-V compound semiconductor,
wherein the first barrier layer is composed of an AlGaAs mixed crystal, which is a III-V compound semiconductor, and
wherein the second barrier layer is composed of a GaInP mixed crystal, which is a III-V compound semiconductor.

(9)
The semiconductor apparatus according to any of (1) to (8), wherein the channel layer is composed of an InGaAs mixed crystal, which is a III-V compound semiconductor, and wherein the first barrier layer or the second barrier layer is composed of an In(AlGa)AsP mixed crystal, which is a III-V compound semiconductor.

(10)

The semiconductor apparatus according to any of (1) to (9), wherein the channel layer is provided above a substrate composed of GaAs.

(11)

The semiconductor apparatus according to (10), wherein the channel layer is formed by metamorphically growing on the substrate a compound semiconductor having a lattice constant different from that of GaAs.

(12)

A manufacturing method of a semiconductor apparatus, the manufacturing method including:

forming, on a channel layer composed of a compound semiconductor, a first barrier layer which is composed of a compound semiconductor whose carrier running energy band at a junction portion with the channel layer is farther from an intrinsic Fermi level within the channel layer than that of the channel layer is;

forming, above the first barrier layer, a second barrier layer which is composed of a compound semiconductor whose energy band opposite to the carrier running energy band across a band gap at a junction portion, in a state of forming a junction with the first barrier layer, is farther from an intrinsic Fermi level within the first barrier layer than that in first barrier layer is, and which is provided in at least a surface layer with a low-resistance region that contains an impurity of a conduction type opposite to that of a carrier, thereby to be kept at lower resistance than a surrounding area thereof;

forming a source electrode and a drain electrode that are connected to an upper barrier layer provided at a surface layer thereof with the second barrier layer at positions across the low-resistance region, with a boundary layer on a side of the channel layer being composed of the first barrier layer;

forming a gate insulating film on the low-resistance region; and forming a gate electrode above the low-resistance region via the gate insulating film.

(13)

The manufacturing method of a semiconductor apparatus according to (12), wherein, when the gate insulating film is formed, the gate insulating film is deposited by an atomic layer deposition method.

(14)

The manufacturing method of a semiconductor apparatus according to (12) or (13), wherein, when the second barrier layer is formed, the second barrier layer composed of a compound semiconductor is deposited, and then the low-resistance region is formed by diffusing impurities to the second barrier layer.

(15)

The manufacturing method of a semiconductor apparatus according to (14), wherein zinc is diffused as the impurities.

(16)

The manufacturing method of a semiconductor apparatus according to (14) or (15), wherein, when the low-resistance region is formed, an insulating film having an opening on the second barrier layer is formed, and then impurities are diffused to the second barrier layer through the opening of the insulating film, wherein, before the gate insulating film is formed, the opening of the insulating film is widened by etching, wherein, when the gate insulating film is formed, the gate insulating film is formed in a state of covering the second barrier layer exposed through the opening, and wherein, when the gate electrode is formed, the gate electrode is formed in a state of fully covering a bottom portion of the opening via the gate insulating film.

(17)

The manufacturing method of a semiconductor apparatus according to (16), wherein, when the second barrier layer is formed, an etching stop layer with respect to a compound semiconductor that constitutes the second barrier layer is formed on a surface side, wherein, when the low-resistance region is formed, the low-resistance region is formed to a depth beyond the etching stop layer, wherein, when the opening of the insulating film is widened, isotropic etching of the insulating film is performed, and then, before the gate insulating film is formed, the etching layer is removed.

(18)

The manufacturing method of a semiconductor apparatus according to (14) or (15), wherein, when the low-resistance region is formed, an insulating film having an opening on the second barrier layer is formed, a side wall is provided on a side wall of the opening, and impurities are diffused to the second barrier layer, using the insulating film and the side wall as a mask, wherein, before the gate insulating film is formed, the side wall is removed, wherein, when the gate insulating film is formed, the gate insulating film is formed in a state of covering the second barrier layer exposed through the opening, and wherein, when the gate electrode is formed, the gate electrode is formed in a state of fully covering a bottom portion of the opening via the gate insulating film.

(19)

The manufacturing method of a semiconductor apparatus according to (18), wherein, when the second barrier layer is deposited, an etching stop layer with respect to a compound semiconductor that constitutes the second barrier layer is formed on a surface side, wherein, when the low-resistance region is formed, the low-resistance region is formed to a depth beyond the etching stop layer, and wherein, after the side wall is removed, and before the gate insulating film is formed, the etching stop layer is removed.

(20)

The manufacturing method of a semiconductor apparatus according to (12) or (13), wherein, as for the forming of the low-resistance region, when the upper barrier layer is formed on the channel layer by epitaxial growth, the second barrier layer doped with an impurity is formed by epitaxial growth, and then the second barrier layer is used as the low-resistance region.

REFERENCE SIGNS LIST 1-1 to 1-14 semiconductor apparatus
13 lower barrier layer
14 channel layer
15 first barrier layer (upper barrier layer)
16 second barrier layer (upper barrier layer)
16e etching stop layer
16g low-resistance region
21 insulating film
21g gate opening
25 gate insulating film
27 gate electrode 23s source electrode
23d drain electrode
31 cap layer
45 side wall.

The invention claimed is:

1. A semiconductor apparatus comprising:
a channel layer that is composed of a compound semiconductor;
an upper barrier layer that is composed of a compound semiconductor and provided on the channel layer;
a first barrier layer that constitutes a boundary layer on a side of the channel layer in the upper barrier layer, and is composed of a compound semiconductor whose carrier running energy band at a junction portion with the channel layer is farther from an intrinsic Fermi level within the channel layer than is that of the channel layer;
a second barrier layer that is provided in a surface layer of the upper barrier layer, and is composed of a compound semiconductor whose energy band opposite to a carrier running energy band across a band gap at a junction portion, in a state of forming a junction with the first barrier layer, is farther from an intrinsic Fermi level within the first barrier layer than is that of the first barrier layer;
a low-resistance region that is provided in at least a surface layer in the second barrier layer, and contains an impurity of a conduction type opposite to that of a carrier thereby to be kept at a lower resistance than a surrounding area thereof;
a source electrode and a drain electrode that are connected to the second barrier layer, at positions across the low-resistance region;
a gate insulating film that is provided on the low-resistance region; and
a gate electrode that is provided above the low-resistance region via the gate insulating film.

2. The semiconductor apparatus according to claim 1, wherein the low-resistance region has a depth that reaches the first barrier layer from the surface layer of the second barrier layer.

3. The semiconductor apparatus according to claim 1, comprising:
a lower barrier layer that is composed of a compound semiconductor whose carrier running energy band at a junction portion with the channel layer is farther from the intrinsic Fermi level within the channel layer than is that of the channel layer, at a position across the channel layer in relation to the upper barrier layer.

4. The semiconductor apparatus according to claim 1, comprising:
a layer containing an impurity that turns out to be a carrier between the upper barrier layer and the source electrode and the drain electrode.

5. The semiconductor apparatus according to claim 1, wherein the second barrier layer is pattern-formed above the first barrier layer as the low-resistance region.

6. The semiconductor apparatus according to claim 1, wherein the gate electrode has a shape that fully covers over the low-resistance region.

7. The semiconductor apparatus according to claim 1,
wherein the lowest energy of a conduction band in the first barrier layer is higher than the lowest energy of a conduction band in the channel layer, and
wherein the highest energy of a valence band in the second barrier layer is lower than the highest energy of a valence band in the first barrier layer.

8. The semiconductor apparatus according to claim 1,
wherein the channel layer is composed of an InGaAs mixed crystal, which is a III-V compound semiconductor,
wherein the first barrier layer is composed of an AlGaAs mixed crystal, which is a III-V compound semiconductor, and
wherein the second barrier layer is composed of a GaInP mixed crystal, which is a III-V compound semiconductor.

9. The semiconductor apparatus according to claim 1,
wherein the channel layer is composed of an InGaAs mixed crystal, which is a III-V compound semiconductor, and
wherein the first barrier layer or the second barrier layer is composed of an In(AlGa)AsP mixed crystal, which is a III-V compound semiconductor.

10. The semiconductor apparatus according to claim 1, wherein the channel layer is provided above a substrate composed of GaAs.

11. The semiconductor apparatus according to claim 10, wherein the channel layer is formed by metamorphically growing on the substrate a compound semiconductor having a lattice constant different from that of GaAs.

12. A manufacturing method of a semiconductor apparatus, the manufacturing method comprising:
forming, on a channel layer composed of a compound semiconductor, a first barrier layer which is composed of a compound semiconductor whose carrier running energy band at a junction portion with the channel layer is farther from an intrinsic Fermi level within the channel layer than is that of the channel layer;
forming, above the first barrier layer, a second barrier layer which is composed of a compound semiconductor whose energy band opposite to the carrier running energy band across a band gap at a junction portion, in a state of forming a junction with the first barrier layer, is farther from an intrinsic Fermi level within the first barrier layer than is that in first barrier layer, and which is provided in at least a surface layer with a low-resistance region that contains an impurity of a conduction type opposite to that of a carrier, thereby to be kept at lower resistance than a surrounding area thereof;
forming a source electrode and a drain electrode that are connected to an upper barrier layer provided at a surface layer thereof with the second barrier layer at positions across the low-resistance region, with a boundary layer on a side of the channel layer being composed of the first barrier layer;
forming a gate insulating film on the low-resistance region; and
forming a gate electrode above the low-resistance region via the gate insulating film.

13. The manufacturing method of a semiconductor apparatus according to claim 12, wherein, when the gate insulating film is formed, the gate insulating film is deposited by an atomic layer deposition method.

14. The manufacturing method of a semiconductor apparatus according to claim 12, wherein, when the second barrier layer is formed, the second barrier layer composed of a compound semiconductor is deposited, and then the low-resistance region is formed by diffusing impurities to the second barrier layer.

15. The manufacturing method of a semiconductor apparatus according to claim 14, wherein zinc is diffused as the impurities.

16. The manufacturing method of a semiconductor apparatus according to claim 14,
wherein, when the low-resistance region is formed, an insulating film having an opening on the second barrier layer is formed, and then impurities are diffused to the second barrier layer through the opening of the insulating film, wherein, before the gate insulating film is formed, the opening of the insulating film is widened by etching, wherein, when the gate insulating film is formed, the gate insulating film is formed in a state of covering the second barrier layer exposed through the opening, and wherein, when the gate electrode is formed, the gate electrode is formed in a state of fully covering a bottom portion of the opening via the gate insulating film.

17. The manufacturing method of a semiconductor apparatus according to claim 16, wherein, when the second barrier layer is formed, an etching stop layer with respect to a compound semiconductor that constitutes the second barrier layer is formed on a surface side, wherein, when the low-resistance region is formed, the low-resistance region is formed to a depth beyond the etching stop layer, wherein, when the opening of the insulating film is widened, isotropic etching of the insulating film is performed, and then, before the gate insulating film is formed, the etching layer is removed.

18. The manufacturing method of a semiconductor apparatus according to claim 14, wherein, when the low-resistance region is formed, an insulating film having an opening on the second barrier layer is formed, a side wall is provided on a side wall of the opening, and impurities are diffused to the second barrier layer, using the insulating film and the side wall as a mask, wherein, before the gate insulating film is formed, the side wall is removed, wherein, when the gate insulating film is formed, the gate insulating film is formed in a state of covering the second barrier layer exposed through the opening, and wherein, when the gate electrode is formed, the gate electrode is formed in a state of fully covering a bottom portion of the opening via the gate insulating film.

19. The manufacturing method of a semiconductor apparatus according to claim 18, wherein, when the second barrier layer is deposited, an etching stop layer with respect to a compound semiconductor that constitutes the second barrier layer is formed on a surface side, wherein, when the low-resistance region is formed, the low-resistance region is formed to a depth beyond the etching stop layer, and wherein, after the side wall is removed, and before the gate insulating film is formed, the etching stop layer is removed.

20. The manufacturing method of a semiconductor apparatus according to claim 12, wherein, as for the forming of the low-resistance region, when the upper barrier layer is formed on the channel layer by epitaxial growth, the second barrier layer doped with an impurity is formed by epitaxial growth, and then the second barrier layer is used as the low-resistance region.

* * * * *